US006632721B1

(12) United States Patent
Iijima et al.

(10) Patent No.: US 6,632,721 B1
(45) Date of Patent: Oct. 14, 2003

(54) METHOD OF MANUFACTURING SEMICONDUCTOR DEVICES HAVING CAPACITORS WITH ELECTRODE INCLUDING HEMISPHERICAL GRAINS

(75) Inventors: Shinpei Iijima, Akishima (JP); Satoshi Yamamoto, Ome (JP); Jun Kuroda, Fussa (JP); Hiroshi Miki, Tokyo (JP); Yoshihisa Fujisaki, Hachiouji (JP); Tadanori Yoshida, Sayama (JP); Kenichi Yamaguchi, Ome (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/602,887

(22) Filed: Jun. 23, 2000

(30) Foreign Application Priority Data

Jul. 6, 1999 (JP) ............................................ 11-192009

(51) Int. Cl.[7] ................................................ H01L 21/20
(52) U.S. Cl. ........................ 438/398; 438/255; 438/565; 438/566; 438/396
(58) Field of Search ................................ 438/398, 255, 438/565, 566, 396

(56) References Cited

U.S. PATENT DOCUMENTS 5,639,685 A * 6/1997 Zahurak et al. ............. 438/658
5,913,119 A * 6/1999 Lin et al. .................... 438/255
6,069,053 A * 5/2000 Ping et al. ................... 438/398
6,177,696 B1 * 1/2001 Bronner et al. ............. 257/301
6,197,653 B1 * 3/2001 Khamankar et al. ........ 438/398
6,211,077 B1 * 4/2001 Shimizu et al. ............. 438/665
6,218,260 B1 * 4/2001 Lee et al. .................... 438/398
6,246,082 B1 * 6/2001 Mitarai et al. .............. 257/295
6,383,900 B1 * 5/2002 Shimizu et al. ............. 438/488

FOREIGN PATENT DOCUMENTS

| JP | 6-314774 | 11/1994 |
| JP | 7-86434 | 3/1995 |

* cited by examiner

Primary Examiner—Stephen D. Meier
Assistant Examiner—Christy Novacek
(74) Attorney, Agent, or Firm—Antonelli, Terry, Stout & Kraus, LLP

(57) ABSTRACT

In a method of manufacturing a semiconductor integrated circuit device in which a lower electrode of a capacitor is composed of a polycrystalline silicon film having a surface area increased by surface roughening, an impurity is introduced into the polycrystalline silicon film by vapor phase diffusion in order to reduce the resistance of the lower electrode.

20 Claims, 37 Drawing Sheets

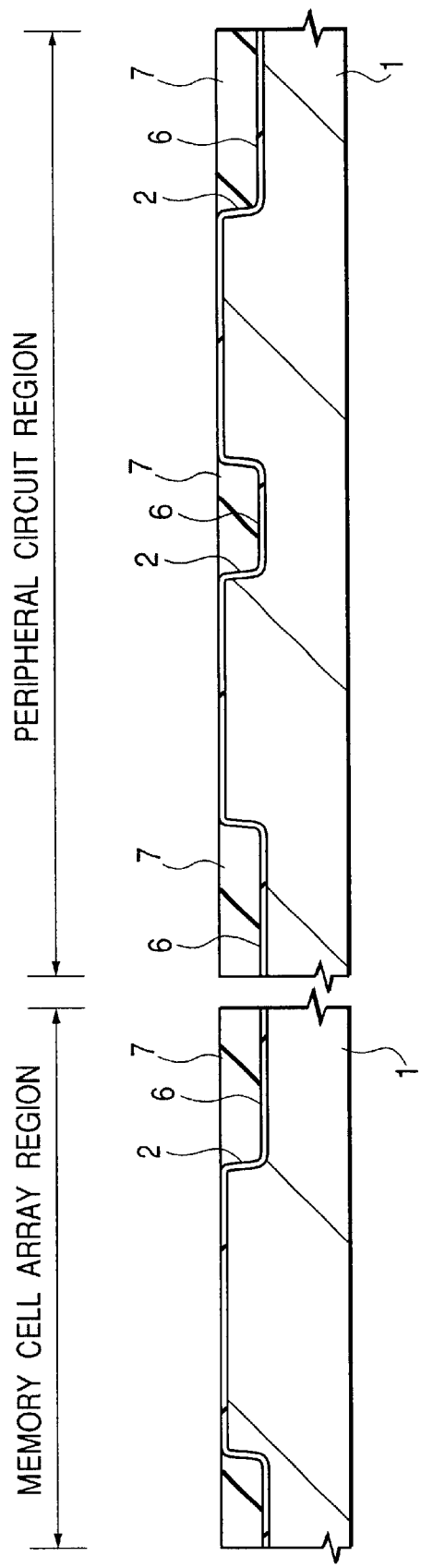
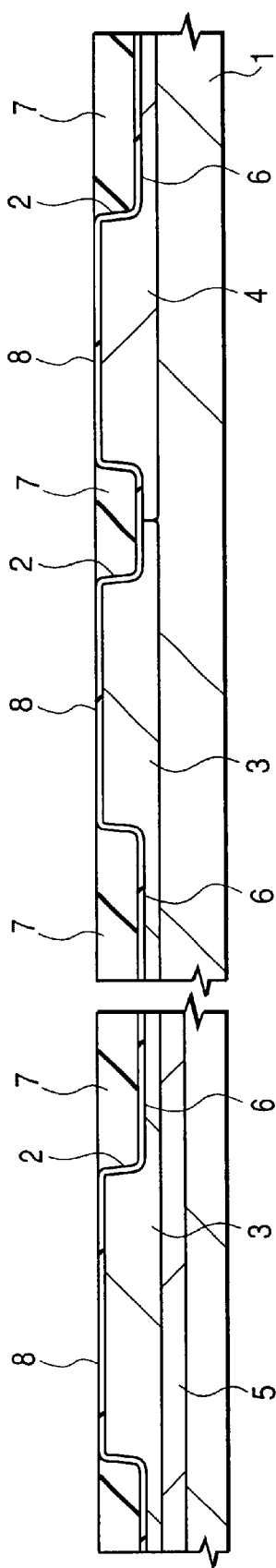

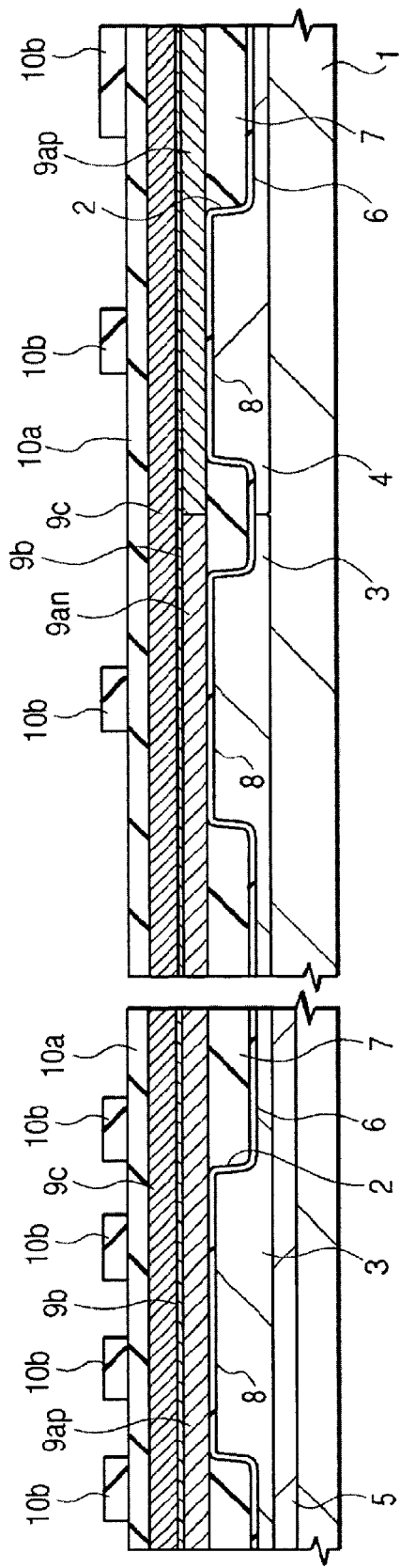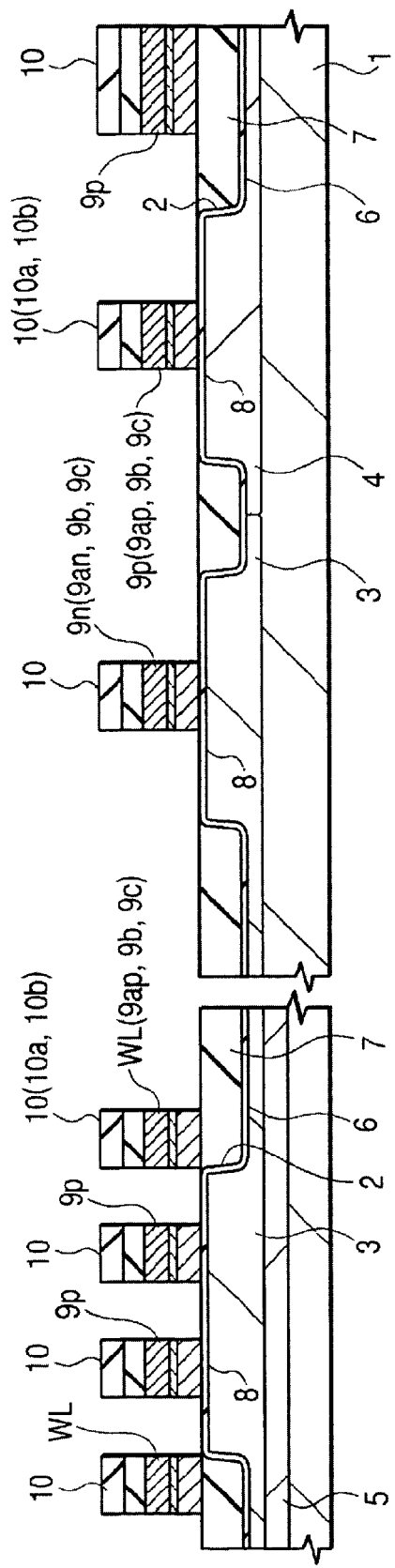

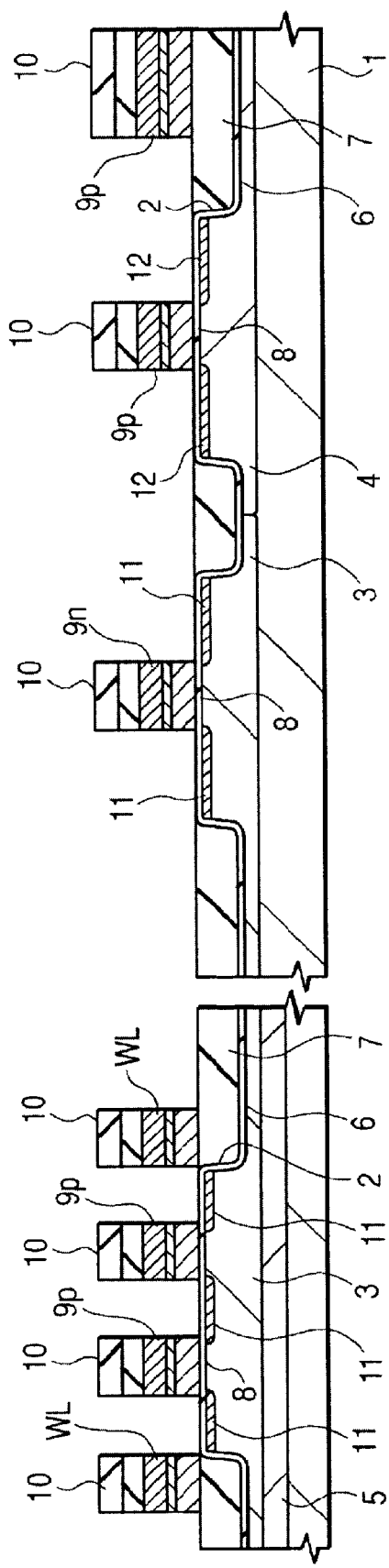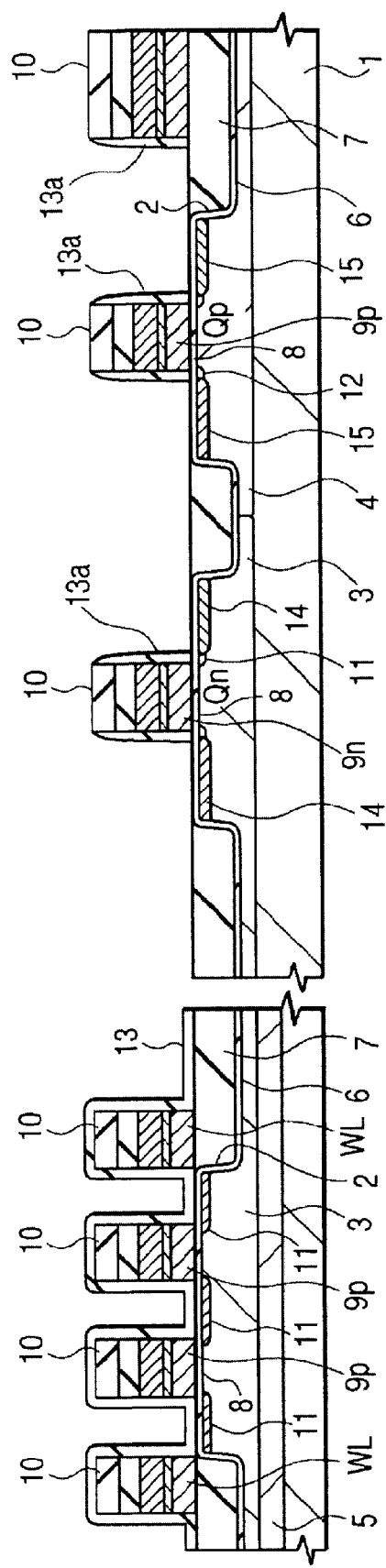

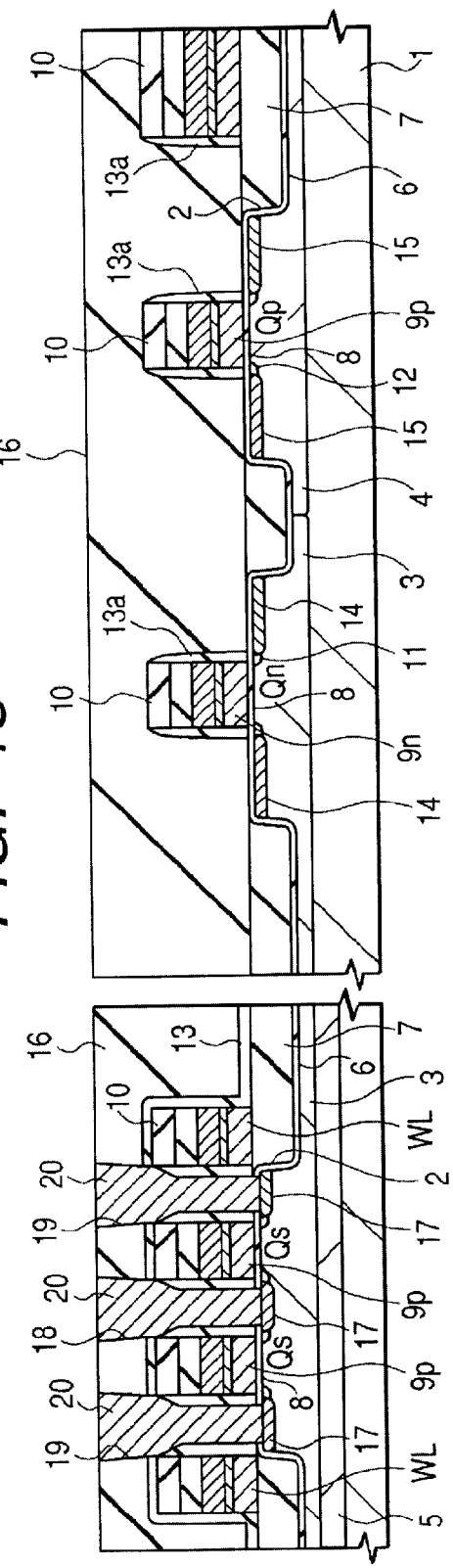
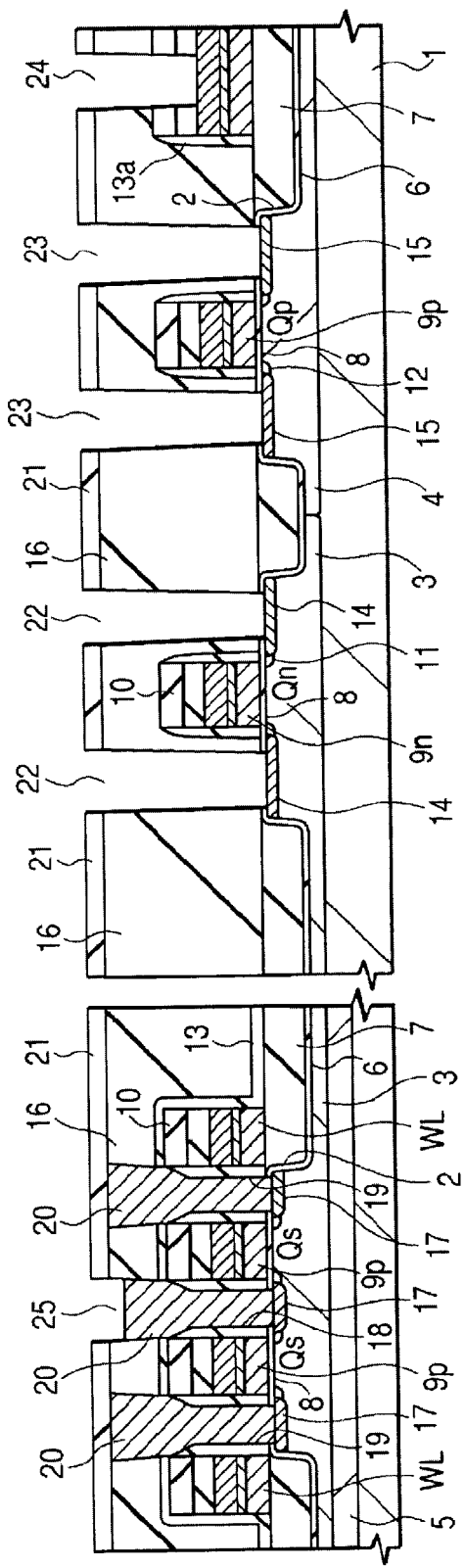

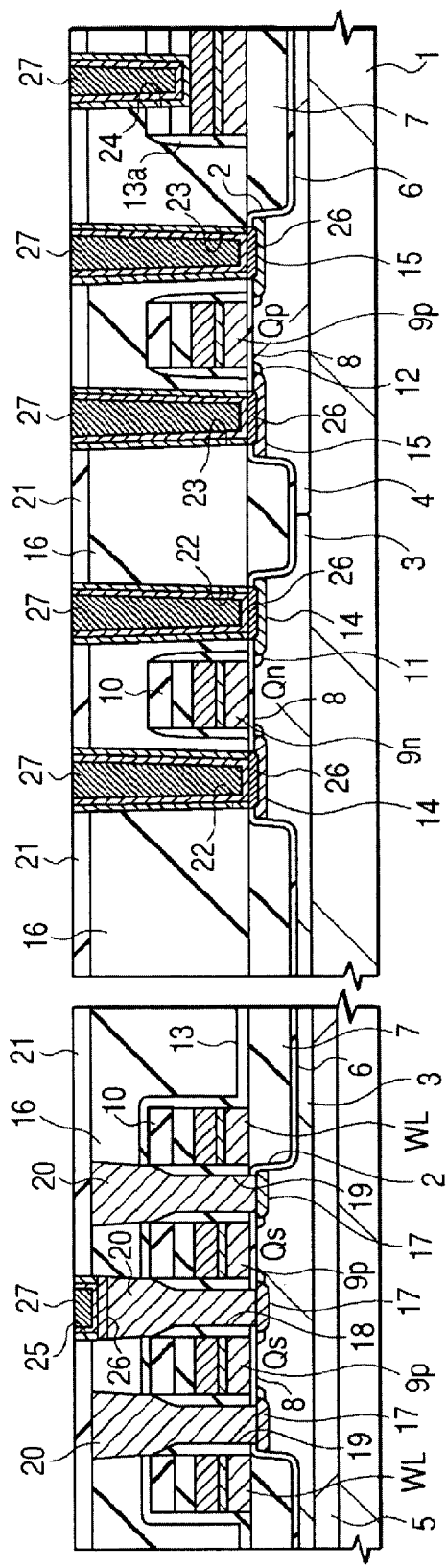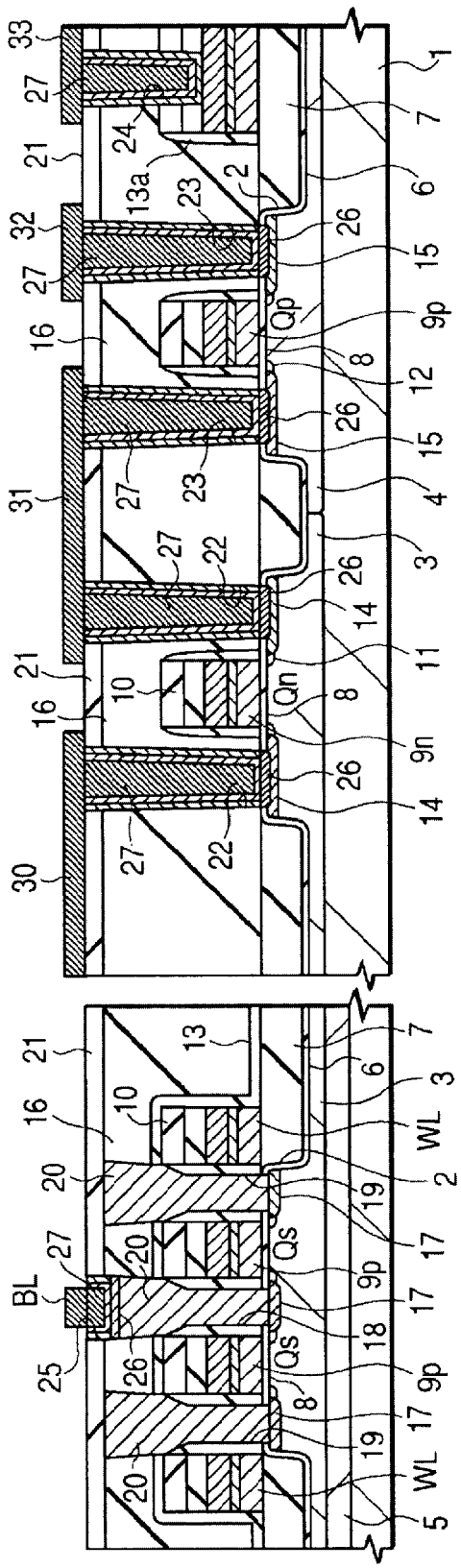

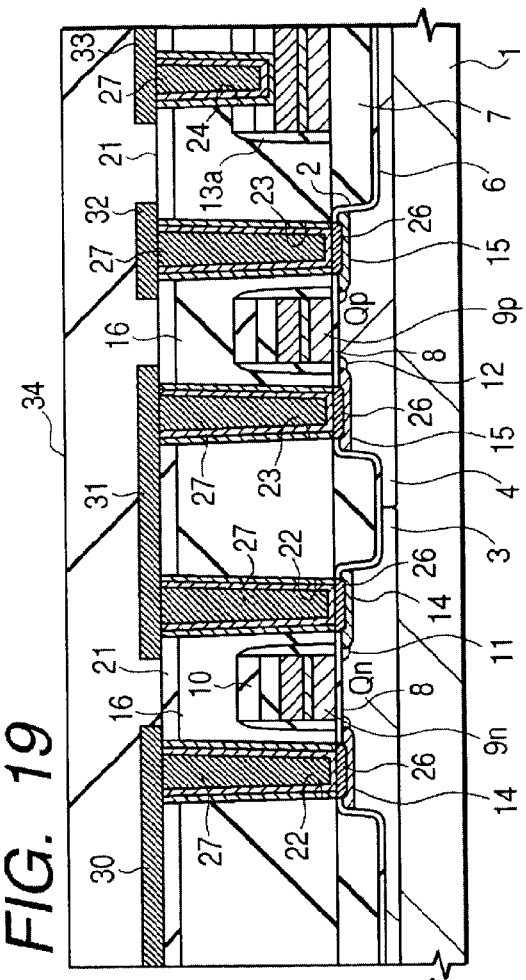
FIG. 19
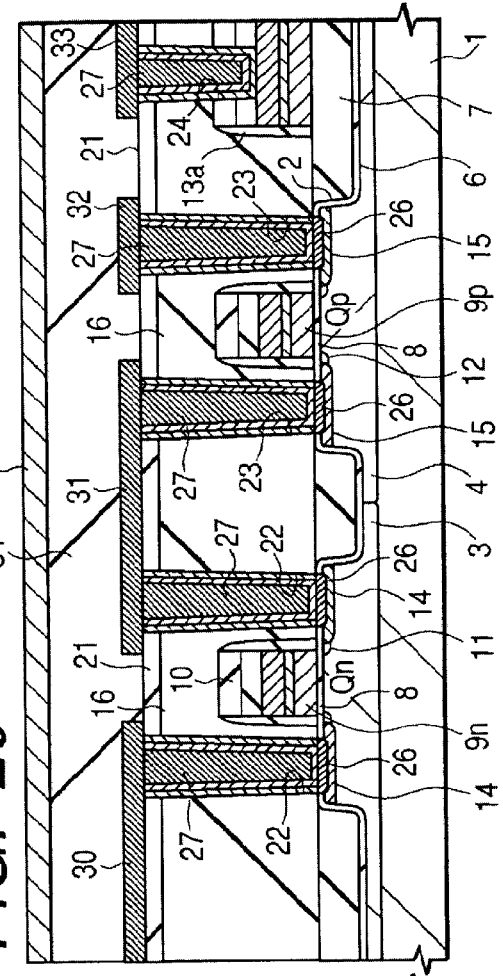
FIG. 20
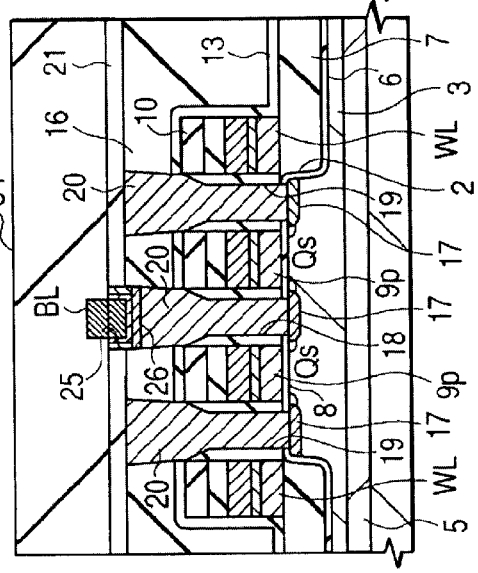
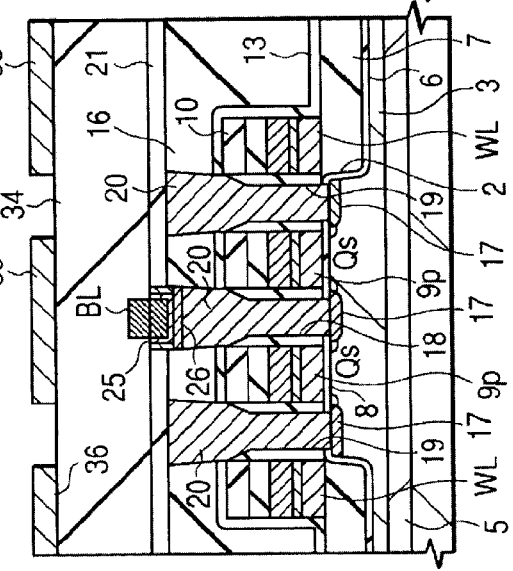

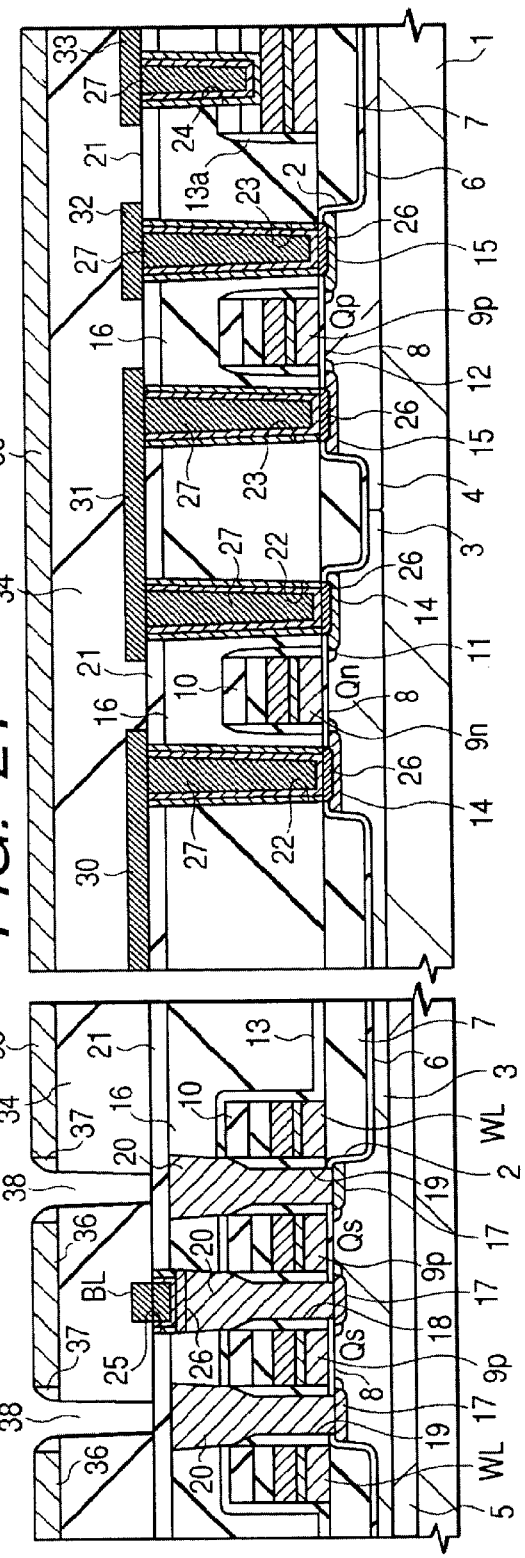
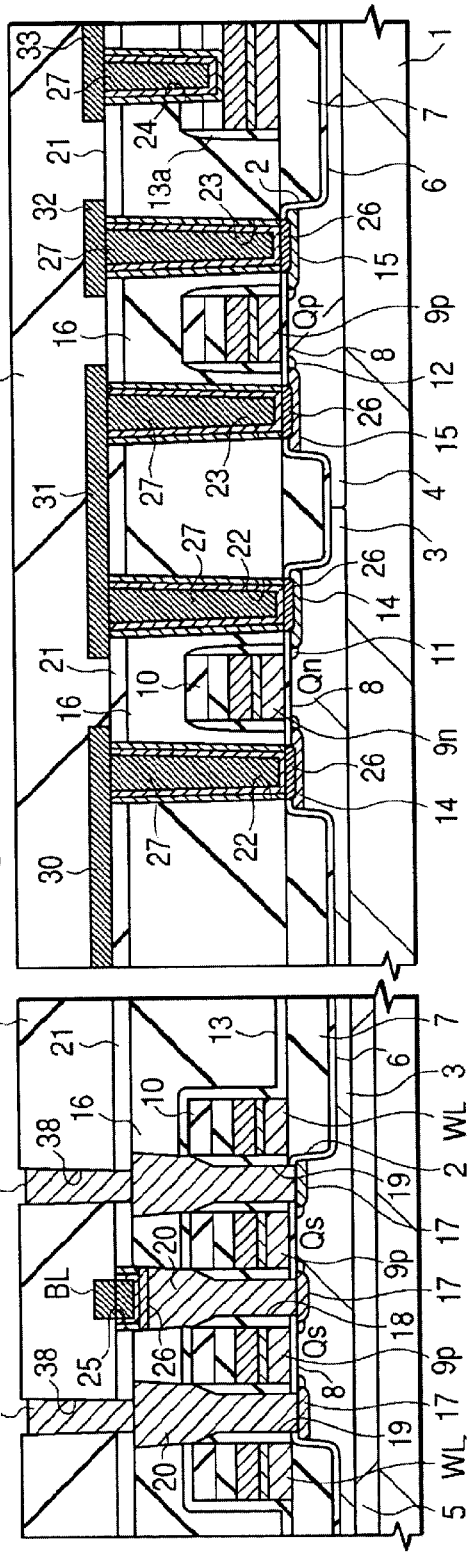

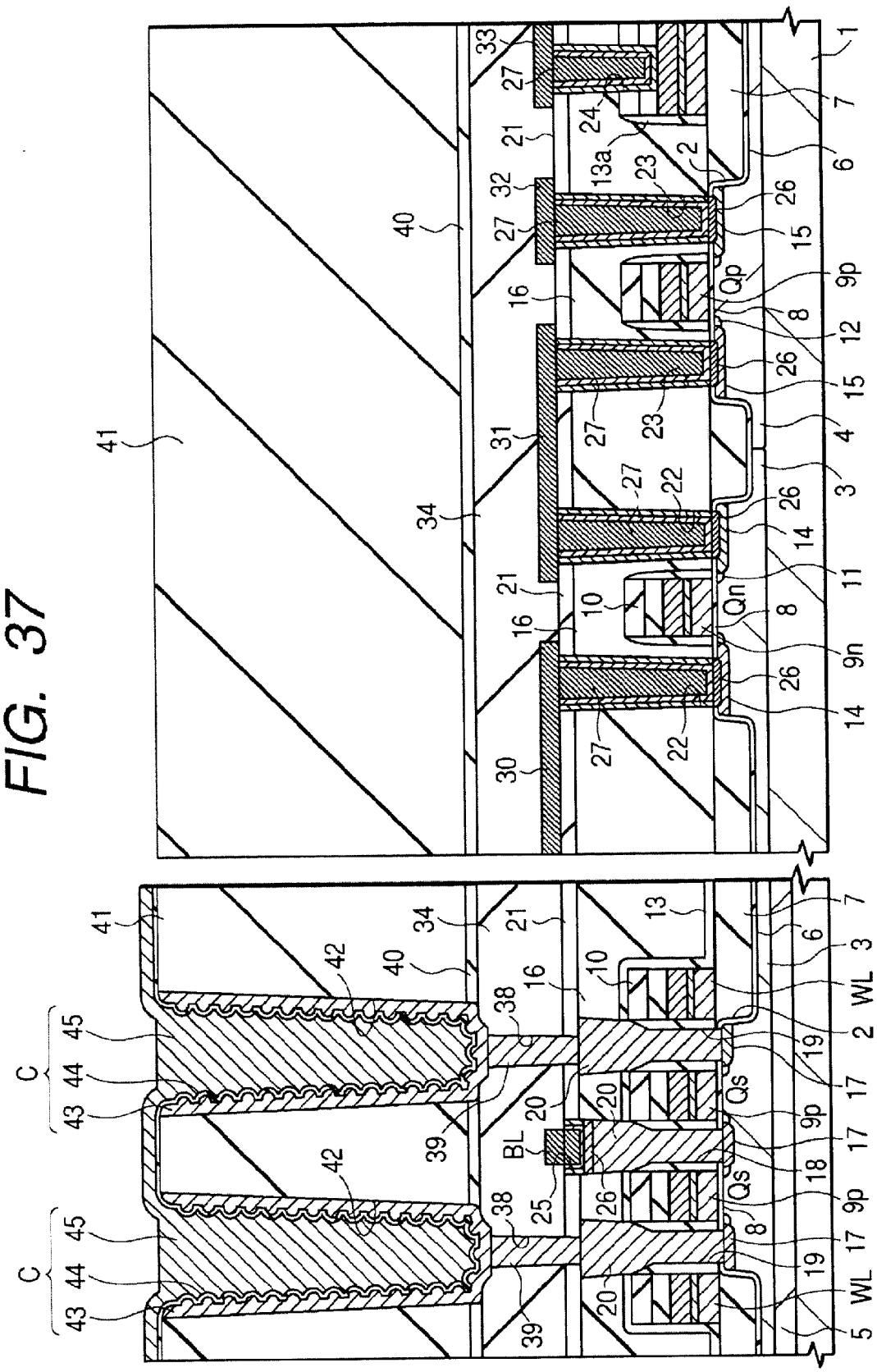

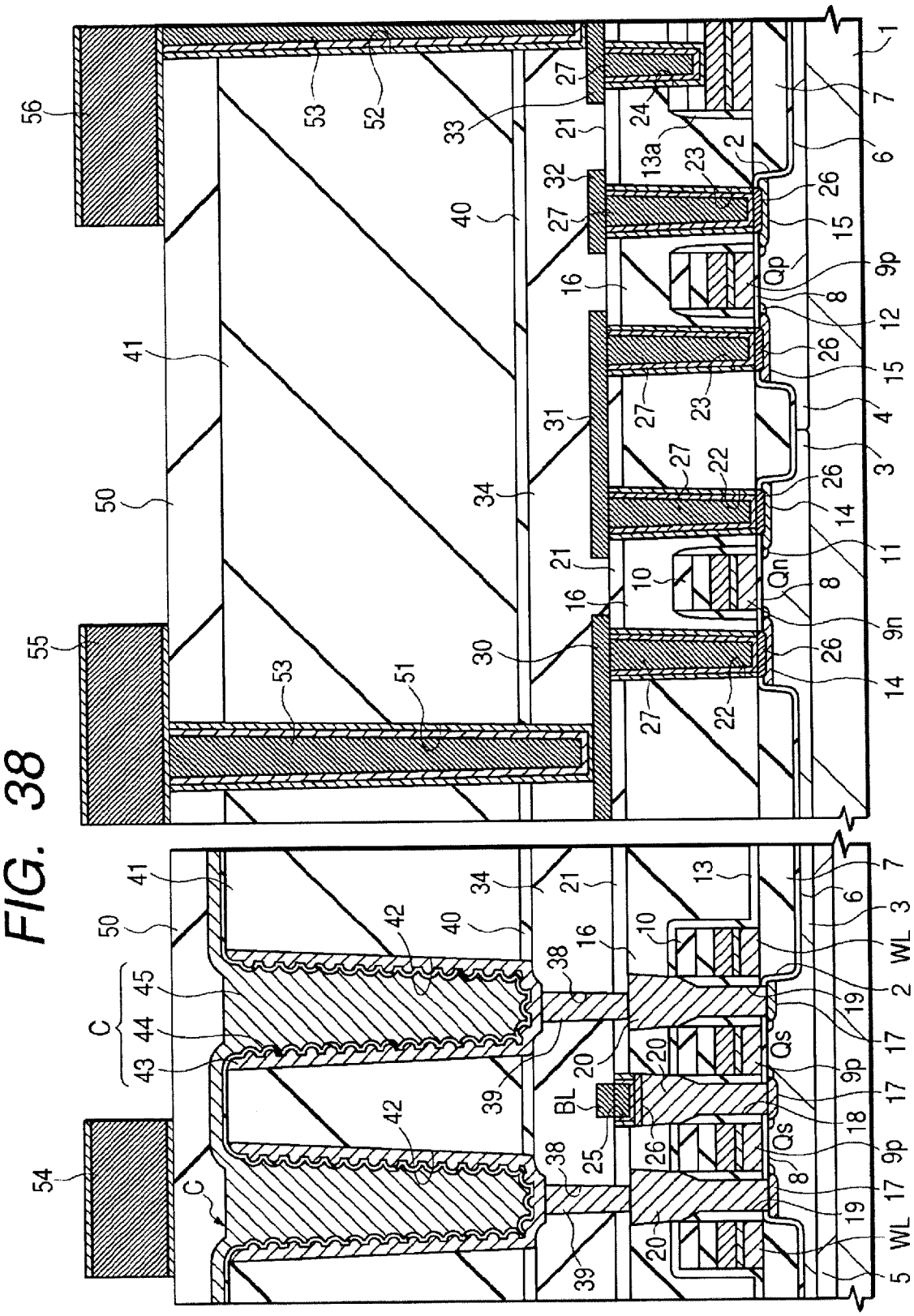

METHOD OF MANUFACTURING SEMICONDUCTOR DEVICES HAVING CAPACITORS WITH ELECTRODE INCLUDING HEMISPHERICAL GRAINS

FIELD OF THE INVENTION

This invention relates to a semiconductor device and a method of manufacture thereof; in particular, the invention relates to a technique effective when adapted for a semiconductor device having a DRAM (Dynamic Random Access Memory).

BACKGROUND OF THE INVENTION

As a DRAM structure for achieving higher integration, a Capacitor Over Bitline (COB) structure is conventionally known, wherein a capacitor is disposed over a bit line, a lower electrode (storage electrode) of the capacitor disposed over a bit line is processed into a cylindrical shape, and a capacitative insulating film and an upper electrode (plate electrode) are formed on the lower electrode. The surface area of the lower electrode is enlarged by processing the lower electrode into a cylindrical shape, whereby a reduction in the accumulated charge amount (Cs) of the capacitor caused by the miniaturization of a memory cell can be compensated for. In a memory cell having a COB structure, it is thus inevitable to three-dimensionally form a capacitor structure in order to secure operation reliability as a semiconductor storage device.

However, it has been difficult to secure the necessary capacitance (accumulated charge amount) even in a recent semiconductor device which has been integrated by three-dimensional formation of its capacitor structure, particularly for versions of a DRAM on and after those corresponding to 256 Mbit (mega-bit).

As a technique for further enlarging the area of an electrode, there is a technique using a so-called HSG (Hemispherical Silicon Grain) structure, that is, a technique for forming minute unevenness on the silicon surface on which the lower electrode is formed to provide a roughened surface. According to this technique, the surface area can be enlarged substantially without increasing the size of the lower electrode.

SUMMARY OF THE INVENTION

The above-described technique for an HSG structure is however accompanied with the following problems, which are not greatly known, but were discovered only by the present inventors.

Adoption of an HSG structure for a lower electrode makes it possible to enlarge the physical surface area of the lower electrode, but it is accompanied with the problem that an increase in the accumulated charge amount in proportion to the surface enlargement is not always possible. In particular, the problem appears eminently when the lower electrode made of n-type silicon is biased positive toward an upper electrode. This is presumed to be caused by the formation of a depletion layer (by appearance of depletion) on the interface of the lower electrode in contact with a capacitor insulating film. More specifically, adoption of an HSG structure for a lower electrode inevitably requires adoption of silicon as a raw material for it. When a silicon material is employed as a conductor, a large amount of impurities must be introduced. When activated impurities are introduced in a sufficient amount, depletion is suppressed. When the introduced amount of impurities is small or impurities introduced in a large amount are not activated, a depletion layer is formed in the silicon. Since this depletion layer is electrically insulating, it acts like a capacitor insulating film and the apparent thickness of the capacitor insulating film seems to show an increase. This leads to a decrease in the capacitance value of the capacitor, resulting in an increase in the accumulative charge amount which is not proportional to an increase in the surface area of the lower electrode. The decrease in the capacitance value of the capacitor (capacitive loss) reaches at least 30% in terms of a depletion ratio, and such a decrease undesirably becomes a large factor for inhibiting an improvement of refresh properties of the DRAM, thereby inhibiting an improvement of the DRAM performance. In this specification, the depletion ratio is defined as $(1-C^-/C^+)$, wherein $C^-$ stands for a capacitance value when a capacitor is biased toward $^-1V$, and $C^+$ stands for a capacitance value when a capacitor is biased toward $^-1V$.

As means for avoiding depletion, introduction of impurities in an amount sufficient for compensating for inactivated impurities can be presumed. In order to form an HSG structure, however, it is necessary to subject an amorphous silicon film to predetermined heat treatment, thereby causing solid-phase growth of it into polycrystalline hemispherical crystals. It is needless to say that heat treating conditions (temperature, time, atmosphere, or the like) take part in the growth of crystals from the amorphous state. In addition, an amount of impurities contained in the amorphous silicon, which is a starting material, also takes part in the crystal growth. When a large amount of impurities is contained in the amorphous silicon film, crystallization of amorphous silicon is accelerated excessively, whereby granular silicon (hemispherical crystal) of a sufficient size cannot be formed. The amount of the impurities contained in advance in the amorphous silicon film must therefore be limited and this request for limitation in the amount of impurities is inconsistent with means for suppressing depletion.

Even if the amount of impurities is relatively small so as not to cause a problem in the formation of granular silicon, depletion can be suppressed if these impurities have been sufficiently activated. In other words, it is presumed that depletion can be effectively controlled if impurities contained in the silicon film (lower electrode) after formation of hemispherical crystals have been sufficiently activated (a large portion of impurities contained in the film has been activated). The activation of impurities in silicon however requires heat treatment at a high temperature or for long hours (ex. annealing at a temperature not lower than 800° C. or for a time not shorter than 20 minutes). The following problem occurs when the lower electrode is subjected to such high or long heat treatment. When a COB structure is adopted, a capacitor is formed after formation of a bit line. A first interconnection layer of the peripheral circuit is formed simultaneously with the bit line so that a joint part of the first interconnection layer and substrate in the peripheral circuit (ex. source and drain of MISFET of the peripheral circuit) has already been formed in the capacitor-forming stage. At this joint part, a silicide film such as titanium silicide is formed for decreasing the contact resistance. However, this silicide film is poor in heat resistance so that the heat treatment temperature after formation of the first interconnection layer is limited to a low temperature range within the heat resistance of the silicide film. It is therefore impossible to heat-treat the lower electrode of the capacitor at high temperatures for activation of impurities.

Although attention is paid only to the joint part between the first interconnection layer and substrate, high temperature heat treatment is also unsuited for all the members that have already been formed and are poor in heat resistance, for example, an impurity region formed on a semiconductor substrate. In a highly-integrated semiconductor device, impurity diffusion layers (source drain, etc.) are formed while their position and depth are controlled precisely. By the heat treatment at a high temperature or for long hours, impurities in the impurity diffusion layer, which has been formed precisely, are re-diffused, whereby its structure is changed. It is needless to say that such a change puts the original design out of order and adversely affects the properties of the device. In addition, when a $p^+$ gate structure having a boron-implanted gate electrode (polycrystalline silicon film) is adopted, boron is diffused (leaked) by the heat treatment and diffused boron reaches a channel region, which changes the threshold value of the MISFET. This also becomes a factor for deteriorating the properties of the device, thereby lowering the reliability of the semiconductor device.

With the miniaturization of the device to meet requirements for high integration of the DRAM, the size of the area exclusive for the lower electrode also needs to be reduced. In particular, a cylindrical lower electrode needs to have a decreased inner diameter and formation of granular silicon with good precision inside of the miniaturized cylinder is required. In other words, it becomes relatively difficult to control the height (unevenness) of granular silicon owing to the thinning tendency of a polycrystalline silicon film constituting the lower electrode.

An object of the present invention is therefore to provide a technique for controlling depletion of the lower electrode of a capacitor under limited thermal treatment conditions.

Another object of the present invention is to provide a technique for attaining a low depletion ratio in a lower electrode having granular silicon.

A further object of the present invention is to provide a technique suited for control of crystal growth of granular silicon.

A still further object of the present invention is to provide a technique relating to a capacitor having reduced leakage current, thereby improving the reliability of the DRAM.

A still further object of the present invention is to maintain the performance and reliability of a miniaturized semiconductor device on a high level.

The above-described and the other objects and novel features of the present invention will be apparent from the present description and the accompanying drawings.

Among the inventive aspects disclosed in this application, summaries of representative ones will be described briefly.

1. A method of manufacturing a semiconductor device, which comprises (a) depositing an amorphous silicon film and crystallizing it, thereby roughening the surface of the silicon film; (b) crystallizing the whole silicon film thus roughened; and (c) heat treating the silicon film in a gas atmosphere containing an impurity element, thereby introducing the impurity element into the silicon film.

2. A method of manufacturing a semiconductor device, which comprises (a) depositing an amorphous silicon film and crystallizing it, thereby roughening the surface of the silicon film; and (b) heat treating the silicon film in a gas atmosphere containing an impurity element, thereby introducing the impurity element into the silicon film and at the same time, crystallizing the whole silicon film.

3. A method of manufacturing a semiconductor device, which comprises (a) depositing an amorphous silicon film, and (b) heat treating the silicon film to crystallize and roughen the surface thereof, and introducing a impurity-element-containing gas into the heat treating atmosphere after the heat treatment has been started, thereby introducing the impurity element into the silicon film.

4. A method as described above in 3, wherein the roughening reaction of the silicon film is terminated by the introduction of the gas in the step (b).

5. A method of manufacturing a semiconductor device, which comprises (a) depositing an amorphous silicon film, and (b) heat treating the silicon film in an impurity-element-containing gas atmosphere, thereby introducing the impurity element into the silicon film.

6. A method of manufacturing a semiconductor device, which comprises (a) depositing a first amorphous or polycrystalline silicon film, and depositing a second amorphous silicon film, thereby forming a laminated silicon film, (b) crystallizing the second silicon film, thereby roughening the surface of the laminated silicon film, and (c) heat treating the laminated silicon film in an impurity-element-containing gas atmosphere, thereby introducing the impurity element into the laminated silicon film.

7. A method as described above in 6, wherein a natural oxide film is formed between the first silicon film and the second silicon film.

8. A method as.described above in 7, wherein the amount of the impurity contained in the first silicon film is larger than that contained in the second silicon film.

9. A method as described above in any one of 1 to 8, wherein the surface of the silicon or laminated silicon film is cleaned prior to the introduction of the impurity.

10. A method as described above in any one of 1 to 9, wherein after introduction of the impurity, a dielectric film is formed on the silicon or laminated silicon film without being exposed to the air.

11. A method as described above in 10, wherein heat treatment is conducted at 800° C. within 15 minutes after the formation of the dielectric film.

12. A method as described above in any one of 1 to 9, wherein after introduction of the impurity, the silicon or laminated silicon film is subjected to heat treatment at 800° C. and below within 15 minutes, followed by the formation of a dielectric film on the silicon or laminated silicon film.

13. A method as described above in 12, wherein the surface of the silicon or laminated silicon film is cleaned subsequent to the heat treatment after introduction of the impurity.

14. A method as described above in any one of 1 to 13, wherein the impurity element is phosphorus (P) and heat treatment for introducing the impurity element is conducted within a temperature range of from 500 to 850° C. in a gas atmosphere containing phosphine ($PH_3$).

15. A method as described above in 14, wherein the heat treatment for introducing the impurity element is conducted within a temperature range of from 500 to 850° C. for 10 minutes or less in a gas atmosphere which contains phosphine ($PH_3$) and hydrogen ($H_2$) and is under reduced pressure.

16. A method as described above in any one of 1 to 15, wherein the amorphous silicon film or the second amorphous silicon film contains an impurity at a concentration not greater than $2.5 \times 10^{20}$ atoms/cm$^{-3}$.

17. A method as described above in any one of 1 to 16, wherein a silicide film has been formed on the surface of the semiconductor substrate or polycrystalline silicon film constituting the gate electrode, prior to the step (a).

18. A method as described above in any one of 1 to 17, which further comprises forming a first silicon nitride film on the silicon film or laminated silicon film, wherein the first silicon nitride film is formed by nitriding of the surface of the silicon film or laminated silicon film or depositing a film on the silicon film or laminated silicon film.

19. A method as described above in 18, which further comprises forming a polycrystalline tantalum oxide film on the first silicon nitride film.

20. A method as described above in 19, wherein the step for forming the polycrystalline tantalum oxide film comprises forming a first polycrystalline tantalum oxide film and forming a second polycrystalline tantalum oxide film thicker than the first polycrystalline tantalum oxide film.

21. A method as described above in 19 or 20, wherein the step for forming the polycrystalline tantalum oxide film, first polycrystalline tantalum oxide film or second polycrystalline tantalum oxide film comprises depositing an amorphous tantalum oxide film by CVD and crystallizing the amorphous-tantalum oxide film by heat treatment in an oxidizing atmosphere.

22. A method as described above in 18, which further comprises forming a second silicon nitride film on the first silicon nitride film by CVD.

23. A method as described above in 19, further comprising a step of forming a titanium nitride film by CVD on the dielectric film containing the silicon nitride film, the polycrystalline tantalum oxide film, the second polycrystalline tantalum oxide film or the second silicon nitride film.

24. A method of manufacturing a semiconductor device, which comprises depositing an amorphous silicon film, and crystallizing the surface of the silicon film to roughen the same, wherein the concentration of the impurity contained in the amorphous silicon film is not greater than $2.5 \times 10^{20}$ atoms/cm$^{-3}$.

25. A method as described above in 24, wherein the amorphous silicon film is deposited on the underlying polycrystalline or amorphous silicon film and the underlying silicon film contains impurities at a higher concentration than the silicon film.

26. A method as described above in 25, wherein a natural oxide film is formed between the underlying silicon film and the silicon film.

27. A semiconductor device comprising a plurality of MISFETs and capacitors, said capacitors being electrically connected with MISFETs, a first electrode having a roughened surface and being composed of polycrystalline silicon, a second electrode formed opposite to the first electrode and being composed of a metal and an insulating film formed between the first and second electrodes, wherein the depletion ratio of each of the capacitors is not greater than 10%.

28. A semiconductor device as described above in 27, wherein the depletion ratio of each of the capacitors is not greater than 5%.

29. An apparatus for manufacturing a semiconductor device, which comprises a first reaction chamber for depositing an amorphous silicon film on a substrate, a second reaction chamber capable of heat treating the substrate, a vacuum transfer chamber for transferring the substrate into the first and second chambers while maintaining a pressure-reduced condition, a load lock chamber which is connected with the vacuum transfer chamber and conducts loading or unloading of the substrate, wherein subsequent to the deposition of the amorphous silicon film to the substrate in the first reaction chamber, the substrate is transferred into the second chamber, where the surface of the amorphous silicon film is roughened by exposure to a silane gas and heat treatment in the second reaction chamber, and a phosphine-containing gas is introduced into the second reaction chamber to introduce phosphorus into the roughened silicon film while terminating roughening.

30. An apparatus as described above in 29, wherein the substrate is heated up to a temperature at which crystallization of the whole roughened silicon film is conducted in the second reaction chamber.

31. An apparatus as described above in 29 or 30, further comprising a third reaction chamber which permits heat treatment or deposition of a silicon nitride film in an ammonia gas atmosphere and is connected with the vacuum transfer chamber, whereby the substrate is transferred from the second reaction chamber to the third reaction chamber through the vacuum transfer chamber without causing vacuum destruction and a silicon nitride film is formed on the roughened surface of the silicon film in the third reaction chamber.

BRIEF DESCRIPTION OF THE DRAWINGS

FIG. 1 is a cross-sectional view illustrating, in the order of steps, a manufacturing method of a DRAM according to Embodiment 1 of the present invention;

FIG. 2 is a cross-sectional view illustrating, in the order of steps, a manufacturing method of the DRAM according to Embodiment 1;

FIG. 7 is a cross-sectional view illustrating, in the order of steps, a manufacturing method of the DRAM according to Embodiment 1;

FIG. 8 is a cross-sectional view illustrating, in the order of steps, a manufacturing method of the DRAM according to Embodiment 1;

FIG. 9 is a cross-sectional view illustrating, in the order of steps, a manufacturing method of the DRAM according to Embodiment 1;

FIG. 10 is a cross-sectional view illustrating, in the order of steps, a manufacturing method of the DRAM according to Embodiment 1;

FIG. 15 is a cross-sectional view illustrating, in the order of steps, a manufacturing method of the DRAM according to Embodiment 1;

FIG. 16 is a cross-sectional view illustrating, in the order of steps, a manufacturing method of the DRAM according to Embodiment 1;

FIG. 17 is a cross-sectional view illustrating, in the order of steps, a manufacturing method of the DRAM according to Embodiment 1;

FIG. 18 is a cross-sectional view illustrating, in the order of steps, a manufacturing method of the DRAM according to Embodiment;

FIG. 19 is a cross-sectional view illustrating, in the order of steps, a manufacturing method of the DRAM according to Embodiment 1;

FIG. 20 is a cross-sectional view illustrating, in the order of steps, a manufacturing method of the DRAM according to Embodiment 1;

FIG. 21 is a cross-sectional view illustrating, in the order of steps, a manufacturing method of the DRAM according to Embodiment 1;

FIG. 22 is a cross-sectional view illustrating, in the order of steps, a manufacturing method of the DRAM according to Embodiment 1;

FIG. 37 is a fragmentary cross-sectional view illustrating, in the order of steps, a manufacturing method of the DRAM according to Embodiment 1;

FIG. 38 is a fragmentary cross-sectional view illustrating in the order of steps, a manufacturing method of the DRAM according to Embodiment 1;

FIGS. 39(a) and 39(b) are graphs for describing the effects of the DRAM of Embodiment 1, wherein FIG. 39(a) is a graph illustrating a profile of a phosphorus concentration in the depth direction after doping in the vapor phase, while 39(b) is a graph illustrating the measuring results of a depletion ratio of a capacitor;

DESCRIPTION OF THE PREFERRED EMBODIMENTS

Figure 3:
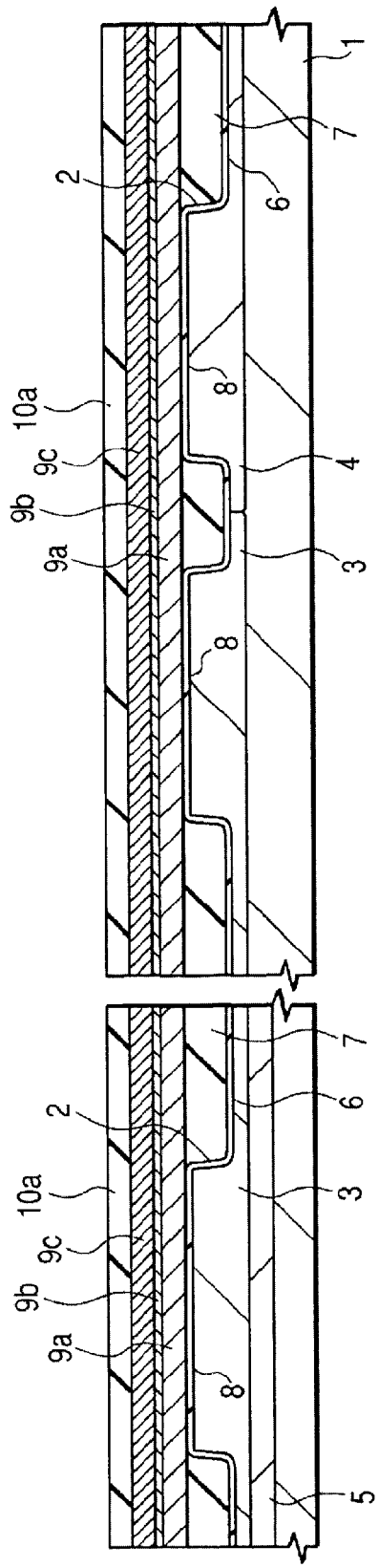
FIG. 3 is a cross-sectional view illustrating, in the order of steps, a manufacturing method of the DRAM according to Embodiment 1.

The embodiments of the present invention will be described specifically based on the accompanying drawings. In all the drawings for describing the embodiments, like members having the same function will be identified by like reference numerals and overlapping descriptions will be omitted.

First, a method of manufacturing a DRAM (Dynamic Random Access Memory) according to Embodiment 1 of the present invention will be described in the order of steps with reference to FIGS. 1 to 38. The left part of each of the drawings illustrating the cross-section of a substrate is a region (memory cell array) in which the memory cell of the DRAM is to be formed, while the right part is a peripheral circuit region.

As illustrated in FIG. 1, a semiconductor substrate (which will hereinafter be simply called a "substrate") 1 made of single crystal silicon which is p-type and has a specific resistance of about 10 Ωcm is provided. In the substrate 1, an element isolating groove 2 of about 350 nm depth is formed using photolithography and etching. Then, a silicon oxide film 6 as thin as about 10 nm is formed on the inside wall of the element isolating groove 2, for example, by wet oxidation at about 850 to 900° C. or by dry hot oxidation at about 1000° C. A silicon oxide film (which will hereinafter be called a "TEOS oxide film") is then deposited to a thickness of about 400 nm, for example, by plasma CVD using ozone ($O_3$) and tetraethoxysilane (TEOS) as source gases to embed the element isolating groove 2 with it. The silicon oxide film is then polished by CMP (Chemical Mechanical Polishing) to remove a portion of the silicon oxide film in a region other than the element isolation groove 2, whereby an element isolation region is formed with the silicon oxide film 7 remaining inside of the element isolating groove 2.

As illustrated in FIG. 2, after ion implantation of a p-type impurity (boron) and an n-type impurity (ex. phosphorus) in the substrate 1, these impurities are diffused by heat treatment at about 1000° C., whereby a p-type well 3 and an n-type well 5 are formed in the substrate 1 of the memory cell array, while a p-type well 3 and an n-type well 4 are formed in the substrate 1 of the peripheral circuit region. The surface of the substrate 1 (p-type well 3 and n-type well 4) is wet washed with a hydrofluoric acid washing liquid, followed by the formation of a clean gate oxide film 8 of about 6 nm thick on the surface of each of the p-type well 3 and n-type well 4 by hot oxidation at about 800° C.

As illustrated in FIG. 3, a polycrystalline silicon film 9a is then deposited over the gate oxide film 8 of about 100 nm by CVD. Formed over the polycrystalline silicon film 9a is WN film 9b, over WN film 9b is W film 9c, and over W film 9c is silicon oxide film 10a. WN film 9b is a barrier layer between polycrystalline silicon film 9a and W film 9c, W film 9b is for forming gate electrodes, and silicon oxide film 10a is for protecting W film 9c.

Figure 4:
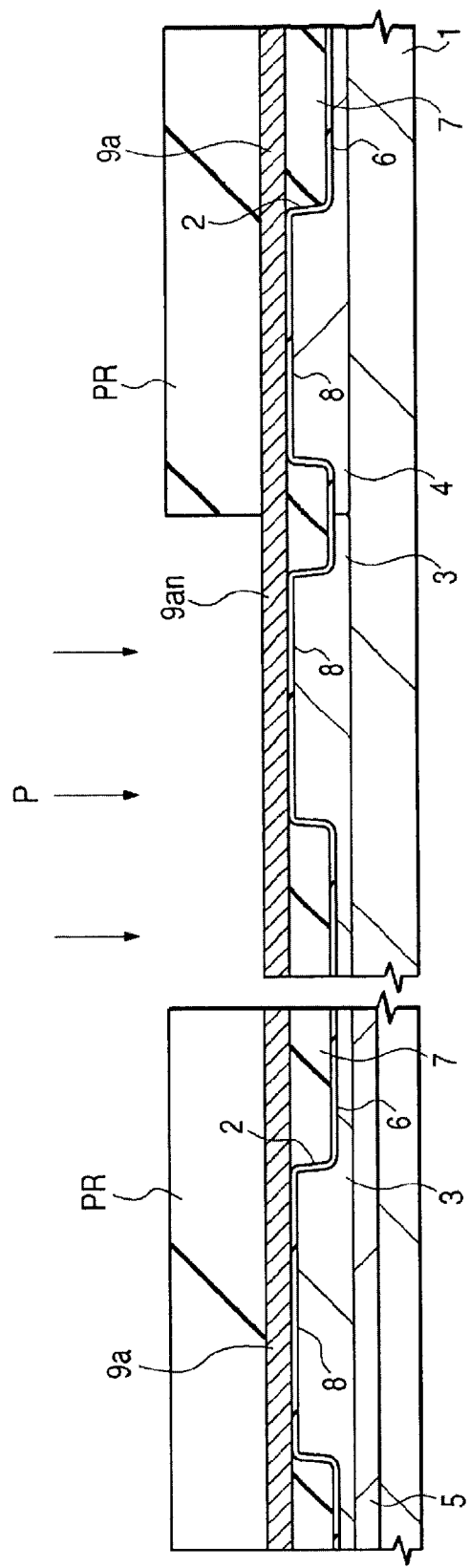
FIG. 4 is a cross-sectional view illustrating, in the order of steps, a manufacturing method of the DRAM according to Embodiment 1.

As illustrated in FIG. 4, a region other than the region (region having the p-type well 3 of the peripheral circuit formed therein) in which an n-channel type MISFET of the peripheral circuit is to be formed is then covered with a photoresist film PR, followed by ion implantation of an impurity showing n-type conductivity, for example, phosphorus (P), whereby the polycrystalline silicon film 9a in the region wherein the n-channel type MISFET of the peripheral circuit is to be formed is converted into an n-type polycrystalline silicon film 9an.

Figure 5:
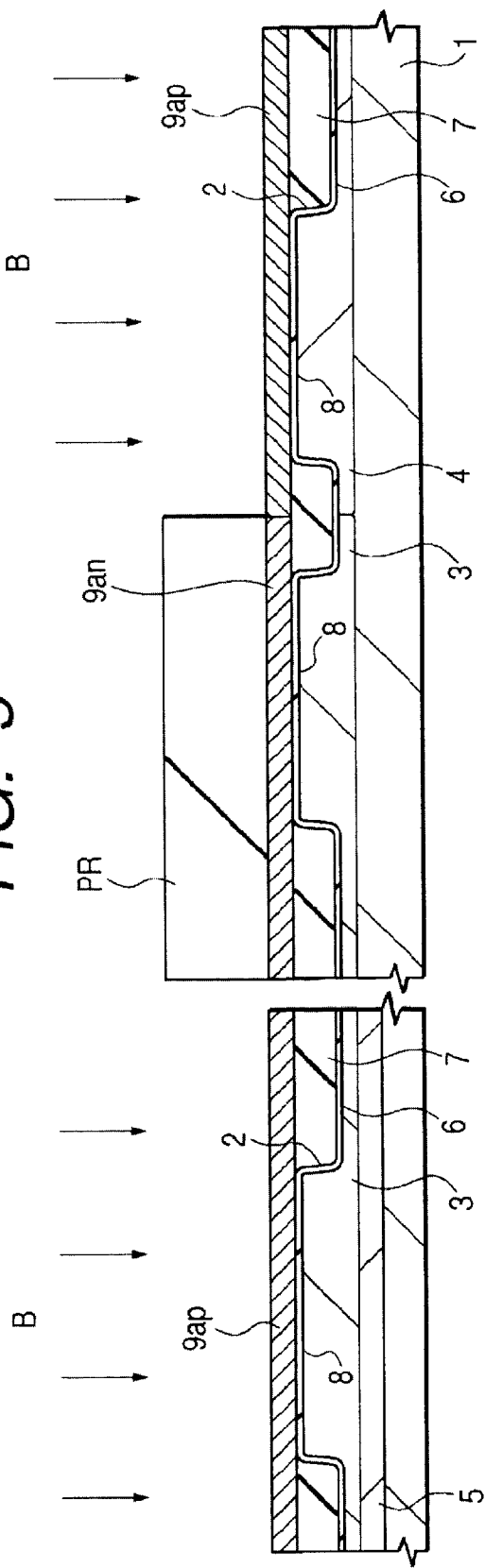
FIG. 5 is a cross-sectional view illustrating, in the order of steps, a manufacturing method of the DRAM according to Embodiment 1.

As illustrated in FIG. 5, a region (region having the p-type well 3 of the peripheral circuit formed therein) wherein the n-channel type MISFET of the peripheral circuit is to be formed is then covered with a photoresist film PR, followed by the ion implantation of an impurity showing p-type conductivity, for example, boron (B), whereby the polycrystalline silicon film 9a in a region wherein the p-channel type MISFET is to be formed is converted into a p-type polycrystalline silicon film 9ap.

By the above-described ion implantation, the n-type polycrystalline silicon film 9an is formed on the p-type well 3 of the peripheral circuit region, while the p-type polycrystalline silicon film 9ap is formed on the n-type well 4 of the peripheral circuit region and p-type well 3 of the memory cell array region. As will be described later, the n-type polycrystalline silicon film 9an or p-type one 9ap is to constitute a part of the gate electrode of the MISFET. The n-channel type MISFET to be formed in the memory cell array has a p-type gate electrode, while the MISFET formed in the peripheral circuit region has an n-type gate electrode when the MISFET is an n-channel type and a p-type gate electrode when the MISFET is a p-channel type.

By properly using the conductivity type of the gate electrode of the MISFET for the memory cell array and that for the peripheral circuit as described above, the following effects are brought about owing to a difference between them in a work function. Concerning the MISFET of the memory cell array, use of a p-type gate electrode for the n-channel type MISFET increases Vth (threshold voltage), thereby reducing a channel leakage current of the MISFET. This improves refresh properties of the DRAM and therefore improves the performance of the resulting semiconductor device.

Concerning the MISFET of the peripheral circuit region, on the other hand, use of an n-type gate electrode for the n-channel type MISFET and a p-type gate electrode for the p-channel type MISFET equalizes their Vth (threshold voltages), which lowers the necessity for forming a channel diffusion layer for adjusting the threshold voltage. The lowering in the amount of impurities introduced for adjusting the threshold voltage induces a decrease of carrier-scattering factors in the channel, leading to an improvement of carrier mobility, and also an improvement in the performance of the MISFET. In addition, it becomes possible to apply it to the MISFET of a low-voltage operation, because the Vth (threshold voltage) can be reduced without introducing a channel diffusion layer for adjusting the threshold voltage.

The above-described effects can contribute to not only the improvement of refresh properties which are mainly required for the MISFET of the memory cell array, but also the improvement of a switching rate which is mainly required for the MISFET of the peripheral circuit region. Such a structure therefore exhibits large effects when adapted to the DRAM of this Embodiment.

Use of a boron-containing polycrystalline silicon film for a part of the gate electrode may be accompanied with the problem that owing to a large thermal diffusion coefficient of boron, boron diffused from the gate electrode (polycrystalline silicon film) passes through the gate insulating film, reaches the channel region (well) and changes the threshold voltage of the MISFET. This problem tends to occur particularly in the capacitor forming step which will be described later, because it includes a heat treating step at high temperatures. In this Embodiment, however, heat treatment at high temperatures subsequent to this step is conducted under control to suppress thermal diffusion of boron, thereby preventing the occurrence of such a problem. This will be described later more specifically.

Figure 6:
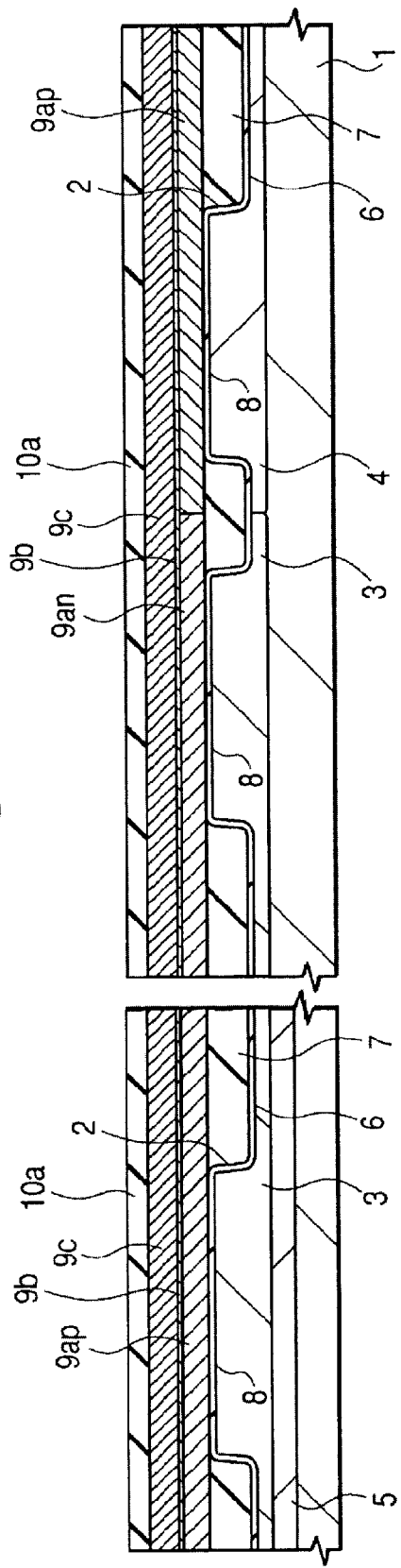
FIG. 6 is a cross-sectional view illustrating, in the order of steps, a manufacturing method of the DRAM according to Embodiment 1.

As illustrated in FIG. 6, a WN film 9b of about 5 nm thick and a W film 9c of about 50 nm thick are deposited successively over the n-type or p-type polycrystalline silicon film 9an or 9ap by sputtering, followed by deposition thereover of a silicon oxide film 10a of about 100 nm thick by CVD.

Heat treatment is then conducted at about 800° C. in an inert gas atmosphere such as nitrogen gas for the purpose of relaxing the stress of the W film 9c and densifying the WN film 9b. The silicon oxide film 10a is formed over the W film 9c in order to protect the surface of the W film 9c upon the above-described heat treatment and to relax the stress on the interface between a silicon nitride film (10b) which will be deposited over the silicon oxide film 10a in the next step and the underlying W film 9c.

As illustrated in FIG. 7, the silicon nitride film 10b of about 100 nm thick is deposited over the silicon oxide film 10a by CVD, followed by dry etching of the silicon nitride film 10b with a photoresist film (not illustrated) with a mask, whereby the silicon nitride film 10b is left in a region wherein a gate electrode is to be formed later.

After removal of the photoresist film, the silicon oxide film 10a, W film 9c, WN film 9b and n-type or p-type polycrystalline silicon film 9an or 9ap are, as illustrated in FIG. 8, dry etched with the silicon nitride film 10b as a mask, whereby a gate electrode 9n formed of the n-type polycrystalline silicon film 9an, WN film 9b and W film 9c and a gate electrode 9p formed of the p-type polycrystalline silicon film 9ap, WN film 9b and W film 9c are formed. As described above, the gate electrode 9p is formed in the memory cell array and peripheral circuit region, while the gate electrode 9n is formed in the peripheral circuit region. Over these gate electrodes 9n and 9p, a cap insulating film 10 formed of the silicon oxide film 10a and silicon nitride film 10b is formed. The gate electrode 9p formed in the memory cell array functions as a word line WL.

As illustrated in FIG. 9, n⁻type semiconductor regions 11 are formed by ion implantation of an n⁻type impurity (phosphorus or arsenic) into the p-type well 3 on both sides of the gate electrode 9n or 9p, while p⁻type semiconductor regions 12 are formed by ion implantation of a p⁻type impurity (boron) into the n-type well 4.

As illustrated in FIG. 10, after deposition of a silicon nitride film 13 on the substrate 1 to give a thickness of about 50 nm by CVD, the upper portion of the substrate 1 in the memory cell array is covered with a photoresist film (not illustrated). The silicon nitride film 13 in the peripheral circuit region is then anisotropically etched, whereby sidewall spacers 13a are formed on the side walls of each of the gate electrodes 9n, 9p in the peripheral circuit region.

By ion implantation of an n-type impurity (phosphorus or arsenic) into the p-type well 3 of the peripheral circuit region, n⁺type semiconductor regions 14 (source and drain) are formed, while by ion implantation of a p-type impurity (boron) into the n-type well 4, p⁺type semiconductor regions 15 (source and drain) are formed. By the steps so far described, an n-channel type MISFETQn and a p-channel type MISFETQp are formed, each being equipped with a source and drain and having an LDD (Lightly Doped Drain) structure.

Figure 11:
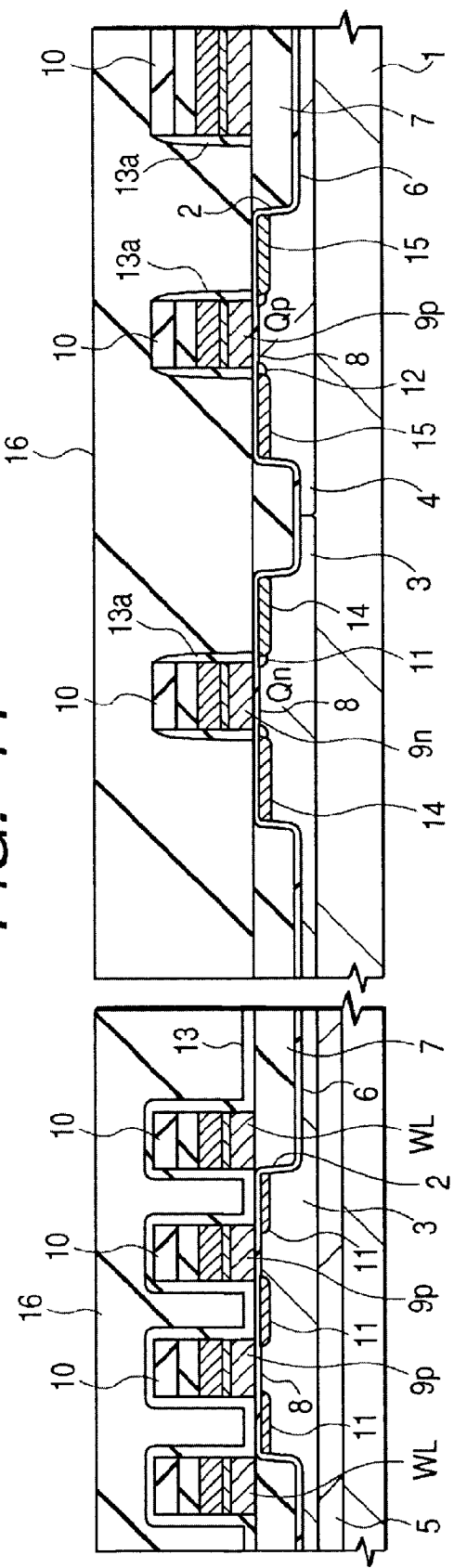
FIG. 11 is a cross-sectional view illustrating, in the order of steps, a manufacturing method of the DRAM according to Embodiment 1.

As illustrated in FIG. 11, a silicon oxide film 16 is formed over the gate electrodes 9n and 9p. This silicon oxide film 16 can be formed, for example, as a TEOS oxide film and its surface is flattened by CMP.

Figure 12:
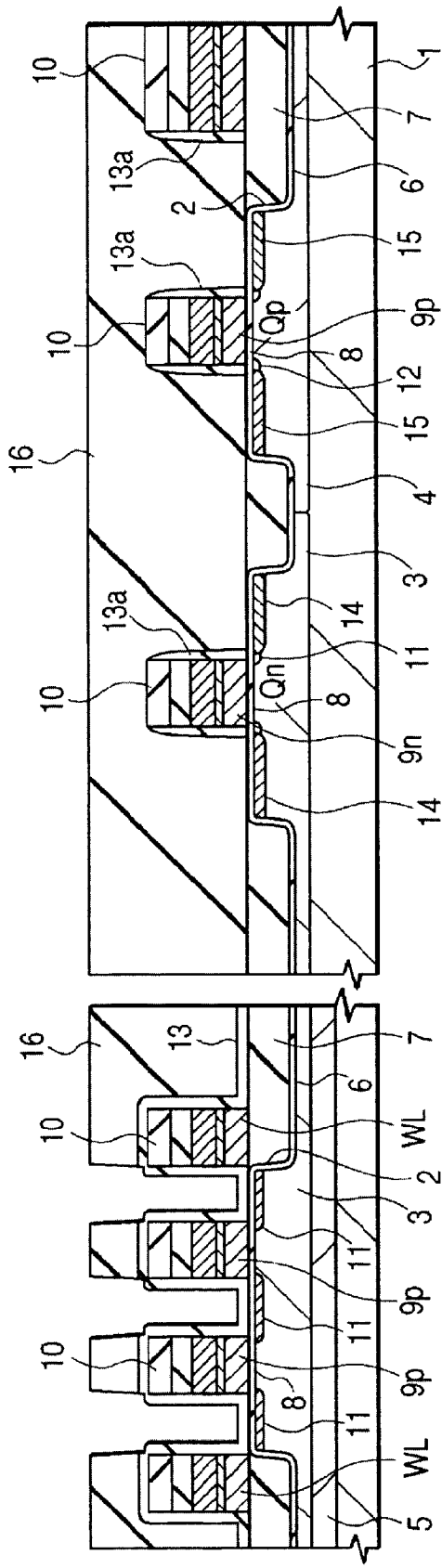
FIG. 12 is a cross-sectional view illustrating, in the order of steps, a manufacturing method of the DRAM according to Embodiment 1.
Figure 13:
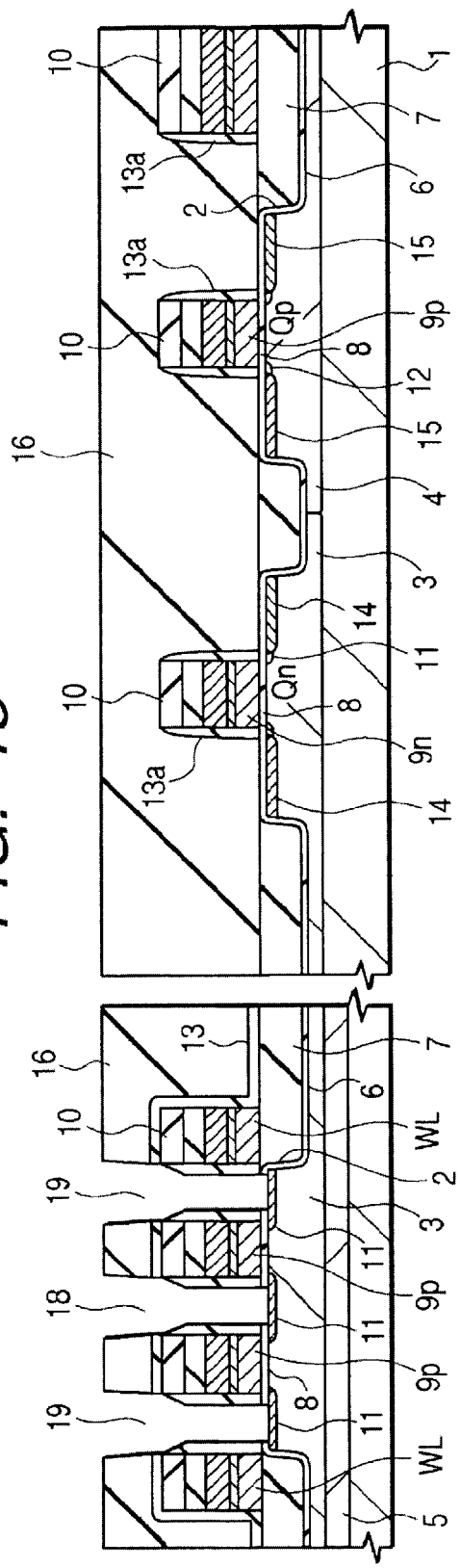
FIG. 13 is a cross-sectional view illustrating, in the order of steps, a manufacturing method of the DRAM according to Embodiment 1.

As illustrated in FIG. 12, the silicon oxide film 16 in the memory cell array is then dry etched using a photoresist film (not illustrated) as a mask, followed by dry etching of the silicon nitride film 13 lying below the silicon oxide film 16 as illustrated in FIG. 13. By dry etching in two stages as described above, contact holes 18, 19 are formed over the n⁻type semiconductor regions 11.

The silicon oxide film 16 is etched under the conditions so that the etching rate of silicon oxide (silicon oxide film 16) becomes higher than that of silicon nitride, whereby the silicon nitride film 13 is not removed completely. The silicon nitride film 13 is etched under conditions so that the etching rate of silicon nitride becomes higher than that of silicon (substrate) or silicon oxide, whereby the substrate 1 or silicon oxide film 7 is not etched so deeply. Moreover, the silicon nitride film 13 is etched under conditions permitting anisotropic etching of the silicon nitride film 13, whereby the silicon nitride film 13 is left on the side walls of the gate electrode 9p (word line WL). In this manner, the contact holes 18, 19 having a minute diameter are formed in self alignment with the gate electrode 9p (word line WL).

Figure 14:
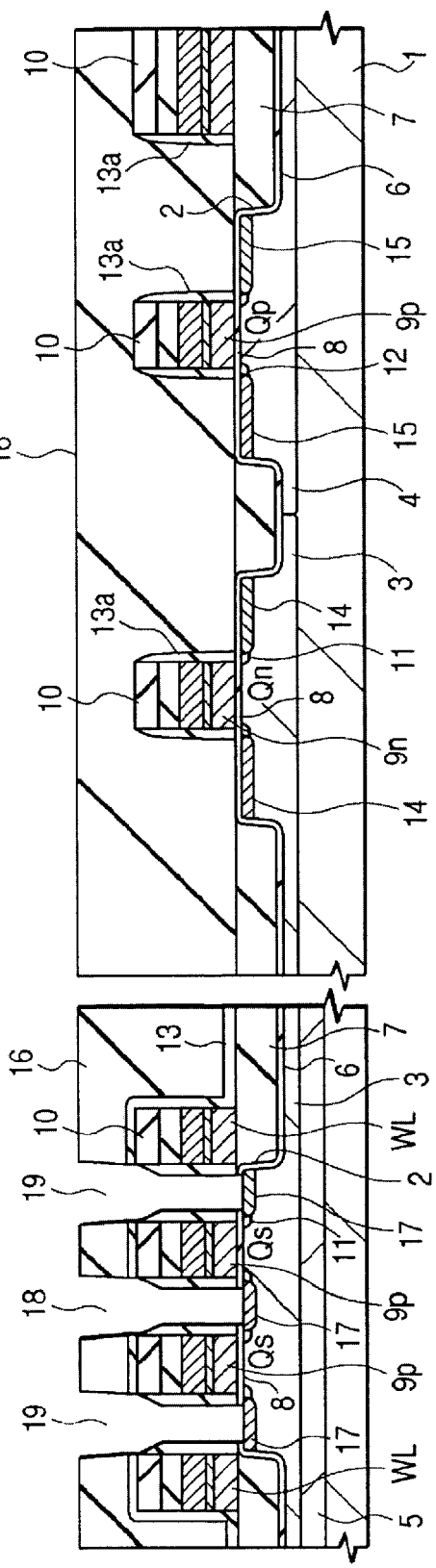
FIG. 14 is a cross-sectional view illustrating, in the order of steps, a manufacturing method of the DRAM according to Embodiment 1.

As illustrated in FIG. 14, n⁺type semiconductor regions 17 (source and drain) are then formed by ion implantation of an n-type impurity (phosphorus or arsenic) through the contact holes 18, 19 into the p-type well 3 of the memory cell array. By the steps so far described, an n-channel type memory-cell-selective MISFETQs is formed in the memory cell array.

As illustrated in FIG. 15, a plug 20 is then formed inside of each of the contact holes 18, 19. This plug 20 is formed by wet washing the inside of each of the contact holes 18, 19 with a hydrofluoric-acid-containing washing liquid, depositing, by CVD, a low-resistance polycrystalline silicon film, which has been doped with an n-type impurity such as phosphorus (P), over the silicon oxide film 16 including the inside of each of the contact holes 18, 19 and then leaving this polycrystalline silicon film only inside of each of the contact holes 18, 19 by etching back (or polishing by CMP).

As illustrated in FIG. 16, after deposition of a silicon oxide film 21 of about 20 nm thick over the silicon oxide film 16 by CVD, the silicon oxide film 21 and the underlying silicon oxide film 16, both in the peripheral circuit region, are dry etched using a photoresist film (not illustrated) as a mask, whereby contact holes 22 are formed over the source and drain (n⁺ type semiconductor regions 14) of the n-channel type MISFETQn and contact holes 23 are formed over the source and drain (p⁺ type semiconductor regions 15) of the p-channel type MISFETQp. At the same time, a contact hole 24 is formed over the gate electrode 9 of the p-channel-type MISFETQp of the peripheral circuit region (and the gate electrode 9 of an un-illustrated region of the n-channel type MISFETQp), while a through-hole 25 is formed over the contact hole 18 of the memory cell array.

As illustrated in FIG. 17, after formation of a silicide film 26 On the surface of each of the source and drain ($n^+$ type semiconductor regions 14) of the n-channel type MISFETQn, the surface of each of the source and drain ($p^+$ type semiconductor regions 15) of the p-channel type MISFETQp and the surface of the plug 20 inside of the contact hole 18, a plug 27 is formed inside of each of the contact holes 22, 23, 24 and through-hole 25.

The above-described silicide film 26 is formed, for example, by depositing a Ti film of about 30 nm thick and a TiN film of about 20 nm thick over the silicon oxide film 21 including the inside of each of the contact holes 22, 23, 24 and the through-hole 25 by sputtering, followed by thermal treatment of the substrate 1 at about 650° C. The plug 27 is formed, for example, by depositing a TiN film of about 50 nm thick and a W film of about 300 nm thick by CVD over the TiN film including the inside of each of the contact holes 22, 23, 24 and the through-hole 25 and polishing the W film, TiN film and Ti film over the silicon oxide film 21 by CMP to leave these films only inside of the contact holes 22, 23, 24 and the through-hole 25.

The contact resistance of the source or drain ($n^+$ type semiconductor region 14, $p^+$ type semiconductor region 15) with the plug 27 can be reduced by the formation of the above-described silicide film 26 composed of Ti silicide on the interface between the source or drain ($n^+$ type semiconductor region 14, $p^+$ type semiconductor region 15) and the plug 27 formed thereover, which makes it possible to improve the operation velocity of the MISFET (n-channel type MISFETQn, p-channel type MISFETQp) constituting the peripheral circuit.

According to the study of the present inventors, the silicide film 26 involves a problem concerning its heat resistance. More specifically, if this step is followed by heat treatment at high temperatures, the Ti film which has remained unreacted, for example, is converted into the corresponding silicide during the heat treating step at a high temperature, resulting in an increase in the stress in the vicinity of the silicide film 26 or formation of voids due to the movement of a reactive substance. Such an increase in the stress or formation of voids is not preferred, because it presumably causes a rise in the resistance of the contact portion and deterioration of reliability. In particular, the capacitor forming step which will be described later includes heat treatment at high temperatures so that such a problem tends to occur. In this Embodiment, however, heat treatment at high temperatures after this step is suppressed so that thermal diffusion of boron is controlled and occurrence of the problem as described above can be prevented, which will be described later in more detail.

As illustrated in FIG. 18, a bit line BL is then formed over the silicon oxide film 21 of the memory cell array, while the first interconnection layers 30 to 33 are formed over the silicon oxide film 21 of the peripheral circuit region. The bit line BL and first interconnection layers 30 to 33 are formed, for example, by depositing a W film of about 100 nm thick over the silicon oxide film 21 by sputtering and then dry etching this W film using a photoresist film as a mask. At this time, since the silicon oxide film 16 lying below the bit line BL and the interconnections 30 to 33 have been flattened, the bit line BL and the interconnections 30 to 33 can be patterned with a high size accuracy.

As illustrated in FIG. 19, a silicon oxide film 34 of about 300 nm thick is then formed over the bit line BL and first interconnection layers 30 to 33. This silicon oxide film 34 is formed similarly to the silicon oxide film 16.

As illustrated in FIG. 20, after deposition of a polycrystalline silicon film 35 of about 20 nm thick over the silicon oxide film 34, the polycrystalline silicon film 35 of the memory cell array is dry etched using a photoresist film as a mask, whereby a groove 36 is formed in the polycrystalline silicon film 35 above the contact hole 19.

As illustrated in FIG. 21, side spacers 37 are then formed on the side walls of the groove 36. By dry etching of the silicon oxide film 34 and the underlying silicon oxide film 21 using the side wall spacers 37 and the polycrystalline silicon film 35 as a mask, a through-hole 38 is formed over the contact hole 19. The side wall spacers 37 on the side walls of the groove 36 are formed by depositing a polycrystalline silicon film by CVD over the polycrystalline silicon film 35 including the inside of the groove 36 and leaving it on the side walls of the groove 36 by anisotropic etching.

The diameter of the through-hole 38 is made smaller than that of the contact hole 19 therebelow by forming the through-hole 38 on the bottom of the groove 36 having at the side walls thereof the side wall spacers 37, which makes it possible to prevent a short circuit between a plug 39, which will be embedded inside of the through-hole 38 in the subsequent step, and the bit line BL, because the alignment margin of the bit line BL and the through-hole 38 can be secured even if the memory cell size is reduced.

After removal of the polycrystalline silicon film 35 and side wall spacers 37 by dry etching, the plug 39 is formed inside of the through-hole 38 as illustrated in FIG. 22. This plug 39 is formed by depositing a low-resistance polycrystaline silicon film, which has been doped with an n-type impurity (phosphorus), by CVD over the silicon oxide film 34 including the inside of the through-hole 38 and then leaving the polycrystalline silicon film only inside of the through-hole 38 by etching back.

Figure 23:
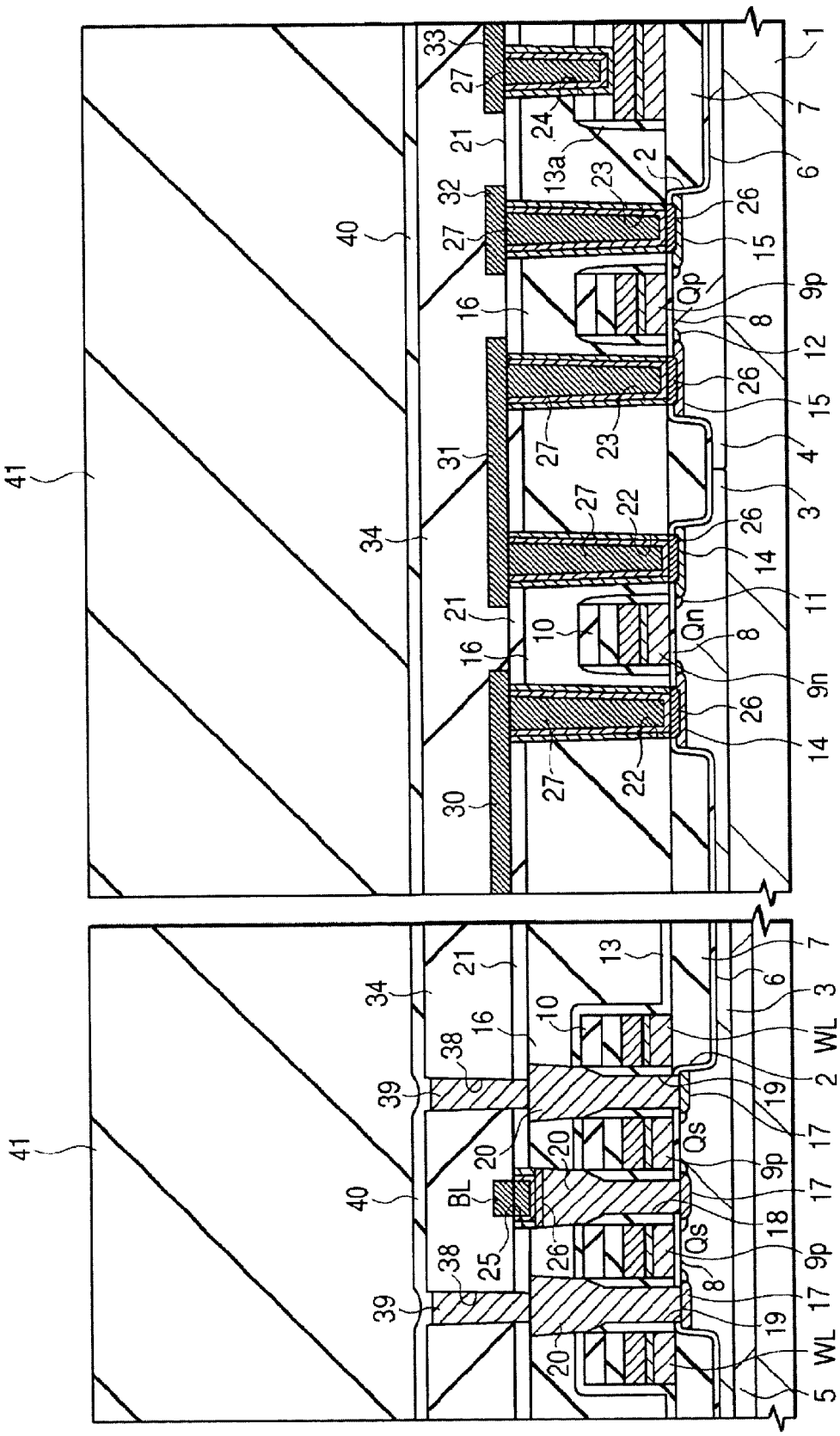
FIG. 23 is a cross-sectional view illustrating, in the order of steps, a manufacturing method of the DRAM according to Embodiment 1.
Figure 24:
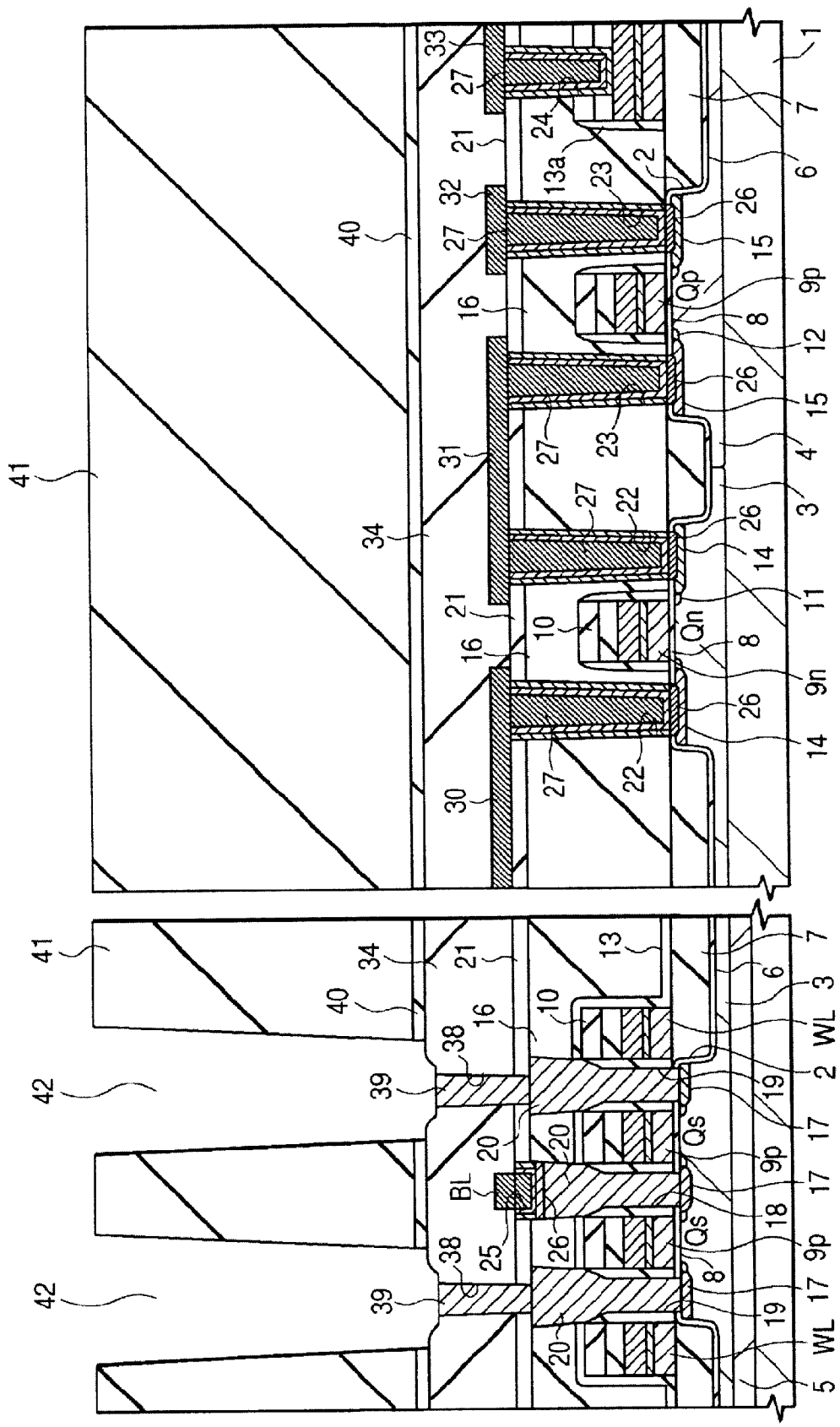
FIG. 24 is a cross-sectional view illustrating, in the order of steps, a manufacturing method of the DRAM according to Embodiment 1.

As illustrated in FIG. 23, a silicon nitride film 40 of about 100 nm thick is then deposited over the silicon oxide film 34 by CVD, followed by deposition of a silicon oxide film 41 over the silicon nitride film 40 by CVD. As illustrated in FIG. 24, the silicon oxide film 41 of the memory array is dry etched using a photoresist film (not illustrated) as a mask and then the silicon nitride film 40 lying under the silicon oxide film 41 is dry etched, whereby a groove 42 is formed over the through-hole 38. The lower electrode of an information storing capacitor is to be formed along the inside wall of this groove 42 so that it is necessary to deposit the silicon oxide film 41, in which a groove 42 is to be formed, to give a thickness as thick as about 1.3 $\mu$m in order to enlarge the surface area of the lower electrode, thereby increasing the accumulated charge amount.

Figure 25:
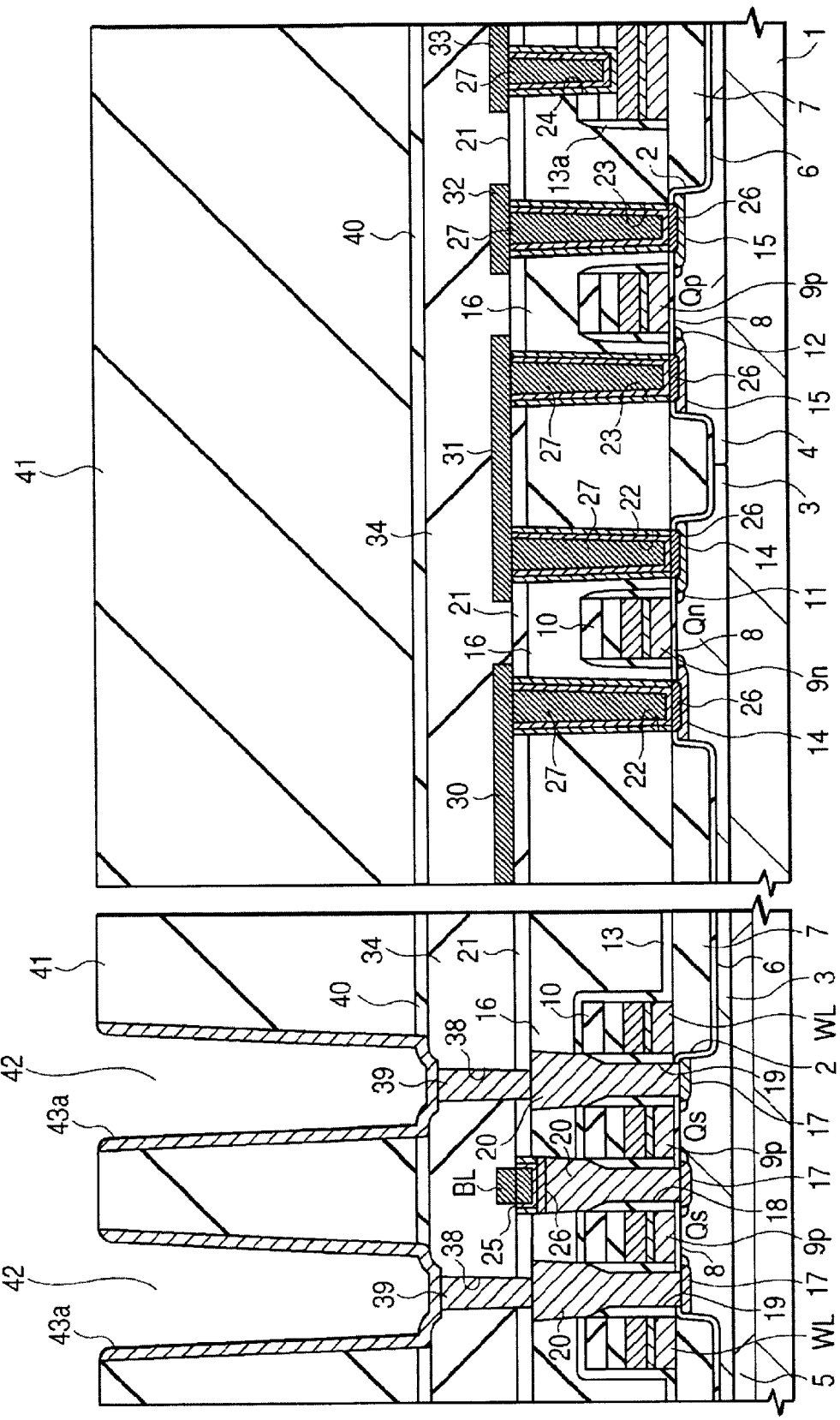
FIG. 25 is a cross-sectional view illustrating, in the order of steps, a manufacturing method of the DRAM according to Embodiment 1.

As illustrated in FIG. 25, an amorphous silicon film 43a of about 50 nm thick, which has been doped with an n-type impurity (phosphorus), is deposited by CVD over the silicon oxide film 41 including the inside of the groove 42. This amorphous silicon film 43a is formed to contain phosphorus at a concentration not greater than $2.5 \times 10^{20}$ atoms/cm$^{-3}$, preferably not greater than $2.0 \times 10^{20}$ atoms/cm$^{-3}$. Owing to a relatively low concentration of phosphorus (impurity), crystal growth of HSG which will be described later can be conducted smoothly. More specifically, in an amorphous silicon film containing an impurity (ex. phosphorus) at a high concentration, existence of the impurity at a high concentration disturbs sufficient growth of HSG, because the existence of the impurity excessively promotes the crystallization from amorphous silicon and crystallization of a silicon film is completed before HSG crystals grow into a sufficient size. In this Embodiment, however, the impurity concentration is suppressed so that crystals of a sufficient grain size can be obtained in an HSG forming step which will be described later. According to the study by the present inventors, a impurity concentration not greater than $2.5 \times 10^{20}$ atoms/cm$^{-3}$, preferably not greater than $2.0 \times 10^{20}$ atoms/cm$^{-3}$, permits growth of crystals having a sufficient grain size.

The amorphous silicon film 43$a$ does not contain a large amount of an impurity (phosphorus) as described above so that HSG (granular crystals) undergoes sufficient growth. It is however not possible to carry out sufficient heat treatment for activating most of the impurity because of the existence of the silicide film 26 or the p-type gate electrode 9$p$. As will be described later, doping of an impurity is conducted by the vapor phase method in this Embodiment, so that the depletion-wise problem can be avoided.

The amorphous silicon film 43$a$ over the silicon oxide film 41 is then etched back to leave it along the inside wall of the groove 42. Alternatively, the amorphous silicon film 43$a$ can be left on the inside wall of the groove 42 by filling SOG in the groove 42, thereby forming an SOG film, and polishing and removing the SOG film and the amorphous silicon film 43$a$ over the silicon oxide film 41 by CNP.

Figure 26:
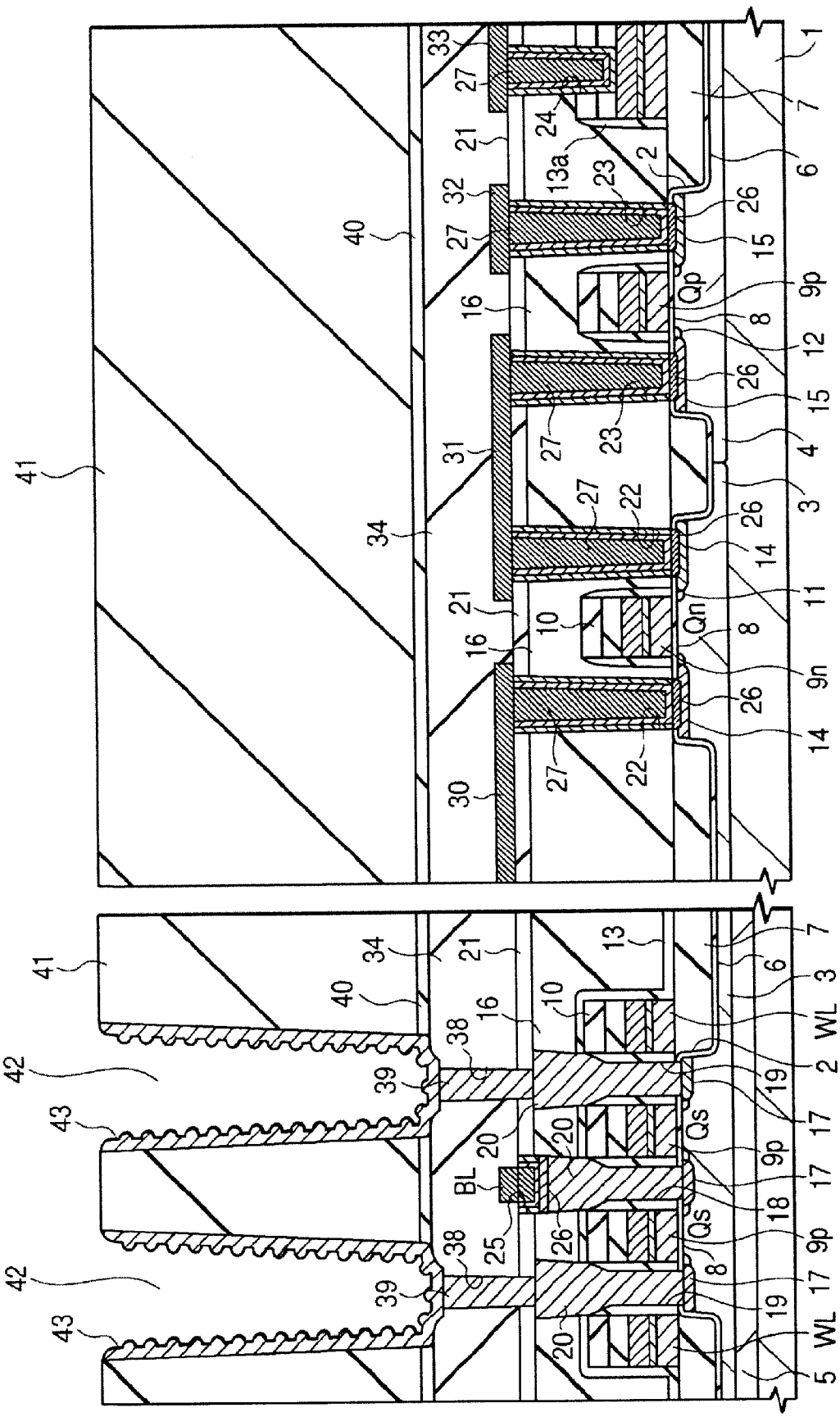
FIG. 26 is a cross-sectional view illustrating, in the order of steps, a manufacturing method of the DRAM according to Embodiment 1.

As illustrated in FIG. 26, the surface of the amorphous silicon film 43$a$ is fed with monosilane (SiH$_4$) in a reduced atmosphere, followed by heat treatment of the substrate 1 to polycrystallize the amorphous silicon film 43$a$ and at the same time, to allow silicon grains to grow on its surface, whereby a polycrystalline silicon film 43 having a roughened surface is formed along the inside wall of the groove 42. Furthermore, the substrate 1 is heat treated in a gas containing phosphine and hydrogen, whereby the polycrystalline silicon film 43 is doped with phosphorus (P). The resulting polycrystalline silicon film 43 is used as a lower electrode for the information storing capacitor.

The step of formation of the polycrystalline silicon film 43 will be described in detail based on FIGS. 27 to 35. FIGS. 27 to 35 (except FIG. 31) are each an enlarged cross-sectional view of the portion A of FIG. 26.

Figure 27:
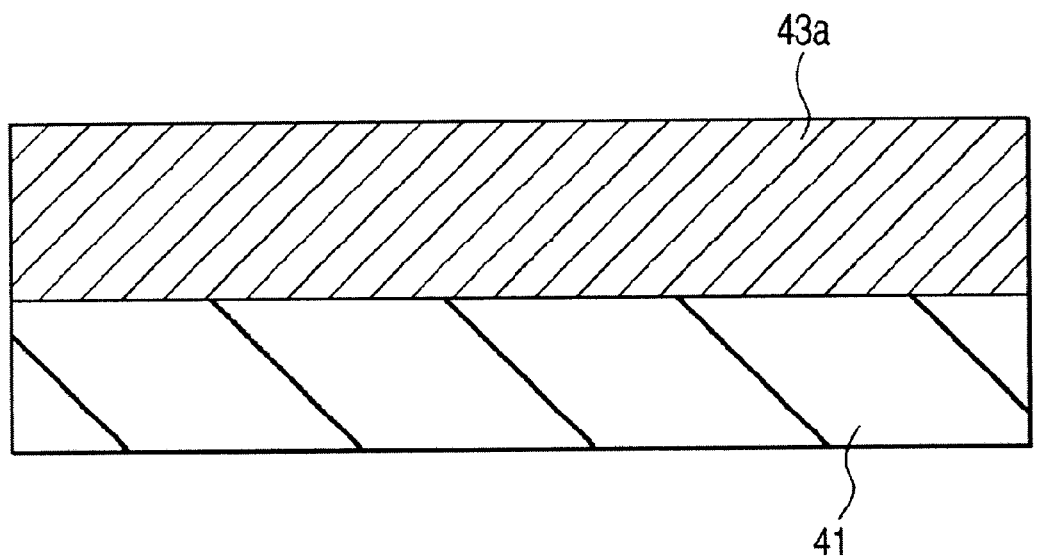
FIG. 27 is a fragmentary cross-sectional view illustrating, in the order of steps, a manufacturing method of the DRAM according to Embodiment 1.

As described above in the step of FIG. 25, the amorphous silicon film 43$a$ is deposited over the silicon oxide film 41 (FIG. 27). The surface of the amorphous silicon film 43$a$ is wet washed with a hydrofluoric acid type washing liquid, whereby the surface of the amorphous silicon film 43$a$ can be maintained highly clean. This clean surface makes it possible to form granular silicon (HSC crystals) with good controllability.

Figure 28:
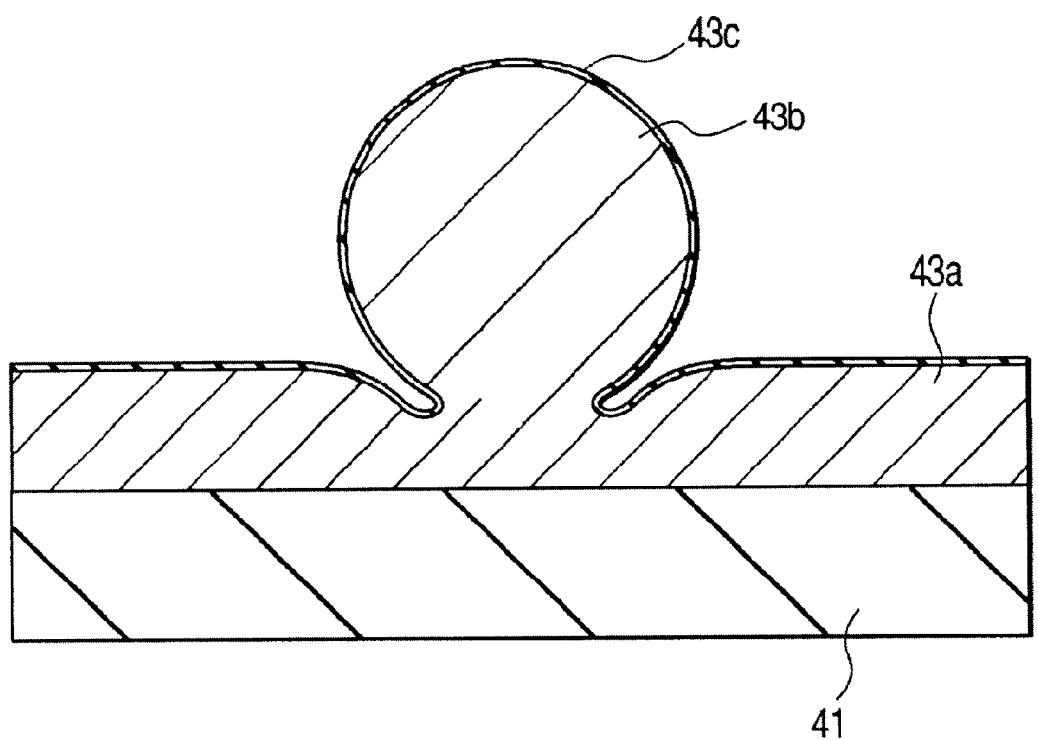
FIG. 28 is a fragmentary cross-sectional view illustrating, in the order of steps, a manufacturing method of the DRAM according to Embodiment 1.

The surface of the amorphous silicon film 43$a$ is then fed with a gas containing monosilane (SiH$_4$), followed by heat treatment of the substrate 1 to form granular silicon 43$b$ (FIG. 28). When monosilane is supplied, a crystalline nucleus is formed on the surface of the amorphous silicon film 43$a$. The density of the crystalline nucleus can be controlled by the time and temperature of preheating prior to the supply of the monosilane gas. By the heat treatment of the substrate 1 at predetermined time and temperature, the size (height) of the granular silicon 43$b$ can be controlled. In this Embodiment, owing to the low concentration of an impurity (phosphorus) contained in the amorphous silicon film 43$a$, the granular polycrystalline silicon 43$b$ having a sufficient size can be formed with satisfactory controllability.

In this stage, the granular silicon 43$b$ has already been crystallized and is in the polycrystalline form, while the silicon film 43$a$ other than the granular silicon 43$b$ is still in the amorphous form. On the surface of the silicon film 43$a$ including the granular silicon 43$b$, an oxide film 43$c$ is formed by residual oxygen or moisture. Alternatively, exposure to the air upon transfer to the step subsequent to the granular silicon 43$b$ forming step happens to cause natural oxidation with oxygen or moisture in the air, thereby forming the oxide film 43$c$.

Figure 29:
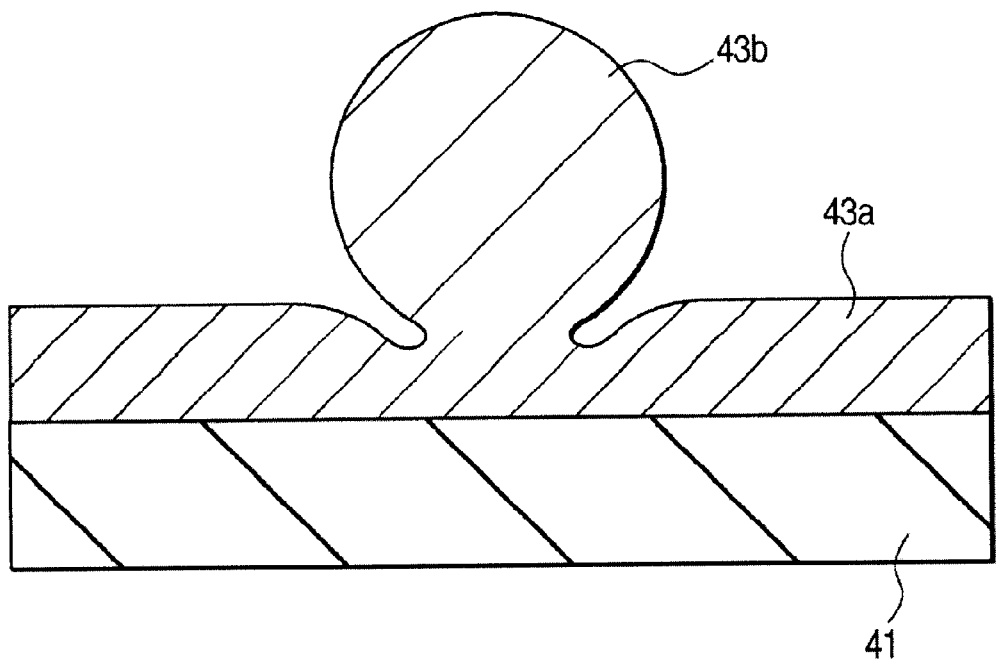
FIG. 29 is a fragmentary cross-sectional view illustrating, in the order of steps, a manufacturing method of the DRAM according to Embodiment 1.
Figure 30:
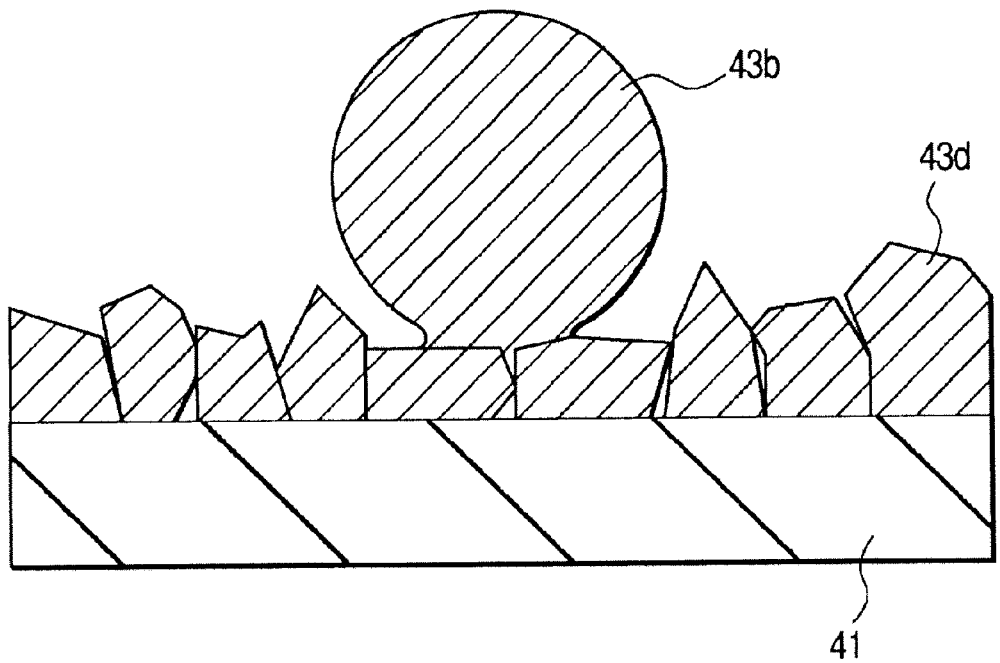
FIG. 30 is a fragmentary cross-sectional view illustrating, in the order of steps, a manufacturing method of the DRAM according to Embodiment 1.

As illustrated in FIG. 29, the oxide film 43$c$ is then removed, for example, by wet etching with hydrofluoric acid and as illustrated in FIG. 30, the silicon film 43$a$ is completely crystallized, whereby a silicon film composed of the granular silicon 43$b$ and polycrystalline silicon film 43$d$ is formed. Since the silicon film 43$a$ does not contain a large amount of an impurity, the silicon film 43$d$ in the polycrystalline form is formed to have a comparatively rough surface.

The substrate 1 is then introduced into a reaction chamber capable of heat treating it. After sufficient heating (ex. at 700° C. or greater) of the substrate 1 (wafer), a gas containing phosphine (PH$_3$), for example, a gas mixture of phosphine and hydrogen (H$_2$) is introduced. Rather than a mixed gas, a gas containing only phosphine can also be used.

Figure 31:
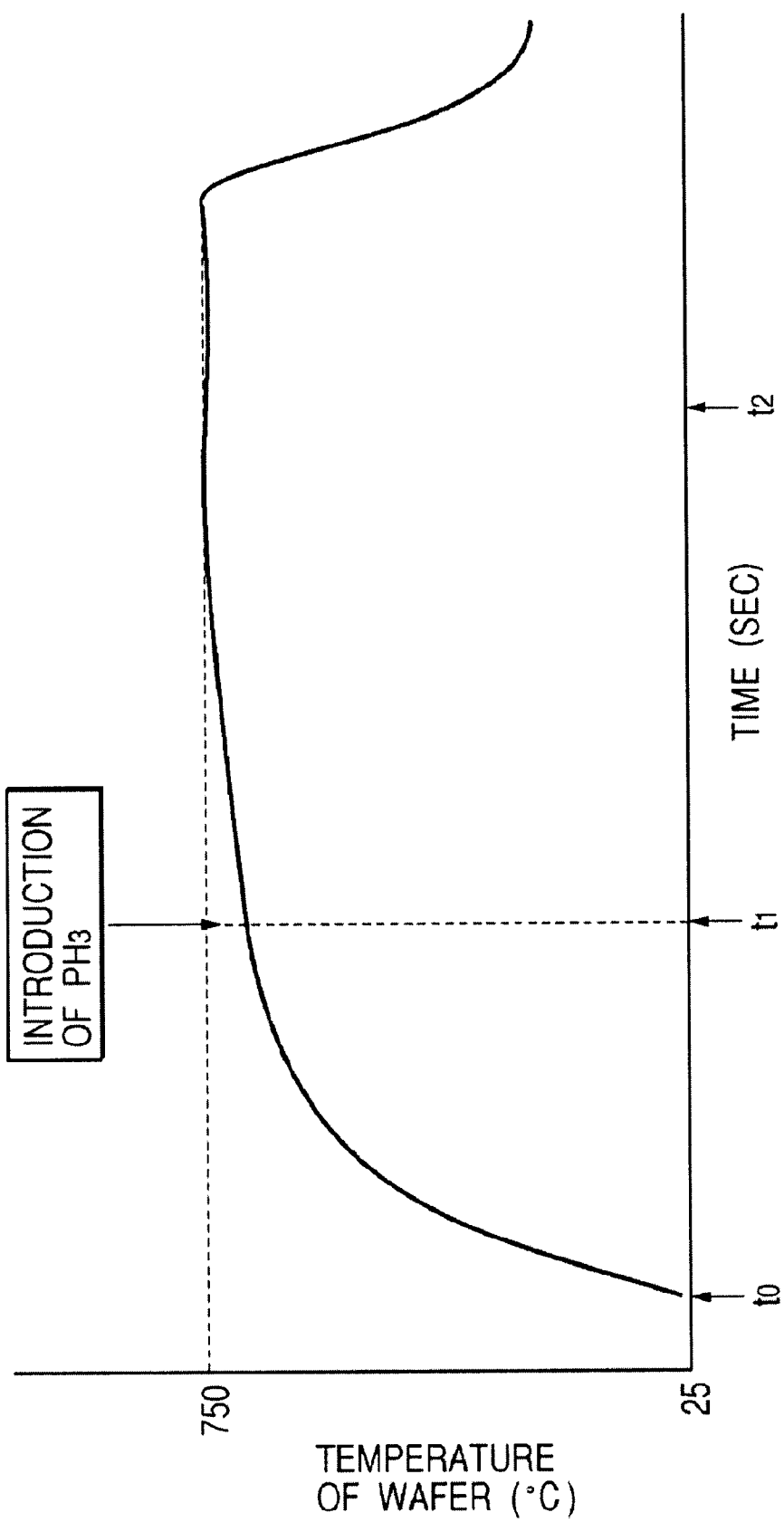
FIG. 31 is a graph illustrating feeding timing of a phosphine gas.

The timing of the introduction of the mixed gas is as shown in FIG. 31. More specifically, the wafer temperature upon introduction of the substrate 1 to the reaction chamber is room temperature (about 25° C.). Heating is started at t=t0 (wafer temperature=25° C.), whereby the temperature of the substrate 1 is increased. Until the heating time reaches t1, the atmosphere in the reaction chamber is replaced with a non-oxidizing atmosphere by purging with nitrogen while maintaining a pressure as low as about 20 Pa. During purging, the temperature continues increasing and at t=t1, the temperature of the wafer (substrate 1) is almost stabilized. The time from t1 to t0 is, for example, 175 seconds. It is also possible to carry out crystallization of the silicon film 43$a$, as described in FIG. 30, by heating of the substrate 1.

At t=t1, phosphine is introduced. At this time, feeding of nitrogen as a purge gas is terminated. The supply of the phosphine gas is continued until t reaches t2. At t=t2, the supply of phosphine is terminated, while after-purging and vacuum drawing are conducted. After purging is conducted, for example, by feeding a nitrogen gas. The time (t2−t1) for supplying the phosphine gas is for example about 245 seconds and the pressure during the supply of the phosphine gas is for example 4000 Pa.

Figure 32:
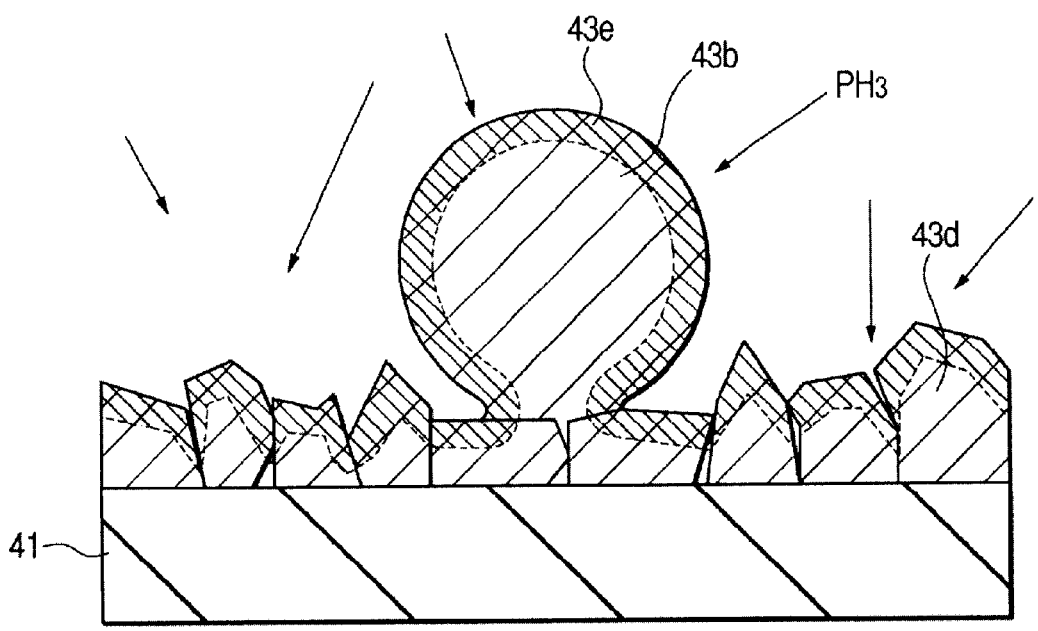
FIG. 32 is a fragmentary cross-sectional view illustrating, in the order of steps, a manufacturing method of the DRAM according to Embodiment 1.

Exposure of the silicon film 43$d$ containing the granular silicon 43$b$ to a phosphine atmosphere at a temperature as high as 700 to 750° C. causes doping of phosphorus into the granular silicon 43$b$ and silicon 43$d$ as illustrated in FIG. 32, whereby an impurity region 43$e$ having phosphorus doped thereinto at a high concentration is formed. By the formation of the impurity region 43$e$ having phosphorus doped thereinto at a high concentration, the granular silicon 43$b$ and silicon 43$d$ become free from the formation of a depletion layer therein, whereby the depletion of a capacitor lower electrode can be prevented. In this Embodiment, since the amorphous silicon film 43$a$, which is in the stage prior to the crystallization of the granular silicon 43$b$ and silicon film 43$d$, do not contain the impurity (phosphorus) at a high concentration, the depletion of the lower electrode is inevitable unless doping with phosphorus in a vapor phase as described above is conducted. This Embodiment is however free from such a problem of depletion, because doping with phosphorus is conducted in a gaseous form.

In this Embodiment, since phosphorus is doped in a vapor phase, the minutely processed granular silicon 43b and silicon film 43d are uniformly doped with phosphorus. In other words, the phosphine gas is, owing to the gas form (vapor phase), uniformly diffused even into the granular silicon 43b and silicon film 43d formed along the inner wall of the minutely processed groove 42 and also into the bottom or side wall of the groove 42, whereby phosphorus is fed to any place. Doping of phosphorus by using ion implantation, on the other hand, is impossible, because the ions are incident at an acute angle to the side wall of the groove 42. Even if implantation of sufficient ions into the side wall of the groove is tried by tilting the substrate 1, the side wall opposite thereto becomes a dead angle and prevents ion implantation. In this Embodiment, however, the phosphine gas can be supplied (carried) in any direction. Moreover, it can be diffused and transported even to the bottom of the minute groove 42, because it is in the gas form. In this Embodiment, the granular silicon 43b has been formed. If ion implantation into the thus-roughened film is tried, a dead angle appears owing to the granular silicon 43b and phosphorus is not doped to such a dead angle.

In the case of doping of phosphorus by the solid diffusion method, isotropic diffusion of an impurity can be carried out but the solid phase serving as a diffusion source must be removed after diffusion. In the case where an impurity is introduced into a roughened silicon film, it is very difficult to completely remove only the solid phase, which has served as a diffusion source, without impairing the silicon film having an enlarged surface area by roughening. In addition, since phosphorus in the solid phase generally has a lower chemical activity than phosphorus in the phosphine gas and it has a small diffusion coefficient in the solid phase, a large load by heat treatment must be necessary for the introduction of a sufficient concentration of an impurity into the silicon film. In consideration of the above-described problems, the introduction of impurities by the solid diffusion method is accompanied by difficulty. The doping of an impurity (phosphorus) in the gaseous form according to this Embodiment is therefore an excellent technique when adapted to uniform doping of the impurity into the silicon film (43b, 43d) which has been formed along the inner wall of the minutely processed groove 42 and has a roughened surface.

In the heat treatment for the above-described doping of phosphorus, low heat resistance of the silicide film 26 does not become a problem. In other words, when the doping method as described in this Embodiment is employed for introducing a sufficient density of phosphorus, it is not necessary to carry out heat treatment at a high temperature which is improper for the silicide film 26 having only a low heat resistance. The depletion is caused by shortage in an amount of an activated impurity as described above. Even if the doping amount of an impurity is small, activation of a large amount of the impurity can prevent depletion. In order to activate a large amount of an impurity, however, it is necessary to subject the impurity to activating treatment at a high temperature for long hours (ex. heat treatment at 850° C. for at least 20 minutes). Such a method cannot be used in this Embodiment wherein the silicide film 26 is employed. Even if a large amount of an impurity is introduced, it does not become a supply source of carriers unless it is activated. Doping of an impurity at a higher concentration can prevent depletion, which is adopted in this Embodiment in order to prevent depletion. According to the above-described doping method, a high concentration of an impurity (phosphorus) can be doped at a relatively low temperature (ex. 750° C.), so that low heat resistance of the silicide film 26 does not become a problem here. Even in such a high-performance and highly-integrated semiconductor device as one adopting the silicide film 26, the silicon film (43b, 43d) which will constitute a lower electrode can be doped with an impurity in an amount sufficient for preventing depletion of a capacitor. The same can be applied to the p-type gate electrode 9p which also has a problem in heat resistance.

In this manner, a polycrystalline silicon film 43 having the granular silicon 43b and silicon film 43d doped with a high concentration of an impurity (phosphorus) in a vapor phase is formed.

Figure 33:
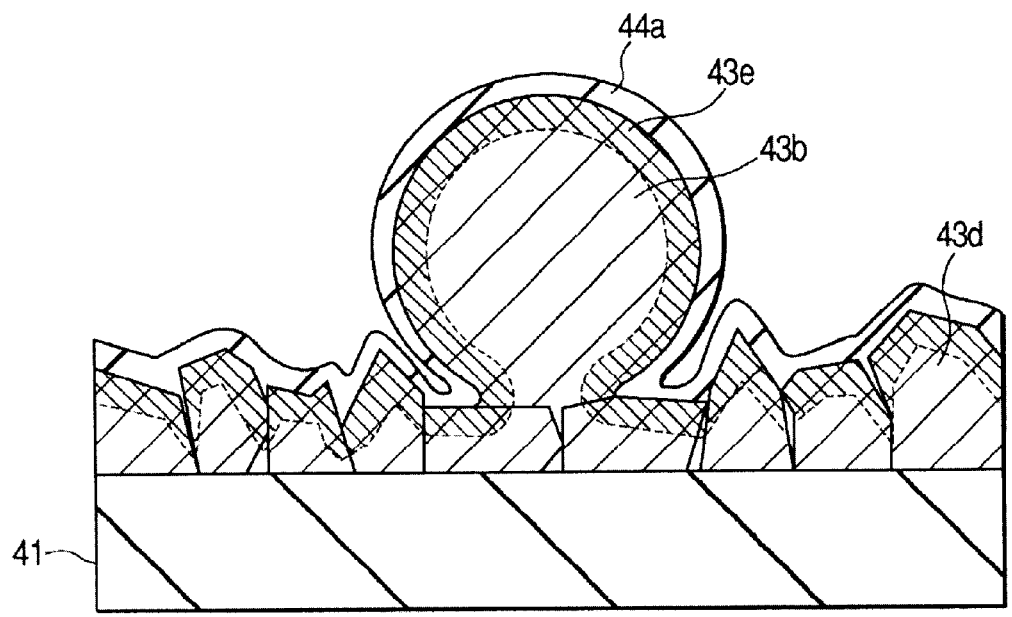
FIG. 33 is a fragmentary cross-sectional view illustrating, in the order of steps, a manufacturing method of the DRAM according to Embodiment 1.

As illustrated in FIG. 33, a silicon nitride film 44a is then formed on the polycrystalline silicon film 43. The silicon nitride film 44a is provided to partially constitute a capacitor insulating film 44. The silicon nitride film 44a can be formed by nitriding treatment of the surface of the polycrystalline silicon film 43 or by CVD. In the former case, the silicon nitride film 44 is formed by heat treatment at 750° C. for 3 minutes in an atmosphere containing ammonia ($NH_3$) and nitrogen ($N_2$). The thickness of the silicon nitride film 44a becomes about 1.5 nm.

This silicon nitride film 44a functions as an antioxidant film upon crystallization and quality improving treatment of a tantalum oxide film, which will be described later, in an oxidizing atmosphere. When the silicon nitride film 44a is expected to have such a function as an antioxidant film, it is preferably formed by nitriding treatment. By nitriding treatment, the silicon nitride film 44a is formed uniformly on the surface of the polycrystalline silicon film 43. As described above, the polycrystalline silicon film 43 has a relatively roughened surface. When the silicon nitride film is formed by CVD, its thickness differs depending on the unevenness of the surface (particularly, unevenness of the silicon film 43d), presumably becoming a factor for causing an increase of a leakage current penetrating through the capacitor insulating film. When the film is formed by nitriding treatment, on the other hand, the thickness of the silicon nitride film 44a is formed uniformly without being influenced by the surface shape of the underlying polycrystalline silicon film 43 (granular silicon 43b and silicon film 43d), which brings about effects for the control of a leakage current.

The silicon nitride film 44a is formed without breaking the reduced pressure condition after doping of phosphorus into the polycrystalline silicon film 43, in other words, without exposing it to the air. Since the silicon nitride film 44a is formed on the polycrystalline silicon film 43 without being exposed to the air, no silicon oxide film having a low dielectric constant is formed between the polycrystalline silicon film 43 and the silicon nitride film 44a. If a silicon oxide film is formed, since it has a low dielectric constant and in addition, it serves as a part of the capacitor insulating film 44, the effective thickness of the capacitor insulating film increases and a sufficient capacitance of the capacitor cannot be secured, which presumably disturbs the operation of a DRAM.

If after doping of phosphorus into the polycrystalline silicon film 43, the reduced pressure condition is broken, in other words, it is exposed to the air, a natural oxide film (silicon oxide film) is formed on the surface of it. Such a natural oxide film must be etched with hydrofluoric acid or the like because it increases the effective thickness of the capacitor insulating film. Etching, however, removes the impurity doped into the polycrystalline silicon film 43 simultaneously, which means the etching of the silicon portion of the doped region and lowering in the effects of doping with an impurity. In this Embodiment, however, the silicon nitride film 44a is formed without being exposed to the air, so that such inconveniences do not occur.

Figure 34:
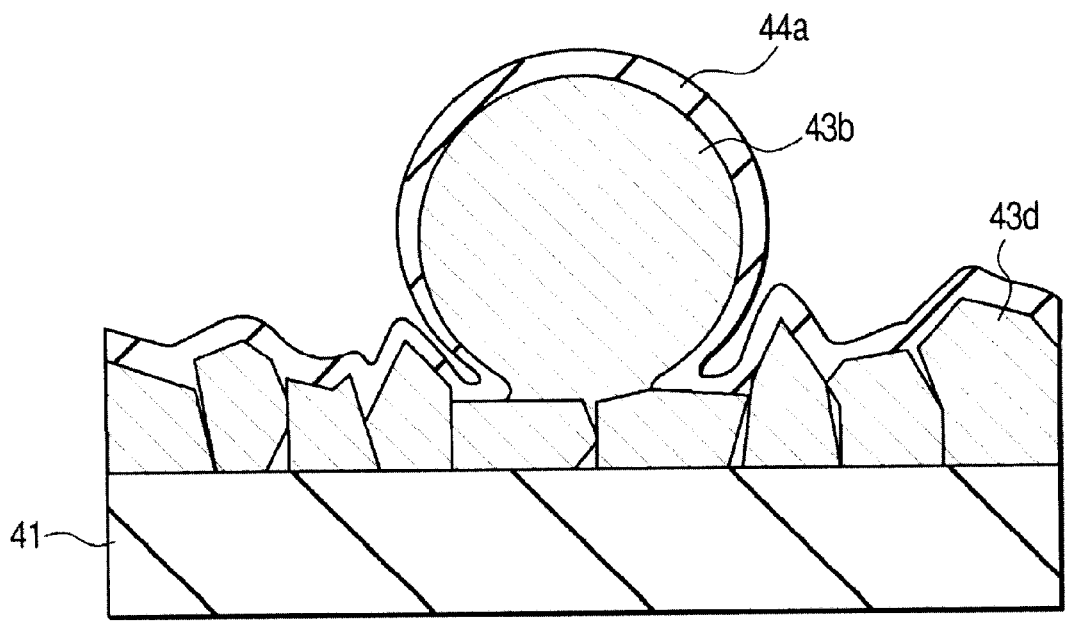
FIG. 34 is a fragmentary cross-sectional view illustrating, in the order of steps, a manufacturing method of the DRAM according to Embodiment 1.

As illustrated in FIG. 34, the substrate 1 is then heat treated to diffuse the doped impurities in the vapor phase method. The heat treatment is conducted, for example, under the conditions of 800° C. for 4 minutes so that the low heat resistance of the silicide film 26 or p-type gate electrode 9p does not become a problem. This heat treatment is also useful for the activation of the impurity (phosphorus) doped in a large amount. Activation of almost all of the impurity usually needs heat treatment at high temperatures for long hours as described above. In this Embodiment however, a large amount of the impurity has already been introduced by the vapor phase method so that heat treatment at 800° C. for about 4 minutes is enough for activation to provide the sufficient number of donors. This heat treatment is not especially necessary when the subsequent steps include a heat treating step under similar conditions. This heat treatment may be conducted prior to the formation of the silicon nitride film 44a on the assumption that the polycrystalline silicon film 43 continues to be free from exposure to the air until the silicon nitride film 44a is formed.

Figure 35:
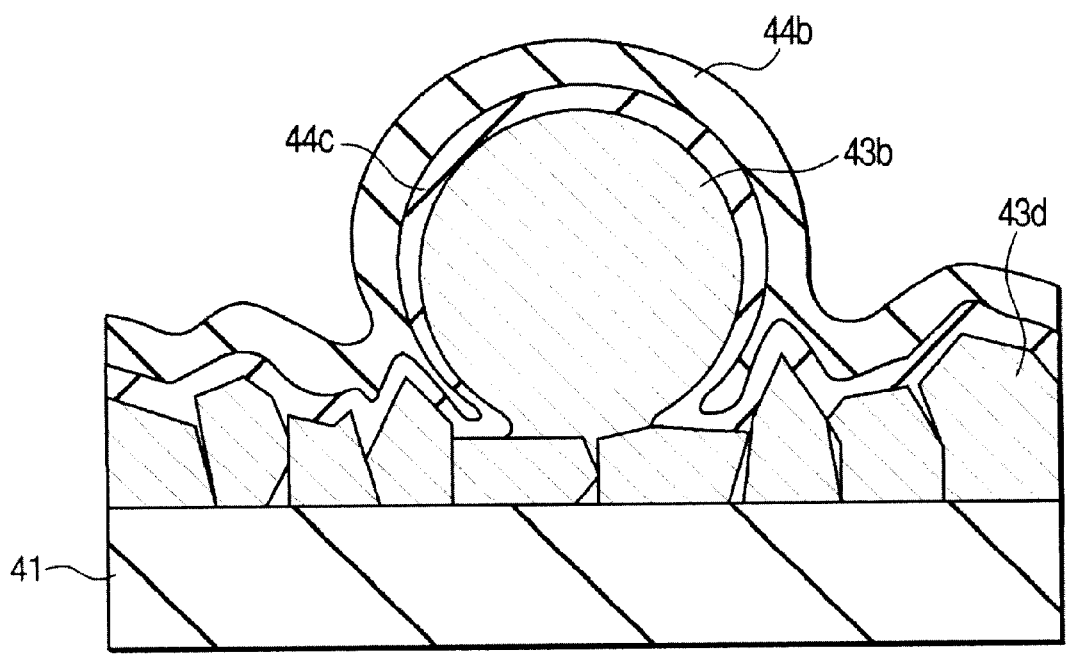
FIG. 35 is a fragmentary cross-sectional view illustrating, in the order of steps, a manufacturing method of the DRAM according to Embodiment 1.

As illustrated in FIG. 35, a tantalum oxide film is deposited all over the substrate 1, followed by heat treatment in an oxidizing atmosphere (ex. oxygen atmosphere) to form a polycrystalline tantalum oxide film 44b. The resulting polycrystalline tantalum oxide film 44b, together with the above-described silicon nitride film 44a, constitutes the capacitor insulating film 44. The polycrystalline tantalum oxide film 44b has a thickness of, for example, about 12 nm. The polycrystalline tantalum oxide film 44b has a dielectric constant as high as about 40 so that its effective thickness in terms of a silicon oxide film is several nm or less in spite of its thickness as large as about 12 nm. Therefore, it is possible to impart the capacitor with a sufficiently large capacitance value and at the same time, to prevent a tunnel current (leakage current) which is otherwise caused by a large film thickness.

The tantalum oxide film is formed, for example, by CVD using pentaethoxytantalum ($Ta(OC_2H_5)_5$) and oxygen ($O_2$) as source gases. It is formed to have, for example, a thickness of 12 nm. The temperature upon formation is suppressed to 450° C. because an organic gas is employed. Since the film is formed at a low temperature, the tantalum oxide film as deposited is amorphous. The heat treatment is therefore conducted in an oxidizing atmosphere (ex. oxygen atmosphere), because the amorphous tantalum oxide film has a dielectric constant of about 20 which is smaller than the film in the crystal form; and the leakage current is large owing to existence of many oxygen defects in the deposited state, which makes it difficult to use the film as a capacitor insulating film as it is. The heat treatment causes polycrystalline oxidation of the amorphous tantalum oxide film, and by the treatment in an oxidizing atmosphere, recovery from oxygen defects occurs, whereby a capacitor insulating film having a high dielectric constant and a reduced leakage current can be constituted. The heat treatment in an oxidizing atmosphere is conducted, for example, at 800° C. for 3 minutes. Under such heat treatment conditions, the low heat resistance of the silicide film 26 or p-type gate electrode 9p does not become a problem.

The silicon nitride film 44a serves for preventing oxygen diffusion upon the above-described heat treatment in an oxidizing atmosphere. The silicon nitride film 44a is therefore converted into a silicon oxynitride film 44c if there does not exist the silicon nitride film 44a, a silicon oxide film having a low dielectric constant is inevitably formed between the polycrystalline tantalum oxide film 44b and the underlying polycrystalline silicon film 43. Although such a silicon oxide film is thin, it increases the effective thickness of the capacitor insulating film 44 owing to its small dielectric constant, so that it is not preferred. In this Embodiment, however, the silicon nitride film 44a is formed so that no such silicon oxide film is formed and therefore, the effective thickness of the capacitor insulating film 44 can be kept thin.

Figure 36:
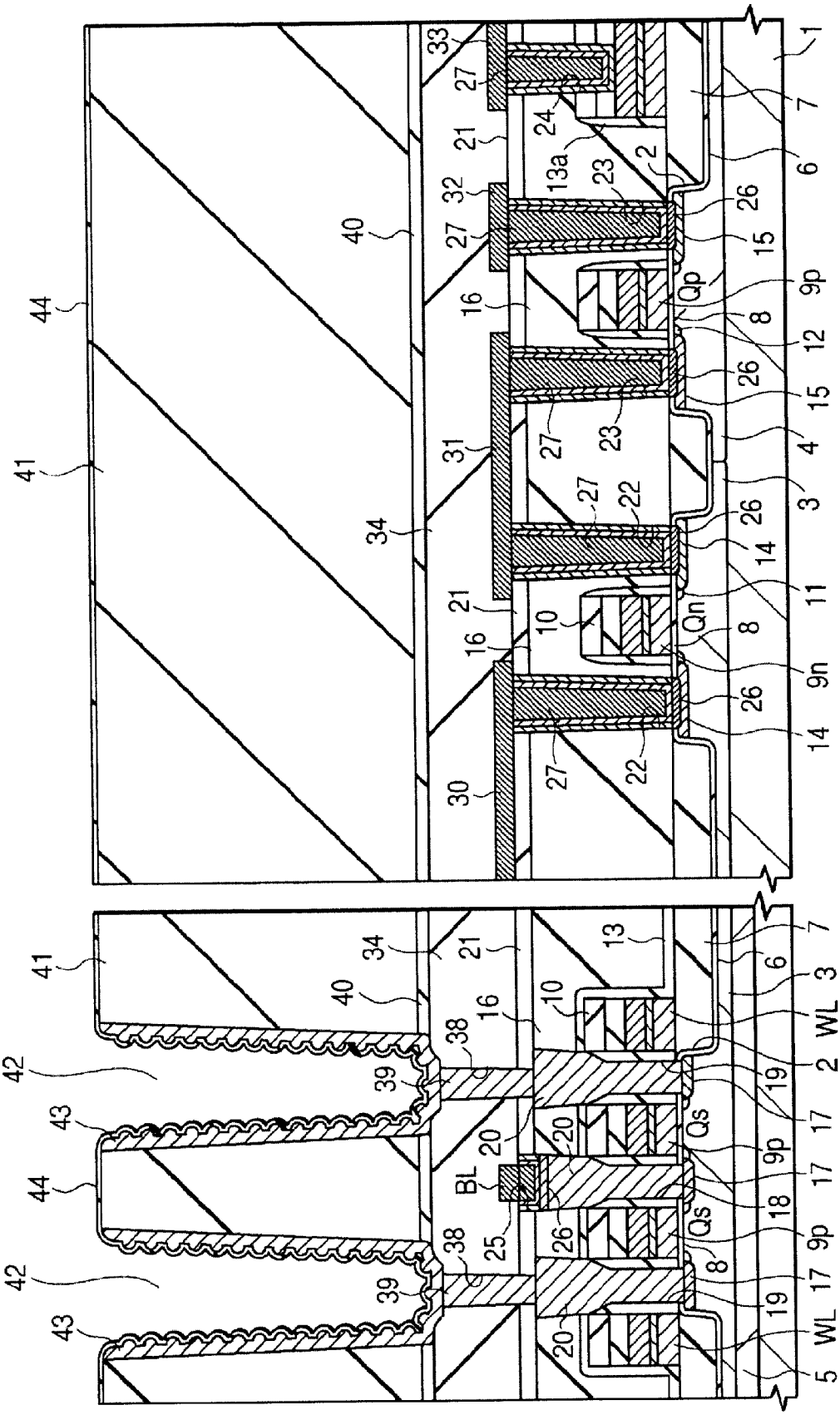
FIG. 36 is a fragmentary cross-sectional view illustrating, in the order of steps, a manufacturing method of the DRAM according to Embodiment 1.

In this manner, the capacitor insulating film 44 having the silicon oxynitride film 44c and polycrystalline tantalum oxide film 44b is formed (FIG. 36).

As illustrated in FIG. 37, an upper electrode 45 is formed over the capacitor insulating film 44. This upper electrode 45 is formed, for example, by depositing a titanium nitride film on the capacitor insulating film 44 and then patterning the titanium nitride film. The titanium nitride film is formed by CVD using, for example, titanium tetrachloride ($TiCl_4$) and ammonia ($NH_3$) as source gases. The use of CVD makes it possible to form the film while favorably embedding it in the minutely-formed groove 42. Since the titanium nitride film is formed using such source gases as described above, reaction with the polycrystalline tantalum oxide film can be suppressed, whereby capacitor characteristics can be maintained favorably.

In this manner the information storing capacitor C having the upper electrode 45, capacitor insulating film 44 and lower electrode made of polycrystalline silicon film 43 is formed. By the steps so far described, a memory cell of a DRAM comprising the memory cell selective MISFETQs and information storing capacitor C connected in series therewith is completed.

Instead of the polycrystalline tantalum oxide film 44b, the capacitor insulating film 44 may be constituted from a film composed mainly of a high dielectric film or ferroelectric film having a perovskite or complex perovskite crystal structure such as PZT, PLT, PLZT, $PbTiO_3$, $SrTiO_3$, $BaTiO_3$, BST, SBT or $Ta_2O_5$.

Over the information storing capacitor C, two Al interconnection layers are thereafter formed by the method as described below (FIG. 38). First, a silicon oxide film 50 is deposited to a thickness of about 100 nm over the information storing capacitor C by CVD. At this time, the thick silicon oxide film 41 remains in the peripheral circuit region so that the height from the surface of the substrate 1 to the surface of the silicon oxide film 50 in the memory cell array becomes substantially equal to that in the peripheral circuit region.

After formation of through-holes 51, 52 by dry etching the silicon oxide film 50, 41, silicon nitride film 40 and silicon oxide film 34 over the first interconnection layers 30, 33 using a photoresist film (not illustrated) as a mask, a plug 53 is formed in each of the through-holes 51, 52. The plug 53 is formed, for example, by depositing a TiN film of about 100 nm thick over the silicon oxide film 50 by sputtering, depositing thereover a W film of about 500 nm thick by CVD and then etching back these films to leave them inside of each of the through-holes 51, 52.

Second interconnection layers 54 to 56 are then formed over the silicon oxide film 50. These interconnections 54 to 56 are formed, for example, by depositing a TiN film of about 50 nm thick, an Al (aluminum) alloy film of about 500 nm thick and a Ti film of about 50 nm thick over the silicon oxide film 50 by sputtering and then dry etching of these films using a photoresist film (not illustrated) as a mask. The silicon oxide film 50 lying under these interconnections 54 to 56 has substantially the same height both in the memory cell array and peripheral circuit region so that the interconnections 54 to 56 can be patterned with high dimensional accuracy.

After that, it is possible to form successively a silicon oxide film over the second interconnection layers 54 to 56, a through-hole in the silicon oxide film similar to the second interconnection layers 54 to 56, a plug in the through-hole and a third interconnection layer to be connected with this plug. A further interconnection layer may be formed in a similar manner. A passivation film formed of a silicon oxide film and a silicon nitride film is then deposited, but it is not illustrated. In the steps so far described, the DRAM of this Embodiment is substantially completed.

In the DRAM according to this Embodiment, doping of an impurity at a high concentration can be conducted at a relatively low temperature because the impurity (phosphorus) is doped into the polycrystalline silicon film 43 by the vapor phase method. Even in a miniaturized and highly-integrated DRAM using the silicide film 26 or p-type gate electrode 9p, therefore, depletion of the capacitor can be prevented without adversely affecting its heat resistance.

Figure 39A:
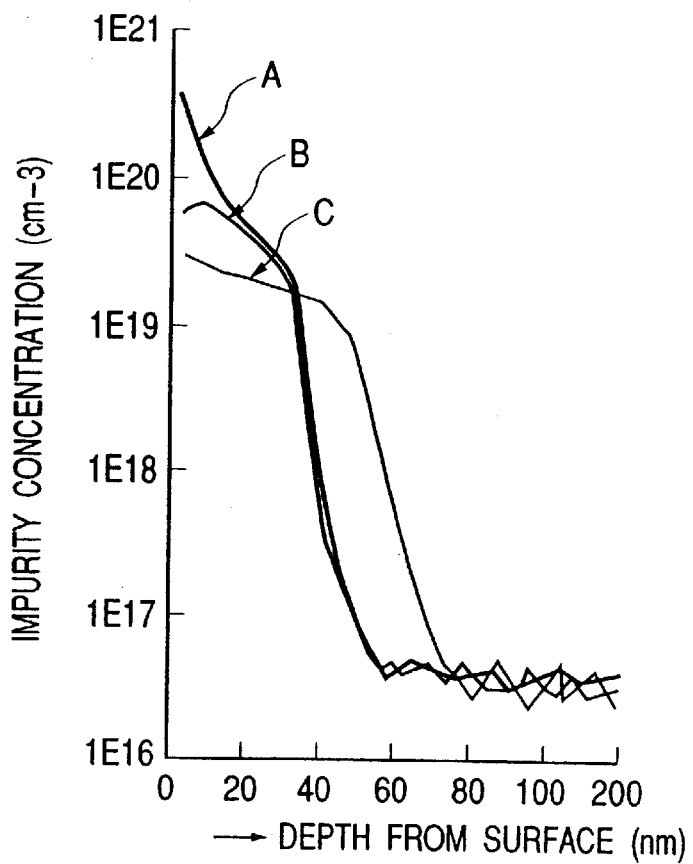
Figure 39B:
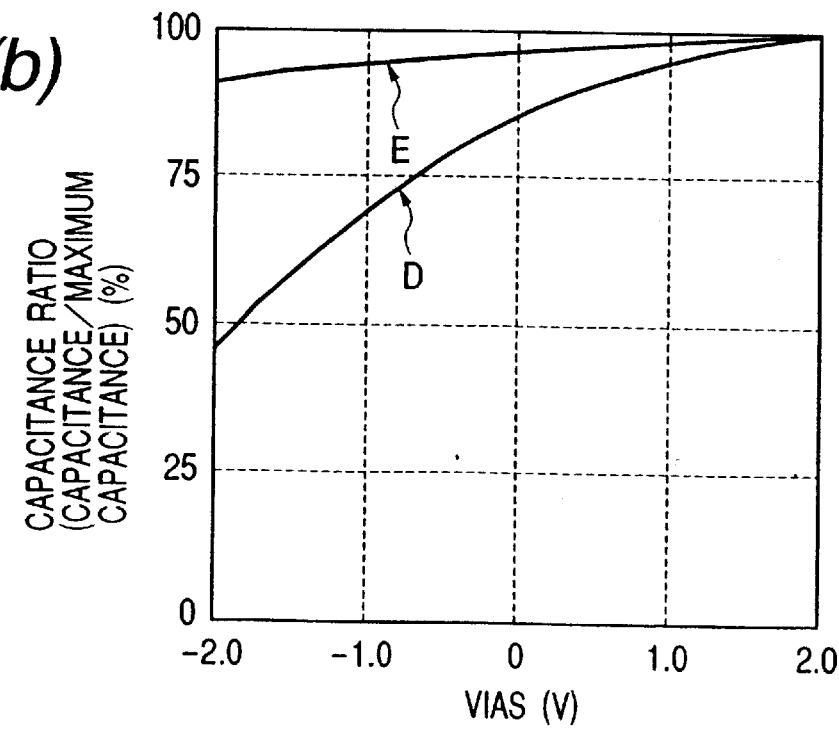

FIGS. 39(a) and 39(b) are graphs for describing the effects of the DRAM according to the present Embodiment, wherein FIG. 39(a) shows the measuring results of the concentration, in a depthwise direction, of phosphorus after doping in a vapor phase which have been obtained using SIMS (Secondary Ion Mass Spectroscopy) analysis, while FIG. 39(b) shows the measuring results of a depletion ratio of the capacitor.

In FIG. 39(a), A indicates the distribution, in the depthwise direction, of a phosphorus concentration of the polycrystalline silicon film 43 in this Embodiment. From the surface concentration of about $4 \times 10^{20}$ atoms/cm$^{-3}$, it has been found that a sufficient amount of phosphorus was doped. In this drawing, B indicates the distribution, in a depthwise direction, of a phosphorus concentration after cleaning treatment (for example, etching with hydrogen fluoride) of the polycrystalline film, which had been doped and once exposed to air, for removing a contaminant including a natural oxide film formed on the surface. It has been found that the surface concentration lowers to about $5 \times 10^{19}$ atoms/cm$^{-3}$ (about a figure down). On the other hand, C indicates the distribution, in the depthwise direction, of a phosphorus concentration of a sample having the concentration distribution of B after heat treatment at 800° C. for 6 minutes. From a further lowering in the surface concentration, it has been understood that phosphorus has been diffused even to a deeper region. As indicated by B, exposure to the air after doping in the vapor phase and addition of a surface cleaning step are not preferred, because they decrease the effects of the doping in the vapor phase. The heat treatment after surface cleaning is also not preferred, because it promotes diffusion of phosphorus into a deeper region, and permits formation of a depletion layer in a region of the polycrystalline silicon film 43 brought into contact with the capacitor insulating film 44, that is, the surface region of the polycrystalline silicon film 43, thereby causing lowering in the impurity concentration in this region. This does not apply to the case where the activation ratio of phosphorus increases by the heat treatment and a lowering in the concentration can be compensated.

In FIG. 39(b), E indicates the depletion ratio of the capacitor of this Embodiment, while D indicates, for comparison, the depletion ratio when different from this Embodiment, doping in the vapor phase is not conducted. As described above, a depletion ratio is defined by a decrease of the capacitance $C^-$ at the bias voltage of $-1V$ from the capacitance $C^+$ at the bias voltage of $+1V$ (depletion ratio $R=1-C^-/C^+$). The term "bias voltage" as used herein means a voltage to be applied to the side of the upper electrode while the lower electrode side is coupled to the ground. When the lower electrode which is an n-type semiconductor is minus biased, a depletion region is more or less formed in the lower electrode. The depletion ratio is therefore observed as a value not less than 0. In FIG. 39(b), the capacitance ratio ($C^-/C^+$) is shown at varied bias voltages. The depletion ratio can be read as a decrease from 100%.

As illustrated in this drawing, it has been found that the capacitor (E) in this Embodiment has a depletion ratio not greater than 10%, showing a marked improvement compared with a depletion ratio, about 30%, of the capacitor (D) of comparative example.

Instead of the polycrystalline tantalum oxide film 44b, a silicon nitride film of about 8 nm thick can be employed. In this case, the silicon nitride film 44a formed by the thermal nitriding method is not necessary and the silicon nitride film is deposited on the polycrystalline silicon film 43 by CVD. In other words, the capacitor insulating film 44 can be constituted by a single layer of a silicon nitride film. For the deposition of the silicon nitride film, dichlorosilane (SiH$_2$Cl$_2$) and ammonia are employed, for example, as source gases. The film can be formed, for example, at 730° C. As described above, such a temperature does not have an influence on heat resistance.

Figure 40:
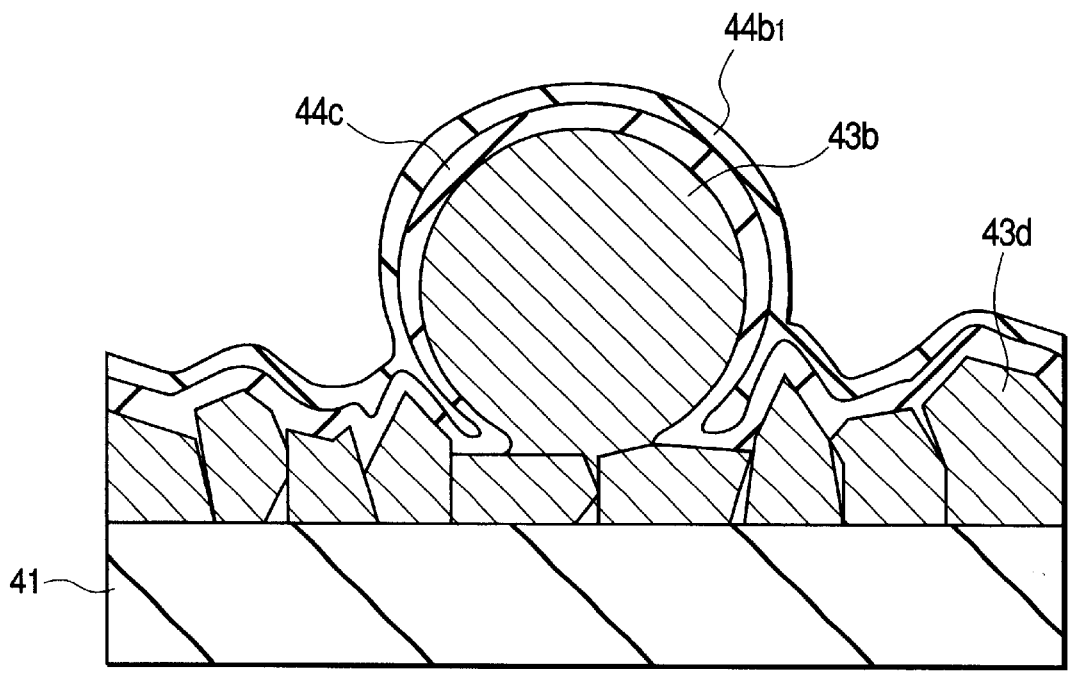
FIG. 40 is a fragmentary cross-sectional view illustrating, in the order of steps, a manufacturing method of the DRAM according to Embodiment 1 of the present invention.
Figure 41:
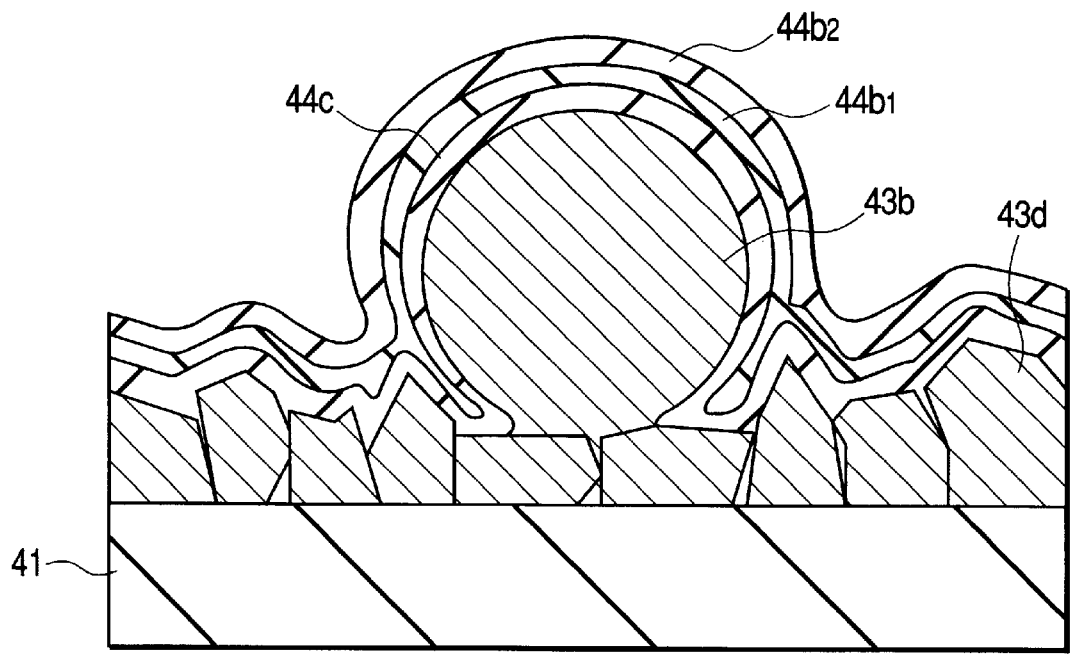
FIG. 41 is a fragmentary cross-sectional view illustrating, in the order of steps, another manufacturing method of the DRAM according to Embodiment 1 of the present invention.

As illustrated in FIGS. 40 and 41, a two-layer film composed of a first polycrystalline tantalum oxide film 44b1 and a second polycrystalline tantalum oxide film 44b2 can be substituted for the polycrystalline tantalum oxide film 44b.

First, the silicon nitride film 44a is formed on the polycrystalline silicon film 43 by the thermal nitriding method as described above. An amorphous tantalum oxide film is deposited to a thickness not greater than half (ex. 6 nm) of the target film thickness of the polycrystalline silicon film, followed by heat treatment in an oxidizing atmosphere as described above (FIG. 40). At this time, the silicon nitride film 44a is converted into the silicon oxynitride film 44c, while the amorphous tantalum oxide film is crystallized into the first polycrystalline tantalum oxide film 44b1. The heat treatment is conducted, for example, at 800° C. for 3 minutes.

As illustrated in FIG. 41, an amorphous tantalum oxide film (ex. 6 nm) is formed on the first polycrystalline tantalum oxide film 44b1 to give the target film thickness of the polycrystalline tantalum oxide film, followed by heat treatment in an oxidizing atmosphere similarly, whereby the second polycrystalline tantalum oxide film 44b2 is formed. The heat treatment is conducted, for example, at 800° C. for 3 minutes. The steps thereafter are similar to the above-described ones.

The formation of the polycrystalline tantalum oxide film 44b from two layers makes it possible to control a leakage current of the capacitor insulating film 44. More specifically, since the polycrystalline tantalum oxide film 44b has a polycrystalline structure, the leakage current passing through the polycrystalline tantalum oxide film 44b tends to occur through the grain boundary of crystal grains.

In short, the crystal grain boundary tends to act as a leakage path. The polycrystalline tantalum oxide film 44b formed from two layers can however divide the crystal grain boundary in a film-thickness direction, thereby preventing the formation of a leakage path, whereby the leakage current between the capacitor insulating films 44 can be reduced.

Since the first polycrystalline tantalum oxide film 44b1 is thinner than the polycrystalline tantalum oxide film used as a single layer, the load upon heat treatment for the formation of the first polycrystalline tantalum oxide film 44b1 can be reduced. In addition, although a tantalum oxide film is formed on the first polycrystalline tantalum oxide film 44b1 under the conditions adopted essentially for film formation in the amorphous form, a kind of epitaxial growth occurs owing to the underlying film (first polycrystalline tantalum oxide film 44b1) which has already been crystallized and the tantalum oxide film is formed after crystallization to some extent in the as deposited form. This makes it possible to reduce the load upon heat treatment for the formation of the second polycrystalline tantalum oxide film 44b2.

When the polycrystalline tantalum oxide film 44b is formed from two layers, the total heat treating time happens to increase. In such a case, the activation ratio of an impurity introduced into the polycrystalline silicon film 43 serving as a lower electrode is improved, whereby the depletion ratio can be reduced.

In this Embodiment, doping in the vapor phase is carried out at 750° C. It is also possible to carry out doping of phosphorus at about 800° C. in the vapor phase and the diffusion treatment (heat treatment at 800° C. for 4 minutes) subsequent thereto may be omitted.

Figure 42:
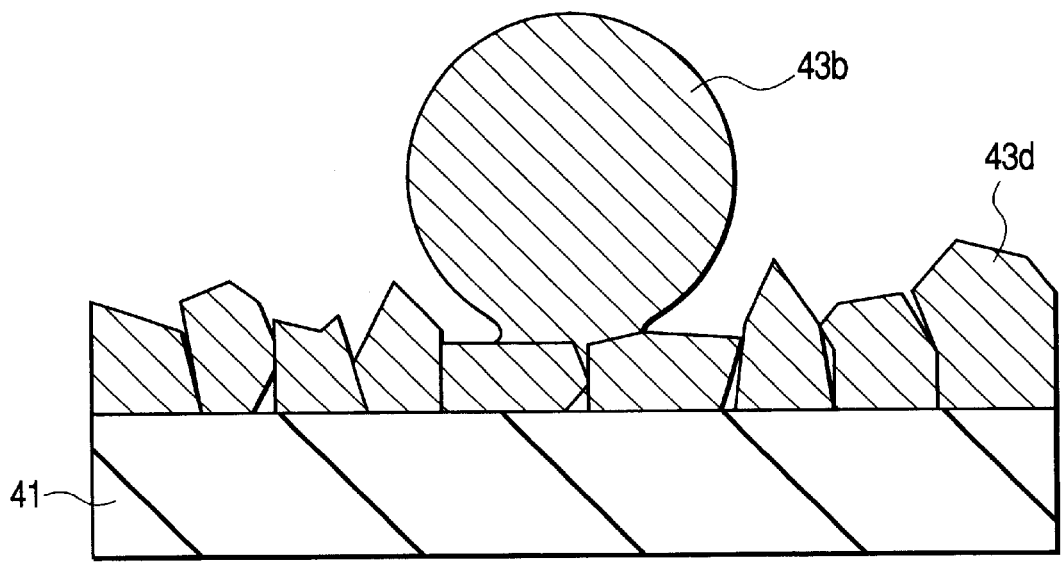
FIG. 42 is a fragmentary cross-sectional view illustrating a manufacturing method of a DRAM according to Embodiment 2 of the present invention.
Figure 43:
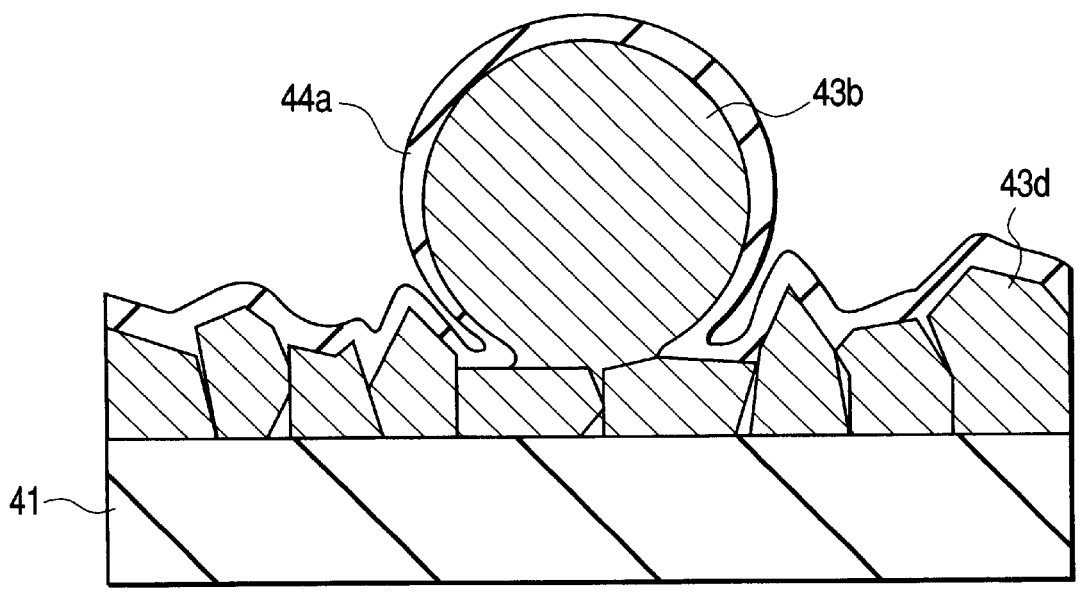
FIG. 43 is a fragmentary cross-sectional view illustrating a manufacturing method of the DRAM according to Embodiment 2.

FIGS. 42 and 43 are each a fragmentary cross-sectional view illustrating a manufacturing step of the DRAM according to Embodiment 2 of the present invention. FIGS. 42 and 43 are enlarged views of a portion corresponding to A of FIG. 26 in Embodiment 1.

The manufacturing method of this Embodiment is similar to that of Embodiment 1 until the step shown in FIG. 32. After that, in this Embodiment, the substrate 1 is annealed to diffuse the phosphorus, which has been introduced by the vapor phase method. Phosphorus in the impurity region 43e is diffused, whereby the whole region of the granular silicon 43b and silicon film 43d contain the impurity at a high concentration. By this diffusion, uneven distribution of impurities at least in the vicinity of the surfaces of the granular silicon 43b and silicon film 43d can be dissolved. The annealing can be conducted, for example, at 800° C. for 4 minutes.

As illustrated in FIG. 43, a silicon nitride film 44a is then formed as in Embodiment 1. This silicon nitride film 44a is formed without breaking the reduced pressure condition. Steps subsequent thereto are similar to those of Embodiment 1.

In this Embodiment, annealing for diffusing phosphorus is conducted prior to the formation of the silicon nitride film 44a. It increases a total thermal load and heightens the probability of the activation of phosphorus, thereby contributing to the suppression of depletion of the capacitor.

Figure 44:
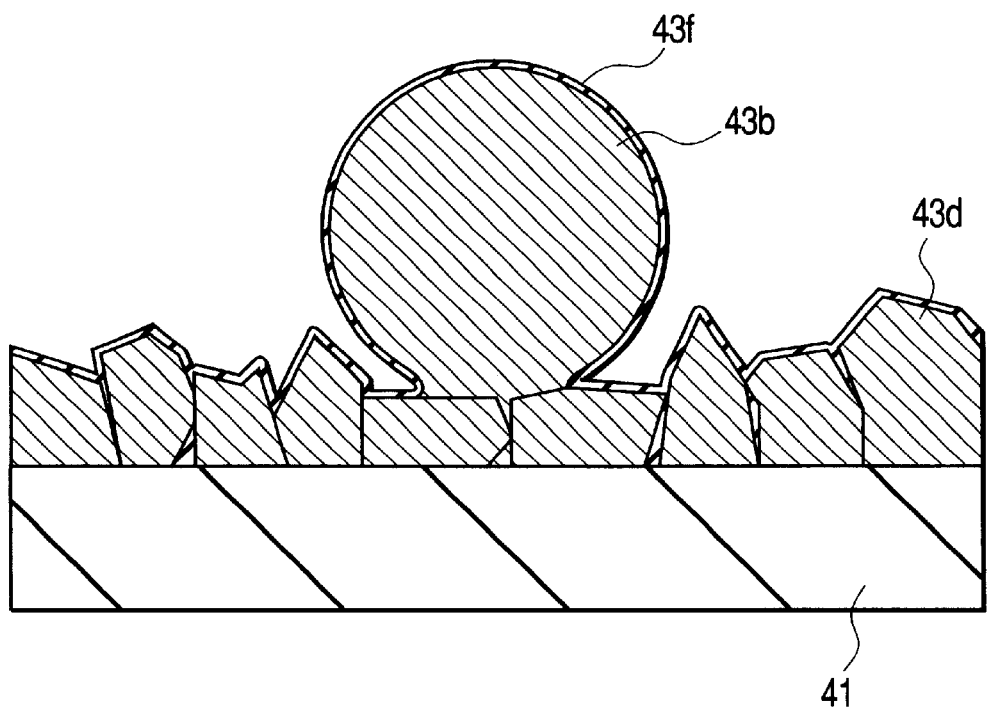
FIG. 44 is a fragmentary cross-sectional view illustrating another manufacturing method of the DRAM according to Embodiment 2.
Figure 45:
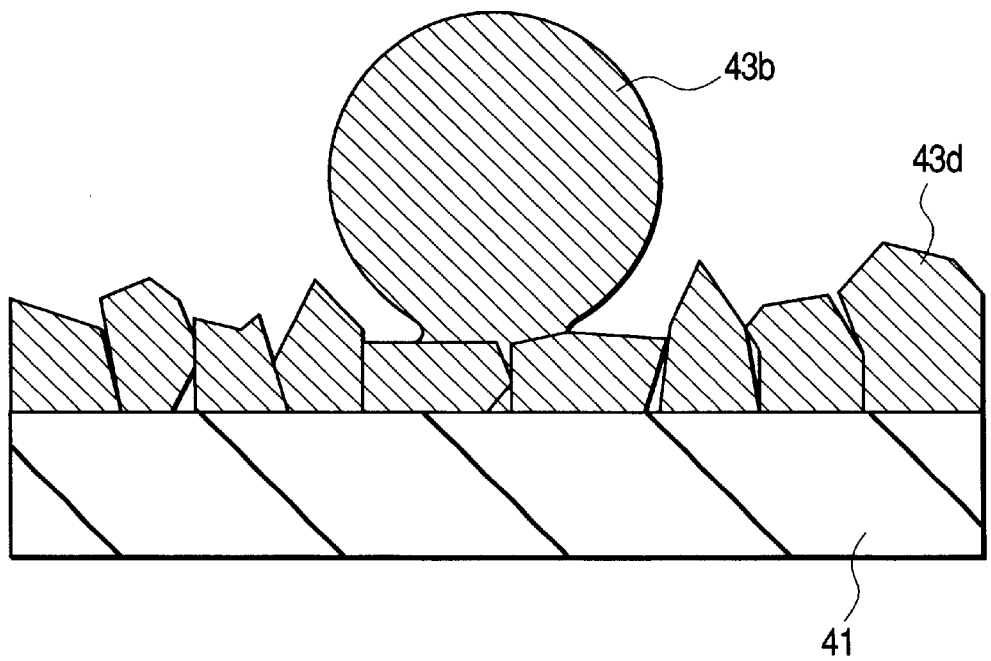
FIG. 45 is a fragmentary cross-sectional view illustrating the another manufacturing method of the DRAM according to Embodiment 2.

When phosphorus is diffused by heat treatment as in this Embodiment, the substrate 1 may be exposed to the air before or after this heat treatment for diffusing phosphorus. In this case, as illustrated in FIG. 44, a natural oxide film 43f is formed on the surfaces of the granular silicon 43b and silicon film 43d. This natural oxide film 43f is not preferred, because it markedly increases the effective thickness of the capacitor insulating film as described above. It is therefore necessary to remove the natural oxide film 43f, as illustrated in FIG. 45, by wet etching with hydrofluoric acid or the like.

In Embodiment 1, removal of the natural oxide film formed in this stage is not preferred, because it is accompanied with etching of the silicon region including the impurity introduced by the vapor phase method, thereby decreasing the effects of doping in the vapor phase. In the present Embodiment, however, the impurity doped in the vapor phase has been diffused and therefore is not unevenly distributed on the surface so that wet etching does not deteriorate the effects of doping so much. In this Embodiment, therefore, it is possible to expose the substrate to the air after doping in the vapor phase, followed by the formation of the capacitor insulating film 44. Although the doping step and the capacitor-insulating-film forming step are preferably carried out continuously without exposing the substrate to the air between these steps in order to avoid formation of a silicon oxide film between the granular silicon 43b or silicon film 43d, and the capacitor insulating film 44, the process which does not always require continuous treatment is advantageous, because it allows some latitude in step designing suitable for a mass production process. This Embodiment is effective for satisfying such a request.

It is needless to say that the polycrystalline tantalum oxide film having a two layer structure as described in the last part of Embodiment 1 or a single layer structure of the silicon nitride film can be applied to the capacitor insulating film.

FIGS. 46 to 49 are fragmentary cross-sectional views each illustrating a manufacturing process of the DRAM according to Embodiment 3 of the present invention. FIGS. 46 to 49 are enlarged views of a portion corresponding to A of FIG. 26 in Embodiment 1.

The manufacturing method of this Embodiment is similar to Embodiment 1 until the steps illustrated in FIG. 29.

Figure 46:
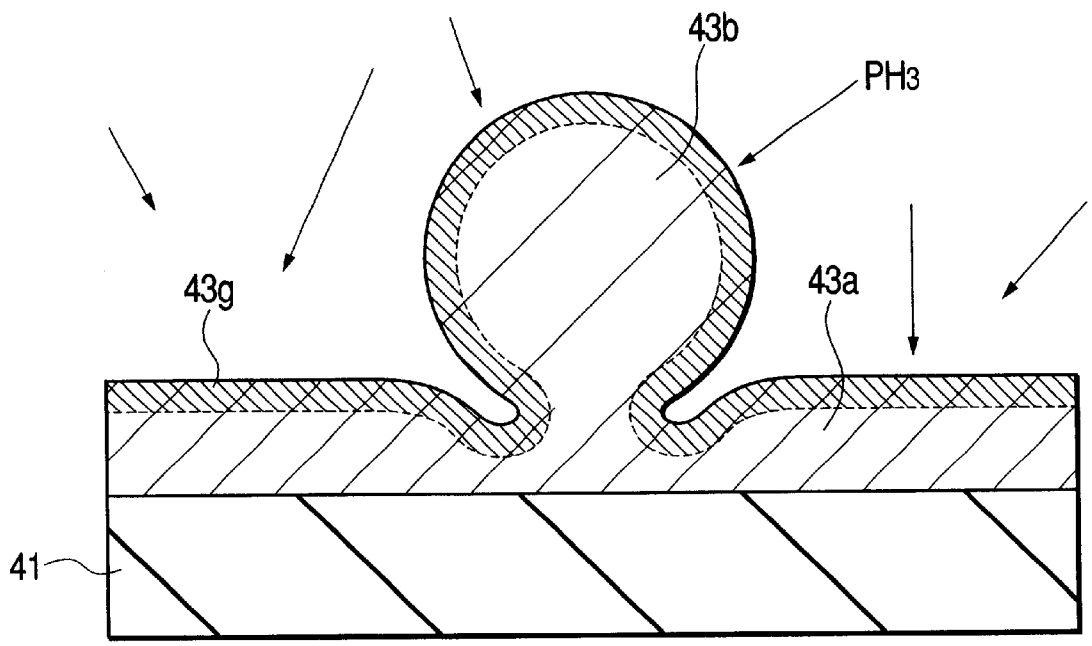
FIG. 46 is a fragmentary cross-sectional view illustrating a manufacturing method of a DRAM according to Embodiment 3 of the present invention.
Figure 50:
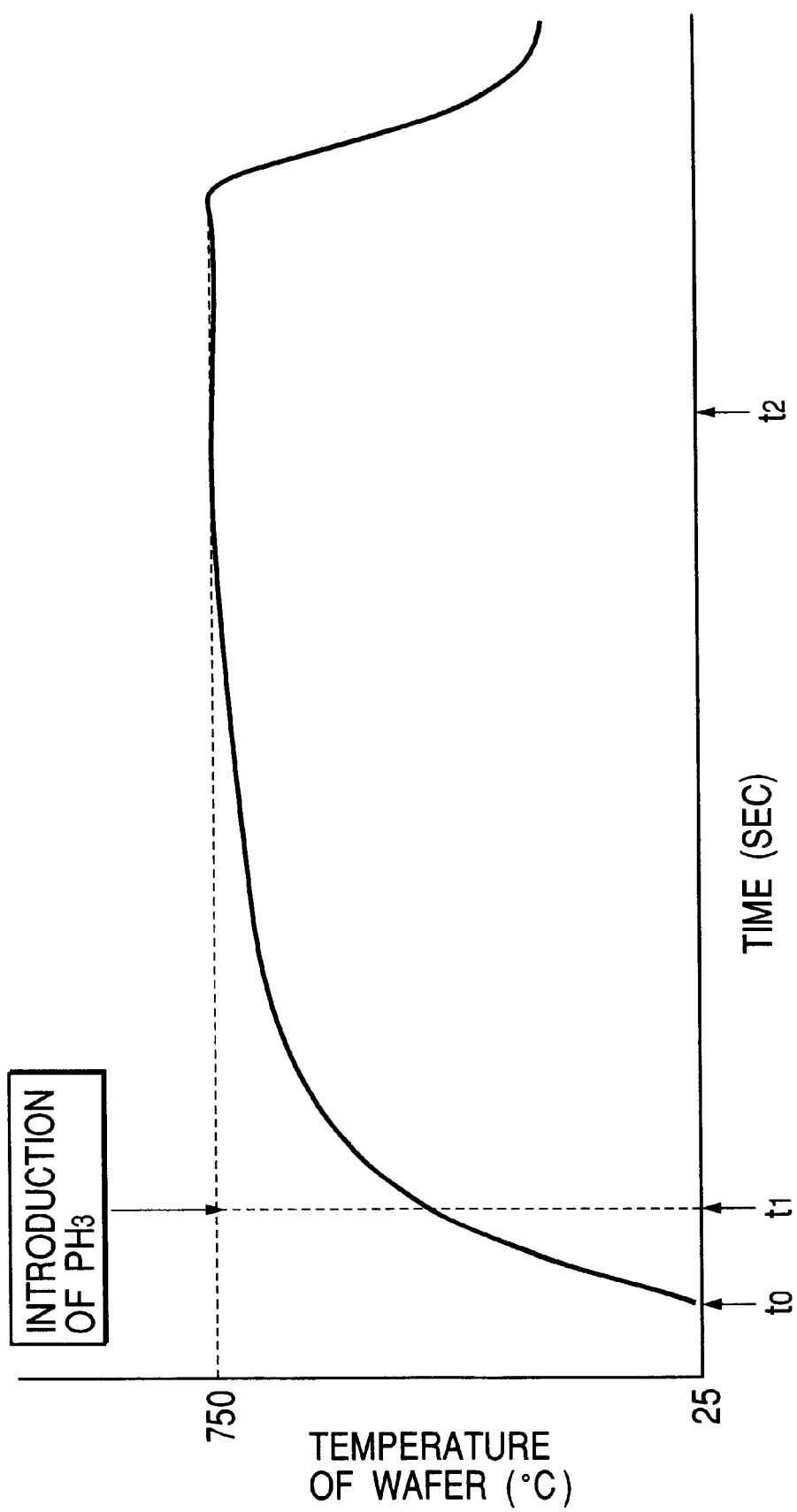
FIG. 50 is a graph illustrating the feeding timing of a phosphine gas.

As illustrated in FIG. 46, doping in the vapor phase is then carried out as in Embodiment 1. As opposed to the doping of an impurity (phosphorus) after crystallization of the silicon film 43a as described in Embodiment 1, doping in this Embodiment is carried out in the vapor phase when the silicon film 43a is still in the stage of not a crystallized form but an amorphous form, whereby an impurity region 43a is formed. More specifically, as illustrated in FIG. 50, introduction of phosphine is started at t1' when the temperature of the wafer has not yet reached a sufficient level. The time from t1' to t0 is, for example, 25 seconds. At t1', the silicon film 43a has not been crystallized yet and is in the amorphous form. After t1', introduction of phosphine is continued, while the temperature of the substrate 1 increases and is saturated at 750° C. At t2 (t2−t1=390 seconds), the introduction of phosphine is terminated and purging is started. The other doping conditions of phosphorus are similar to those of Embodiment 1.

Figure 47:
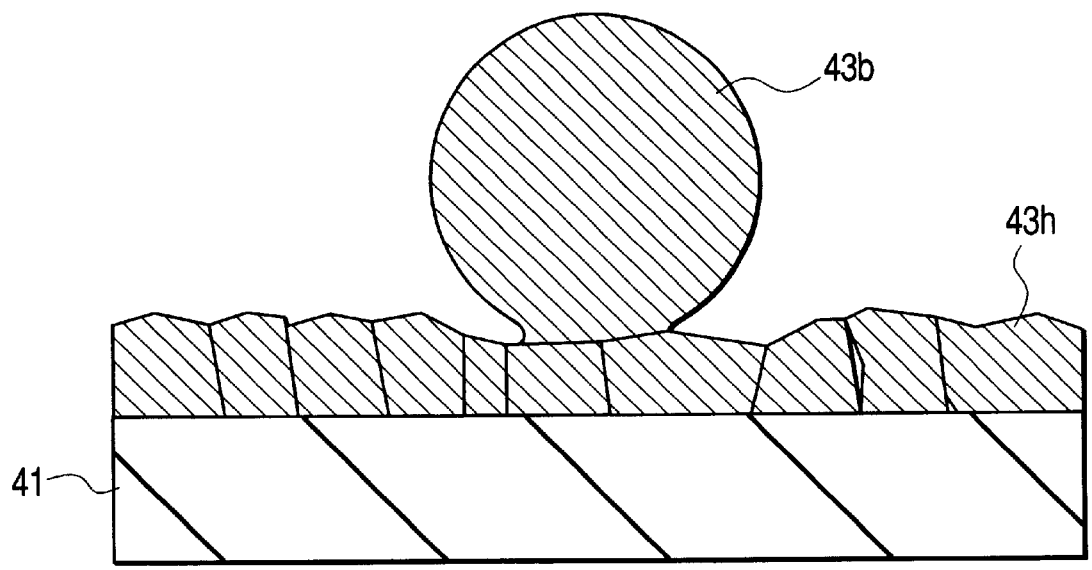
FIG. 47 is a fragmentary cross-sectional view illustrating a manufacturing method of the DRAM according to Embodiment 3.
Figure 48:
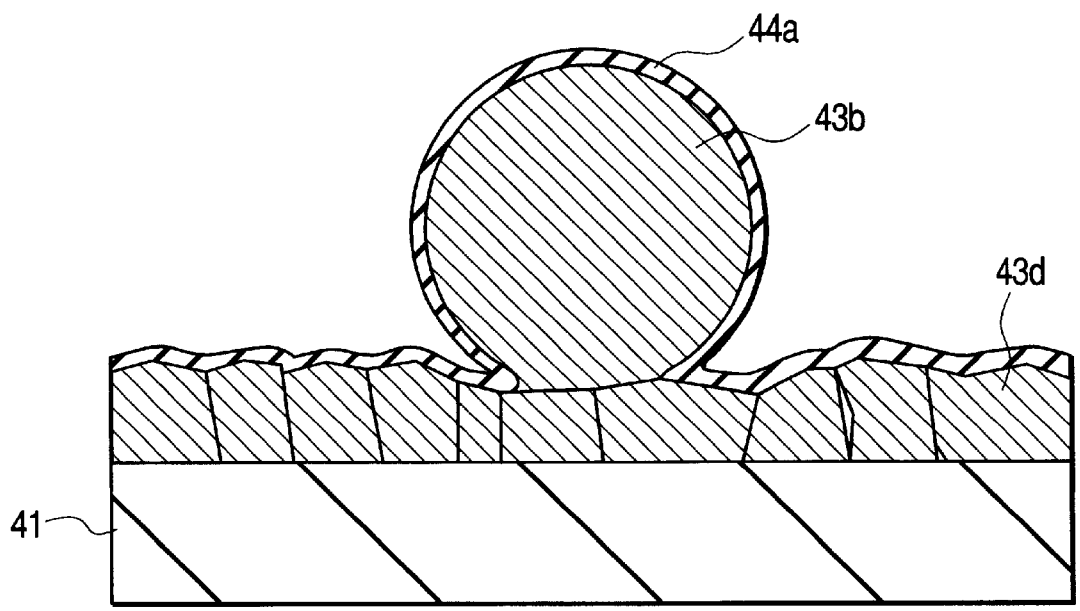
FIG. 48 is a fragmentary cross-sectional view illustrating a manufacturing method of the DRAM according to Embodiment 3.
Figure 49:
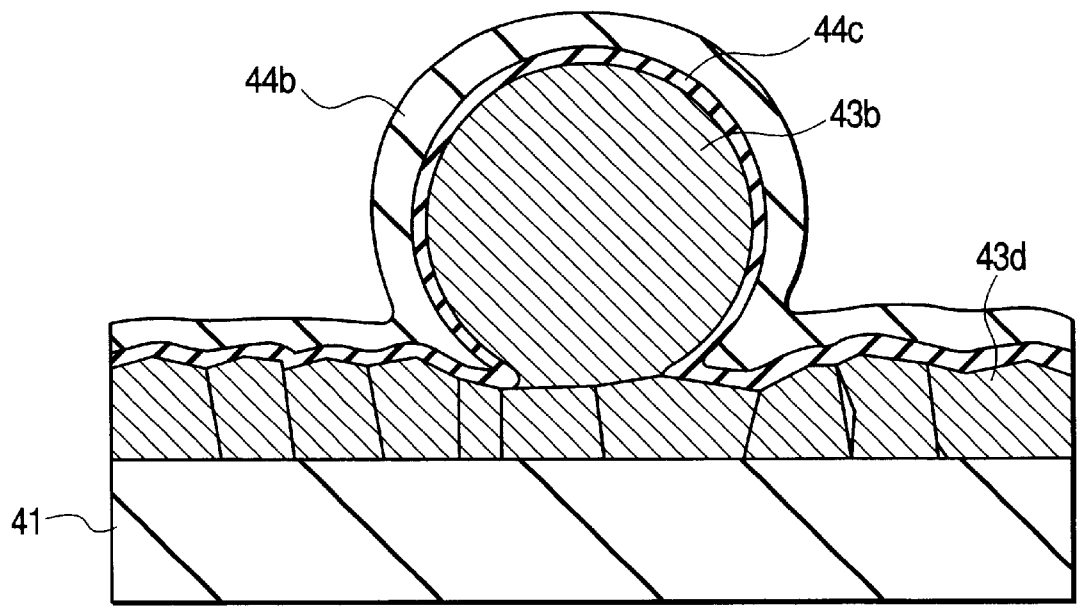
FIG. 49 is a fragmentary cross-sectional view illustrating a manufacturing method of the DRAM according to Embodiment 3.

By doping phosphorus under such conditions, the surface of the silicon film 43h which is a crystallized portion of the silicon film 43a is flattened. Since the impurity region 43g containing phosphorus at a high concentration has already been formed at the time of crystallization of the silicon film 43a, the silicon film 43a is crystallized in an accelerated way while having small unevenness on its surface. FIG. 47 illustrates the granular silicon 43b and silicon film 43h, almost whole of which has an increased impurity concentration by diffusion of the impurity region 43g.

A silicon nitride film 44a is then formed (FIG. 48) in a similar manner to Embodiment 1, followed by the formation of a polycrystalline tantalum oxide film 44b. The silicon nitride film 44a is converted into a silicon oxynitride film 44c.

By introducing an impurity into the silicon film 43a which is still in the amorphous form, a larger amount of the impurity can be doped into the silicon film 43a. According to the study of the present inventors, the amount of the impurity introduced by doping in the vapor phase is larger in the amorphous form than in the polycrystalline form. Accordingly, the impurity in an amount equal to that in Embodiment 1 is doped into the granular silicon 43b, while a doping amount into the silicon film 43a is larger than that in Embodiment 1. Compared with Embodiment 1, a larger amount of the impurity can be doped in this Embodiment under the same heat treatment conditions, whereby a depletion ratio of the capacitor can be reduced.

The surface of the polycrystalline silicon film 43h obtained by crystallization of the silicon film 43a has less unevenness than that in Embodiment 1. It is therefore possible to relax the electric field concentration of the silicon oxynitride film 44c and polycrystalline tantalum oxide film 44b, thereby reducing a leakage current between the capacitor insulating films 44.

Figure 51:
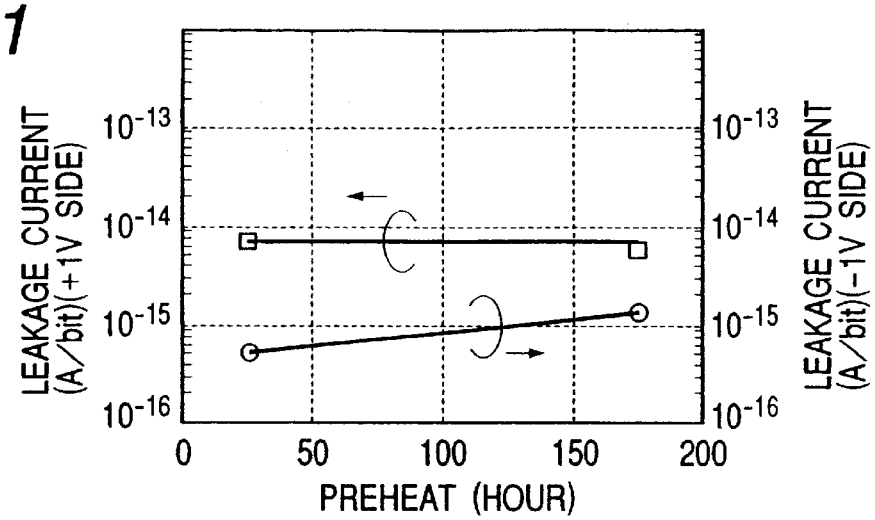
FIG. 51 is a graph illustrating a preheating-time-dependent change in a leakage current upon doping of phosphorus in a gas phase.
Figure 52:
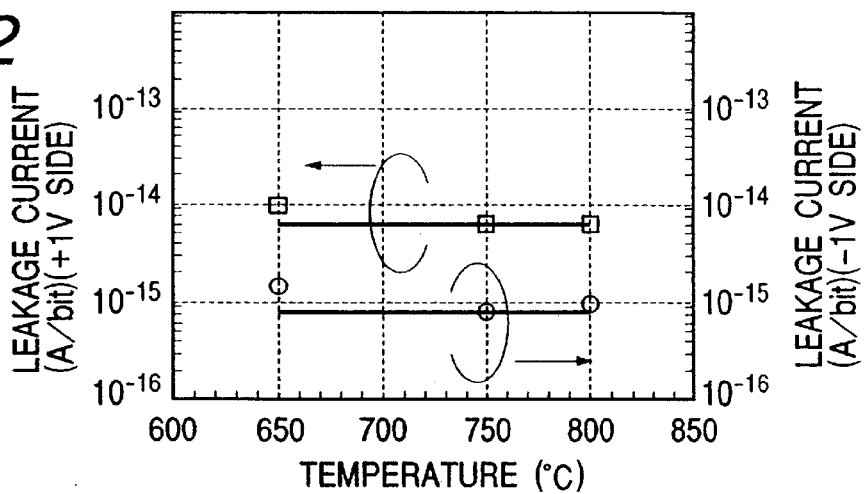
FIG. 52 is a graph illustrating a treating-temperature-dependent change in a leakage current upon doping of phosphorus in a gas phase.
Figure 53:
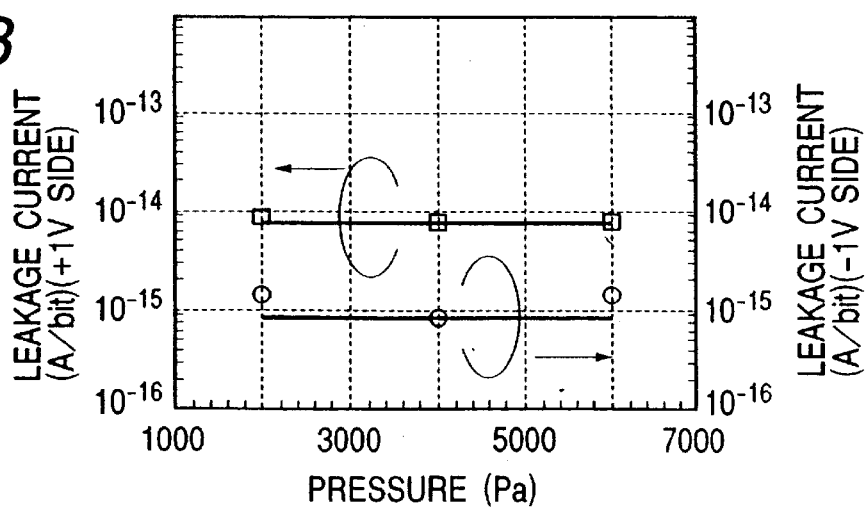
FIG. 53 is a graph illustrating a treating-pressure-dependent change in a leakage current upon doping of phosphorus in a vapor phase.

FIGS. 51 to 53 are graphs showing the leakage current when conditions (preheating time (FIG. 51)), treating temperature (FIG. 52) and treating pressure (FIG. 53)) are changed, respectively, upon doping of phosphorus in a vapor phase and in each of the graphs, the leakage currents in plus bias (scale on the left side) and in minus bias (scale on the right side) are shown. As is apparent from FIGS. 51 to 53, no large difference is observed even if the treating time or treating pressure is changed. A marked difference appears in the leakage current in the case of a minus bias when the preheating time is changed. The leakage current when preheating is conducted for 25 seconds corresponds to this Embodiment, while that when preheating is conducted for 175 seconds corresponds to Embodiment 1. The present Embodiment is therefore effective for largely reducing a leakage current, particularly that in the case of a minus bias.

In this Embodiment, it is needless to say that a two-layer polycrystalline tantalum oxide film as described in the final stage of Embodiment 1 or a single layer structure of a silicon nitride film can be applied to the capacitor insulating film.

Figure 54:
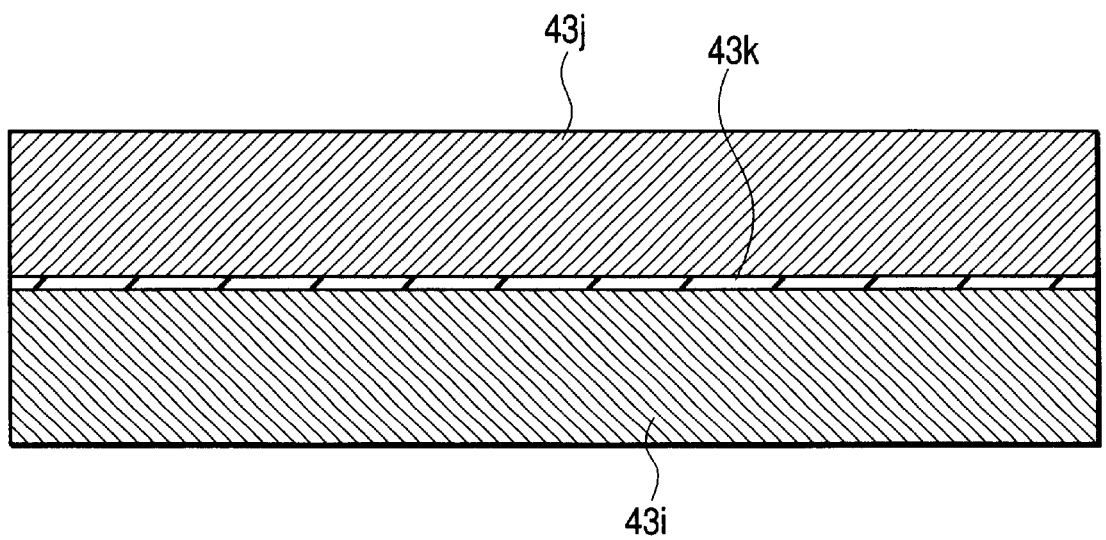
FIG. 54 is a fragmentary cross-sectional view illustrating a manufacturing method of a DRAM according to Embodiment 4 of the present invention.
Figure 55:
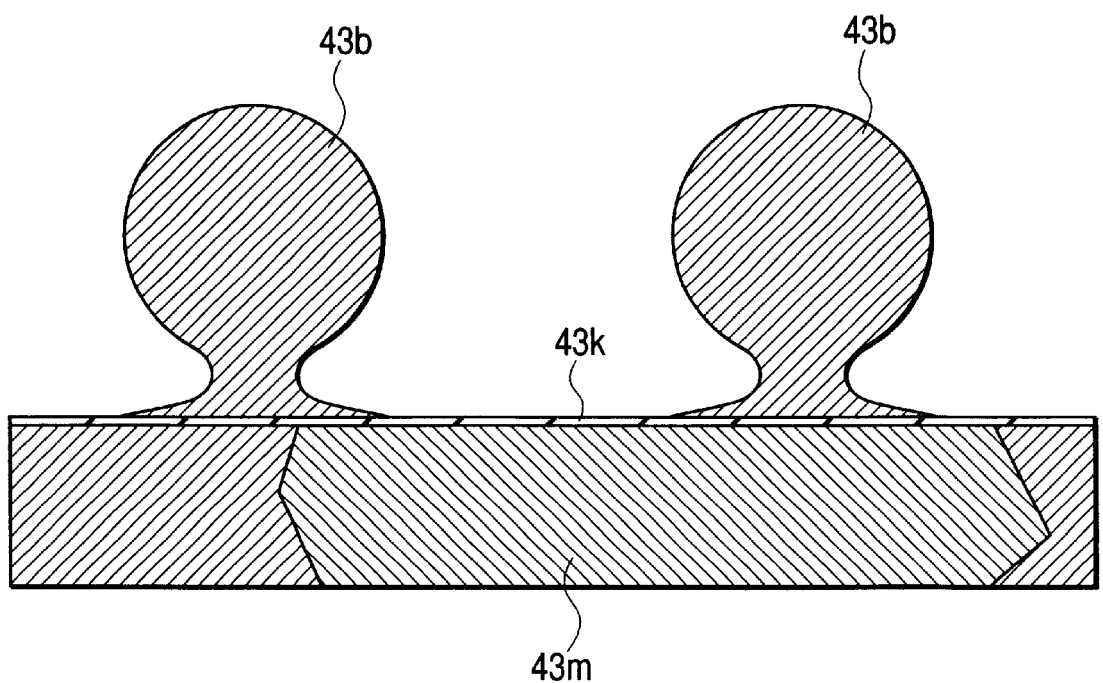
FIG. 55 is a fragmentary cross-sectional view illustrating a manufacturing method of the DRAM according to Embodiment 4.

FIGS. 54 and 55 are fragmentary cross-sectional views each illustrating a manufacturing step of the DRAM according to Embodiment 4 of the present invention. They are enlarged views of a portion corresponding to A of FIG. 26 of Embodiment 1, but an underlying silicon oxide film 41 is omitted.

A polycrystalline silicon film 43 (lower electrode) according to this Embodiment is formed of a two-layer silicon film.

After the step of FIG. 24 of Embodiment 1, a first amorphous silicon film 43i is deposited as shown in FIG. 54. This amorphous silicon film 43i is formed by deposition by CVD to have a thickness of 30 nm. Into this amorphous silicon film 43i, phosphorus (P) is introduced at a concentration of about $4.0 \times 10^{20}$ atoms/cm$^3$. Upon deposition of the amorphous silicon film 43i by CVD, phosphine (PH$_3$) mixed in a raw material gas can be introduced as an impurity gas to effect the introduction of phosphorus. As will be described later, the first amorphous silicon film 43i is crystallized into a polycrystalline silicon film, which will become a part of a lower electrode. It does not take part in the growth of granular silicon crystals and is crystallized in the film form, so that the conductivity of the lower electrode can be secured. In addition, introduction of the impurity having a relatively high concentration, about $4.0 \times 10^{20}$ atoms/cm$^3$, makes it possible to secure the conductivity of the lower electrode.

While the substrate 1 is retained in a reaction chamber of the CVD apparatus, the air is introduced into the leaked reaction chamber. As is illustrated in FIG. 54, a second amorphous silicon film 43j is then deposited. This amorphous silicon film 43j is formed by deposition by CVD to give a thickness of 20 nm. Into this amorphous silicon film 43j, phosphorus (P) having a concentration of about $2.5 \times 10^{20}$ atoms/cm$^3$ is introduced in a same manner as described above.

As will be described later, the amorphous silicon film 43j is a raw material layer which is allowed to grow into grain silicon crystals and the resulting grain crystals constitute the surface portion of the lower electrode. The impurity concentration is therefore adjusted to a relatively low value, about $2.5 \times 10^{20}$ atoms/cm$^3$, in order to facilitate growth of granular crystals. By the thickness of the amorphous silicon film 43j, the height of the granular crystals, that is, the thickness of the lower electrode can be adjusted. For example, the amorphous silicon film 43j is thickened when higher granular crystals are desired, while it is thinned for lower granular crystals. Thus, the height of the granular crystals can easily be adjusted by the thickness of the amorphous silicon film 43j.

The concentration of impurities to be introduced into the amorphous silicon films 43i, 43j is not limited to the above-described values. From the viewpoint of securing the conductivity of the lower electrode, the more the impurity, concentration of the amorphous silicon film 43i, the better. Too high concentrations happen to disturb crystallization, because doping cannot be conducted at high concentrations. The impurity concentration of the amorphous silicon film 43i can be made not less than $1 \times 10^{20}$ atoms/cm$^3$ but not greater than $1 \times 10^{22}$ atoms/cm$^3$. In consideration of the growth of the granular crystals, the lower the impurity concentration of the amorphous silicon film 43j, the better. It is therefore preferred to adjust the impurity concentration of the amorphous silicon film 43j to not greater than $2.5 \times 1^{20}$ atoms/cm$^3$, more preferably, not greater than $2.0 \times 10^{20}$ atoms/cm$^3$.

The thickness of each of the amorphous silicon films 43i, 43j are not limited to the above-described value. From the viewpoint of maintaining the conductivity of the lower electrode, the thicker the amorphous silicon film 43i, the better. A too thick film is not suited for miniaturization. The thickness of the amorphous silicon film 43i can therefore be adjusted to not less than 20 nm but not greater than 100 nm. The amorphous silicon film 43j, on the other hand, becomes a raw material layer for granular crystals, as described above. When it is thick, growth of large (high) crystals occurs, which adversely affects the miniaturization. It has been revealed by the present inventors that too thin films prevent growth of granular crystals. Accordingly, the thickness of the amorphous silicon film 43j can be adjusted to 20 nm or thicker.

As described above, the first amorphous silicon film 43i is first exposed to the air prior to the deposition of the second amorphous silicon film 43j so that as illustrated in FIG. 54, a natural oxide film 43k is formed between the amorphous silicon films 43i and 43j. The natural oxide film 43k has a film thickness not greater than 2 nm. In FIG. 55, the natural oxide film 43k is illustrated as a continuous film for convenience sake. It is not essentially necessary to be a film but may be a silicon oxide in the island form. Upon crystallization of the second amorphous silicon film 43j which will be described later, the natural oxide film 43k has a function of limiting the supply source of silicon atoms, which will become raw materials for the grain crystals, to the amorphous silicon film 43*j* and inhibiting the movement of the silicon atoms so as to prevent the silicon atoms, which take part in the growth of granular silicon crystals from being supplied from the first amorphous silicon film 43*i*.

Here, a case is exemplified where the natural oxide film 43*k* is formed by exposing the surface of the first amorphous silicon film 43*i* to the air. Alternatively, a substance which positively inhibits the movement of silicon atoms may be formed as a thin film or deposit. For example, it is possible to deposit a silicon oxide film on the amorphous silicon film 43*i* for a markedly short time, expose it to an oxidizing agent such as ozone or nitrogen oxide or subject it to plasma treatment or exposure to ultraviolet rays in an oxidizing atmosphere.

As in the step of FIG. 25 in Embodiment 1, the amorphous silicon films 43*i*, 43*j* are left along the inside wall of the groove 42.

As illustrated in FIG. 55, the amorphous silicon film 43*j* is then crystallized to cause growth of the granular silicon 43*b*. The growth of the granular silicon 43*b* can be classified into the following two stages: formation of a silicon nucleus and heat treatment for promoting grain growth of silicon. These two stages are carried out continuously.

A silicon nucleus is formed on the surface of the amorphous silicon film 43*j* by retaining the substrate 1 at a temperature of 740° C. for 60 seconds in a monosilane (SiH$_4$) gas atmosphere having a pressure of $1 \times 10^{-3}$ Torr. Then, heat treatment is conducted, for example, under a pressure of $1 \times 10^{-8}$ Torr at 740° C. for 150 seconds, whereby growth into granular silicon occurs.

As described above, the granular silicon 43*b* undergoes growth from the amorphous silicon film 43*j* and no silicon is fed from the amorphous silicon film 43*i*. This is because the movement of silicon does not occur from the amorphous silicon film 43*i* owing to the silicon-movement-disturbing function of the natural oxide film 43*k*. As a result, even if the silicon nucleus, which has been formed on the surface of the amorphous silicon film 43*j*, fed therefrom by the above-described heat treatment, absorbs the silicon from the amorphous silicon film 43*j* and grows, the growth of the granular silicon 43*b* stops at the time when the amorphous silicon film 43*j* disappears, in other words, silicon is supplied up. This is the mechanism permitting the control of the height (height of unevenness) of the granular silicon 43*b* by the thickness of the amorphous silicon film 43*j*. The size (height) of the growing grains was heretofore controlled by the heat treating time, but now, it becomes possible to adjust the height (size) of the granular silicon 43*b* irrespective of heat treating time. The above-described reaction is a self-termination type and is accompanied with such advantages as excellent controllability, a widened processing window, stabilized step and improvement in robust properties.

The first amorphous silicon film 43*i* is then crystallized by heat treatment at 800° C. for about 3 minutes, whereby a polycrystalline silicon film 43*m* is obtained. Thus, a lower electrode having the polycrystalline silicon film 43*m* and granular silicon 43*b* is formed. The above-described conditions for each of nucleus formation and heat treatment are only exemplary and are not limited thereto. It is possible to adopt other conditions as needed concerning the treating temperature or time, and/or to use disilane (Si$_2$H$_6$) instead of monosilane.

FIG. 55 illustrates the granular silicon 43*b* whose growth has almost been completed, fed with almost all the silicon from the amorphous silicon film 43*j*. The granules of the granular silicon 43*b* are not connected to each other as a film, but are attached to the surface of the polycrystalline silicon film 43*m*. In the case of the polycrystalline silicon film 43*m*, on the other hand, crystals are brought into contact each other at the grain boundary, which permits sufficient electric conduction. Since no silicon is fed from the amorphous silicon film 43*i*, its film thickness remains the same. It is crystallized without changing the original shape as the amorphous silicon film 43*i*.

Steps Subsequent Thereto are Conducted as in Embodiment 1.

The DRAM according to this Embodiment has a lower electrode formed of a two-layer silicon film (43*i*,43*j*) so that the granular silicon 43*b* is formed with excellent controllability. In addition, since the polycrystalline silicon film 43*m* can certainly be formed as a film, the lower electrode is free of disconnection and good capacitor characteristics can be maintained while a resistance is kept low.

Alternatively, it is possible to form a polycrystalline silicon film instead of the amorphous silicon film 43*i*, form thereon a natural oxide film, depositing an amorphous silicon film and allowing the resulting amorphous silicon film to grow into granular silicon. It is needless to say that a two-layer polycrystalline tantalum oxide film as described in the final stage of Embodiment 1 or a single layer structure of a silicon nitride film can be applied to the capacitor insulating film.

Figure 56:
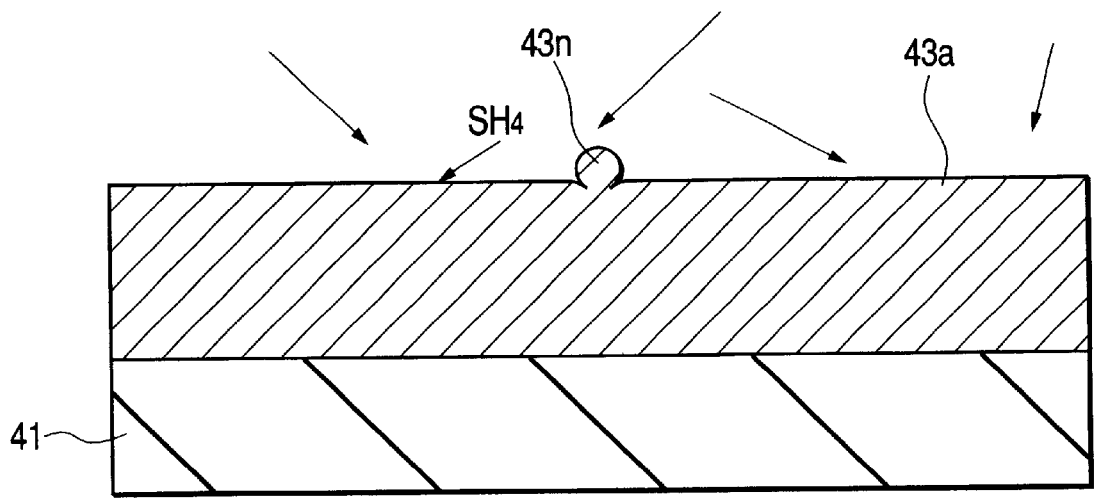
FIG. 56 is a fragmentary cross-sectional view illustrating a manufacturing method of a DRAM according to Embodiment 5.
Figure 57:
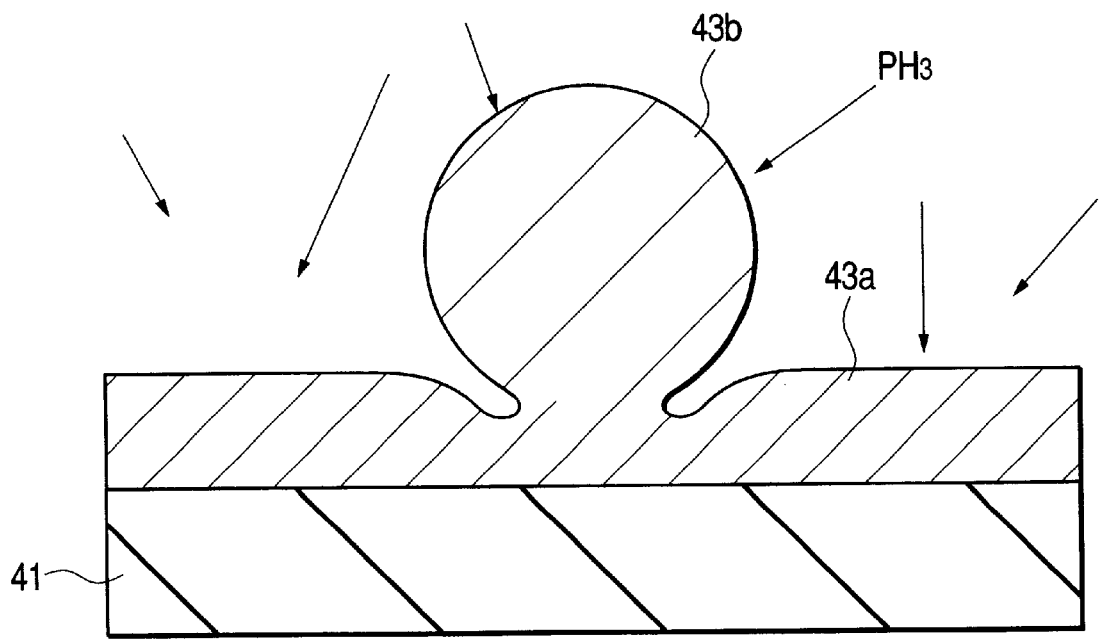
FIG. 57 a fragmentary cross-sectional view illustrating a manufacturing method of the DRAM according to Embodiment 5.

FIGS. 56 and 57 are fragmentary cross-sectional views each illustrating a manufacturing step of the DRAM according to Embodiment 5 of the present invention. They are enlarged views of a portion corresponding to A of FIG. 26 of Embodiment 1.

The manufacturing process of this Embodiment is similar to that of Embodiment 1 until the step illustrated in FIG. 27. After that, the amorphous silicon film 43*a* is heat treated and then exposed to a monosilane gas in a similar manner to Embodiment 1 to allow granular silicon to grow.

As illustrated in FIG. 56, a crystal nucleus 43*n* is formed at the initial growth stage of the granular silicon. This crystal nucleus undergoes grain growth by using peripheral amorphous silicon atoms as a material and its grain growth stops when the granular silicon 43*b* reaches the size as shown in FIG. 57. In Embodiment 1, the size of the granular silicon was adjusted by controlling heat treating time, while in Embodiment 4, it was adjusted by separately forming, in advance, amorphous layers which undergoes grain growth and serves as a film.

In the present Embodiment, when the granular silicon 43*b* grows into a predetermined size, grain growth is terminated by introducing a phosphine gas for doping of impurities into a reaction chamber (FIG. 57).

It is presumed that the grain growth is thus terminated by the supply of a phosphine gas, because crystallization of the amorphous silicon film 43*a* is accelerated by phosphorus introduced thereinto and silicon atoms taking part in the grain growth are not supplied from the periphery.

Compared with thermal control in Embodiment 1, the size of the granular silicon 43*b* can be controlled by the supply of a phosphine gas with a better response. In short, the size controllability of the granular silicon 43*b* is improved. As opposed to Embodiment 4, it is not necessary to divide the amorphous film into two layers, which makes it possible to simplify the process. Upon supply of a phosphine gas, the amorphous silicon film 43*a* has not completely been crystallized yet so that a large amount of an impurity can be introduced into the film in this Embodiment, similar to Embodiment 4.

The steps subsequent thereto are similar to Embodiment 1. It is needless to say that a two-layer polycrystalline tantalum oxide film as described in the final stage of Embodiment 1 or a single layer structure of a silicon nitride film can be applied to the capacitor insulating film.

Figure 58:
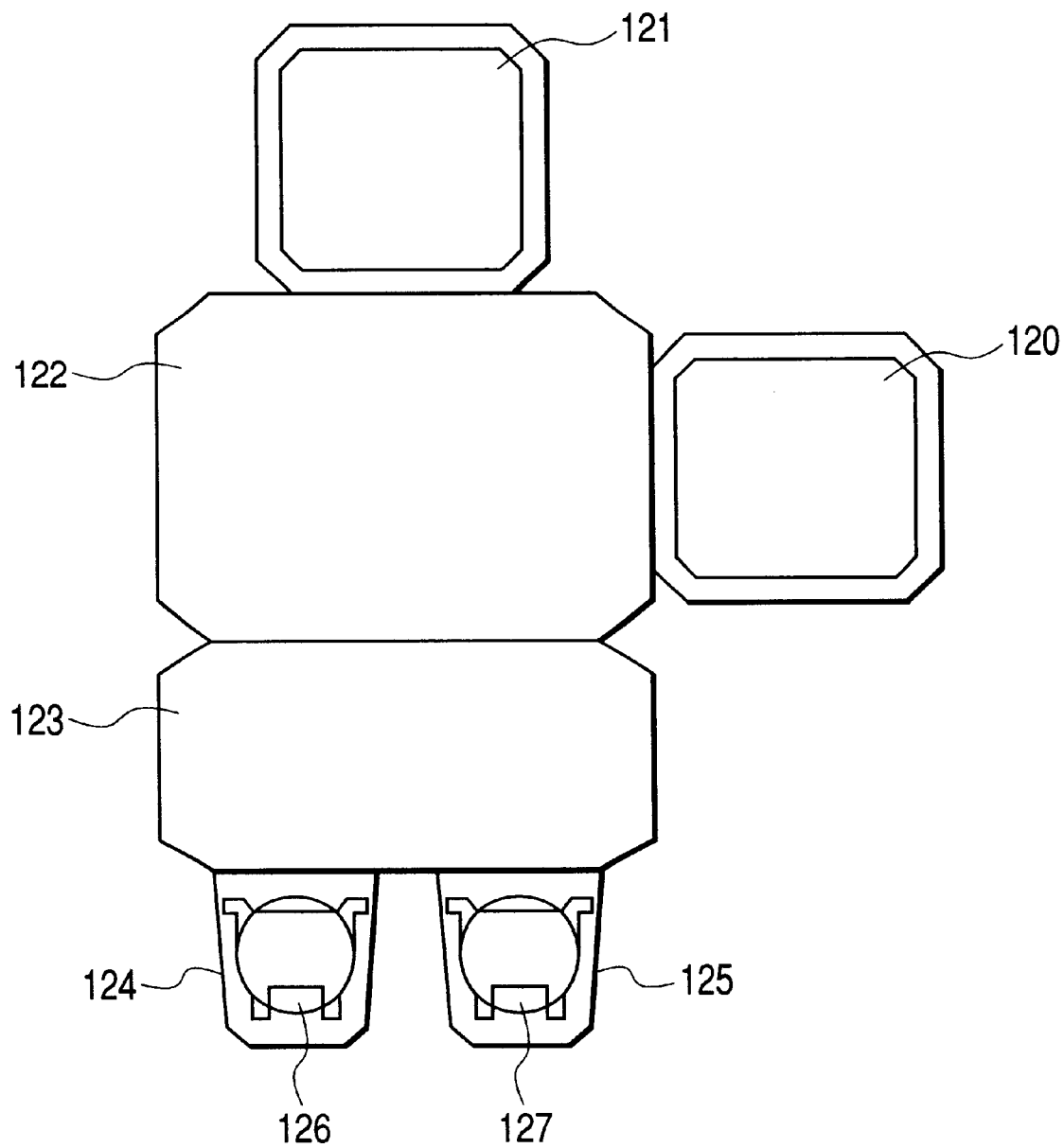
FIG. 58 is a schematic diagram illustrating one example of a semiconductor manufacturing apparatus according to Embodiment 6 of the present invention.

FIG. 58 is a schematic view illustrating one example of the semiconductor manufacturing apparatus according to Embodiment 6 of the present invention.

The manufacturing apparatus of this Embodiment has a first reaction chamber 120 for forming an amorphous silicon film and a second reaction chamber 121 for heat treating the amorphous silicon film. The first reaction chamber 120 and the second reaction chamber 121 are connected with a vacuum transfer chamber 122 via a gate valve. The illustration of the gate valve is omitted.

The first reaction chamber 120 and the second reaction chamber 121 are each equipped with a substrate heating mechanism and a gas feeding mechanism. The gas feeding mechanism of the first reaction chamber 120 has means for feeding raw material gases, for example, monosilane or dichlorosilane and hydrogen, for forming an amorphous silicon film by CVD, while that of the second reaction chamber 121 has means for feeding a monosilane or phosphine gas.

With the vacuum transfer chamber 122, a load lock chamber 123 is connected through a gate valve which is not illustrated and with the load lock chamber 123, cassette chambers 124, 125 are connected. In the cassette chambers 124, 125, wafers 126, 127 each supported in a wafer cassette are set.

The wafer 126 is introduced into the vacuum transfer chamber 122 from the cassette chamber 124 via the load lock chamber. Upon introduction, evacuation is conducted in the load lock chamber 123 so that no air is introduced into the vacuum transfer chamber 122. The cleanness of each of the vacuum transfer chamber 122, first reaction chamber 120 and second reaction chamber 121 is maintained high.

The wafer 126 introduced into the vacuum transfer chamber 122 is transported into the first reaction chamber 120, at which an amorphous silicon film is deposited. The resulting wafer 126 is then transported from the first reaction chamber 120 to the second reaction chamber 121 via the vacuum transfer chamber 122. In the second reaction chamber 121, the wafer 126 is heat treated and exposed to a silane gas, whereby granular silicon is formed.

In the second reaction chamber 121, time is managed so as to allow silicon grain crystals to grow into a predetermined grain size and then, a phosphine gas is introduced into the second reaction chamber 121 to terminate the grain growth. The grain growth is thus terminated by the supply of a phosphine gas so that the grain size can be managed with good controllability compared with heat treatment slow in speed of response.

In this Embodiment, since the first reaction chamber 120 for forming an amorphous silicon film and the second reaction chamber 121 for forming granular silicon are separated and they are connected via a load lock, the cleanness of the amorphous silicon film can be maintained high and the crystal growth of granular silicon can be managed easily. In addition, the first reaction chamber 120 is free from mixing of phosphine, the impurity concentration in the amorphous silicon film can be controlled easily.

The wafer 126 having granular silicon formed thereon is transported, via the load lock chamber, from the vacuum transfer chamber 122 to the cassette chamber 125, in which it is supported, as a wafer 127, in a wafer cassette.

The vacuum transfer chamber 122 may be equipped with a third reaction chamber in which nitriding treatment for the formation of a silicon nitride film 44a as described in Embodiment 1 may be carried out. The vacuum transfer chamber 122 may be equipped further with a fourth reaction chamber, In which another conductive film such as titanium oxide for an upper electrode is deposited.

The present invention made by the present inventors has so far been described specifically based on various Embodiments. It should however be borne in mind that the present invention is not limited to these Embodiments. It is needless to say that it can be changed within an extent not departing from the scope of the present invention.

For example, in the above-described Embodiment, shown is an example of doping in a vapor phase after the formation of granular silicon 43b subsequent to the formation of an amorphous silicon film 43a. The vapor phase doping may be conducted in the stage of the amorphous silicon film 43a. In this case, no granular silicon is formed.

In addition, in the above-described Embodiment, shown is an example of forming a silicide film 26 only on the bottom of each of the connecting holes 22, 23, 25. Alternatively, a silicide film may be formed on each of the surfaces of the gate electrodes 9n, 9p, n$^+$type semiconductor region 14 and P$^+$type semiconductor region 15.

Figure 59:
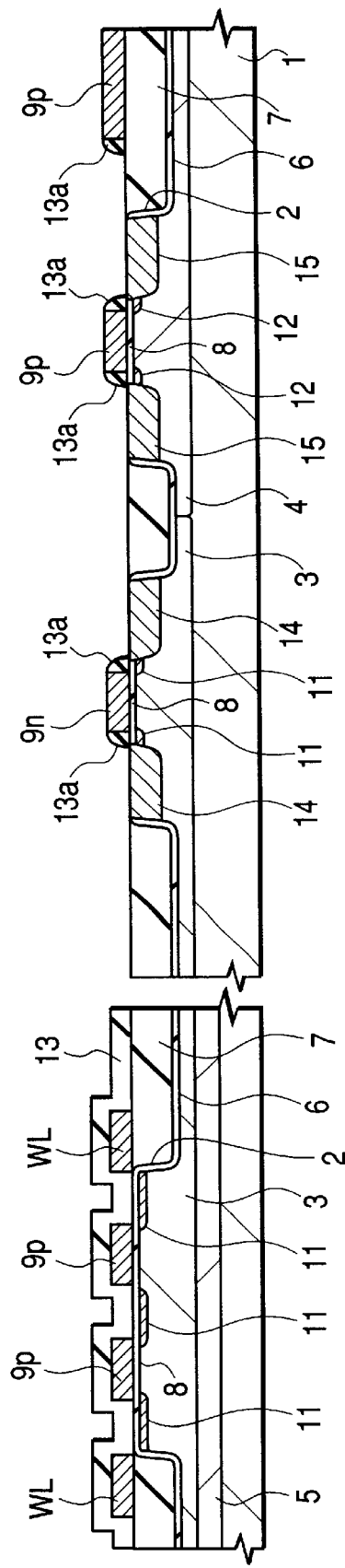
FIG. 59 is a cross-sectional view illustrating a manufacturing method of a DRAM according to another embodiment of the present invention.
Figure 60:
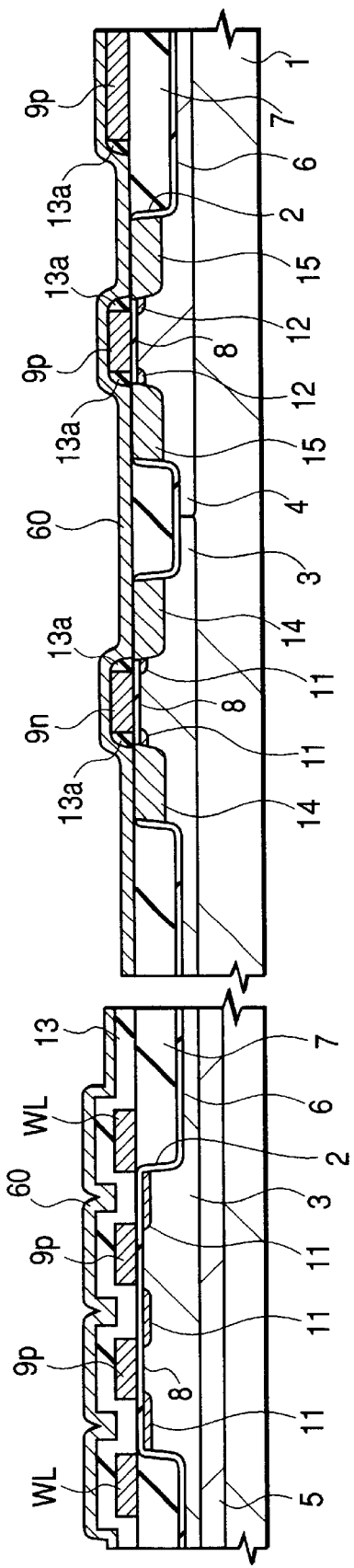
FIG. 60 is a cross-sectional view illustrating a manufacturing method of a DRAM according to a further embodiment of the present invention.
Figure 61:
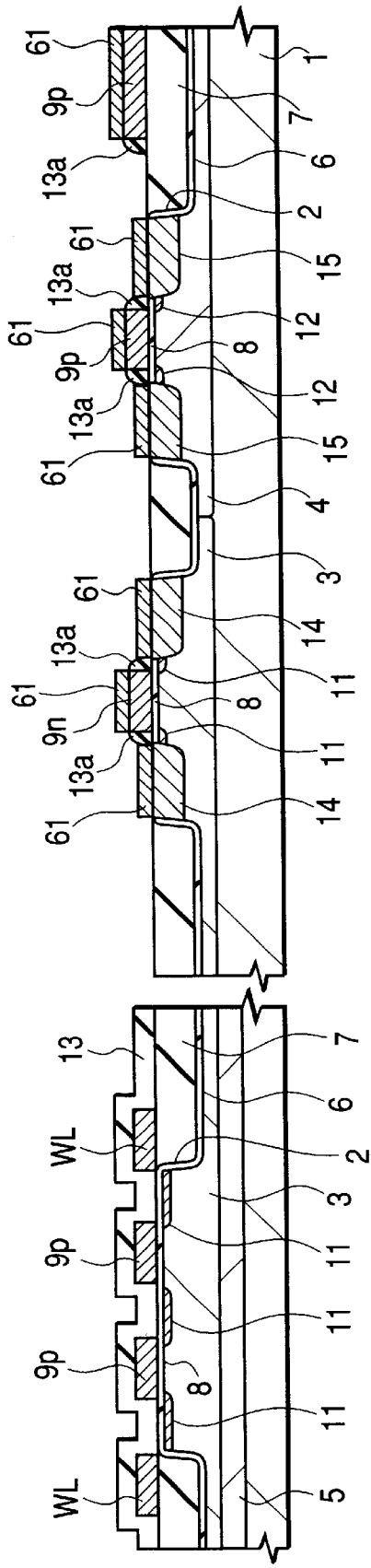
FIG. 61 is a cross-sectional view illustrating a manufacturing method of a DRAM according to a still further embodiment of the present invention.

More specifically, as illustrated in FIG. 59, after formation of gate electrodes 9n, 9p each made of a single-layer polycrystalline silicon film, an insulating film 13 is formed on the gate electrode 9p (WL) in the memory cell region as in Embodiment 1, followed by the formation of side wall spacer 13a on each of the side walls of the gate electrodes 9n, 9p in the peripheral circuit region. A metal film (ex. titanium film) 60 is then deposited all over the surface (FIG. 60). The metal film is heat treated to cause silicide-forming reaction. The unreacted metal film 60 is removed by selective etching. In this manner, a silicide film 61 is formed on the gate electrodes 9n, 9p, n$^+$ type semiconductor region 14 and p$^+$ type semiconductor region 15 (FIG. 61). The steps subsequent thereto are similar to Embodiment 1.

This makes it possible to lower the resistance of the gate electrode and source drain region in the peripheral circuit, thereby bringing about an improvement in the performance of the DRAM of a logic circuit or mixture of a logic circuit. Such a structure is particularly excellent when adapted to a system LSI.

Figure 62:
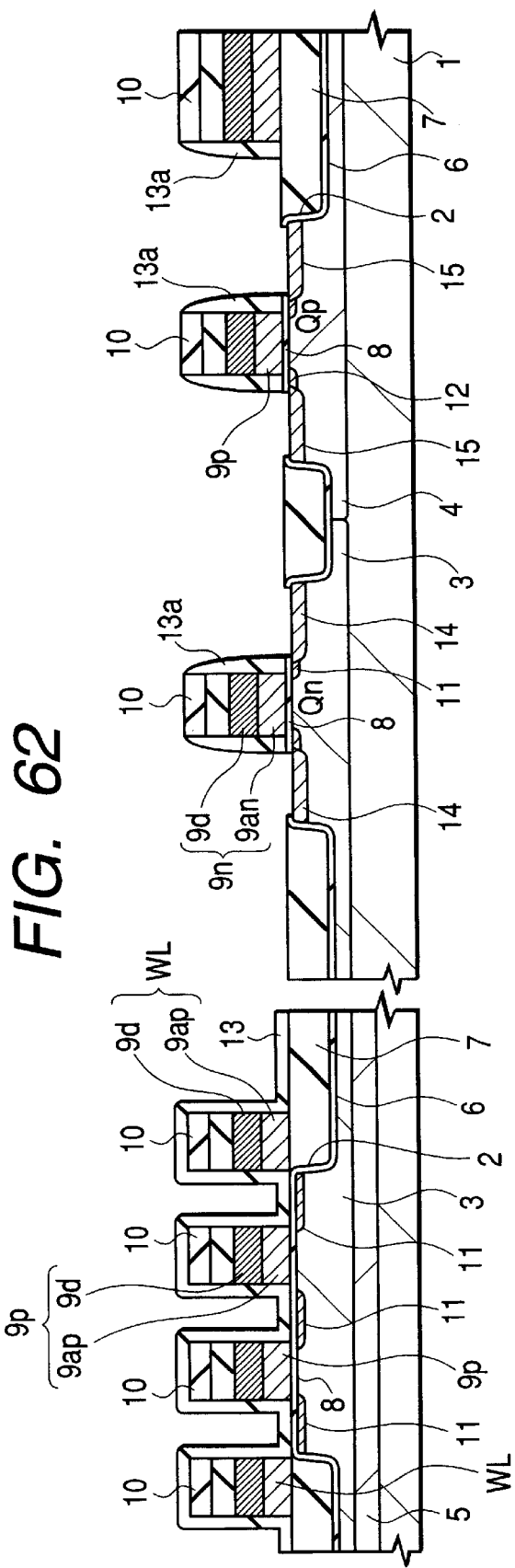
FIG. 62 is a cross-sectional view illustrating a manufacturing method of a DRAM according to a still further embodiment.
Figure 63:
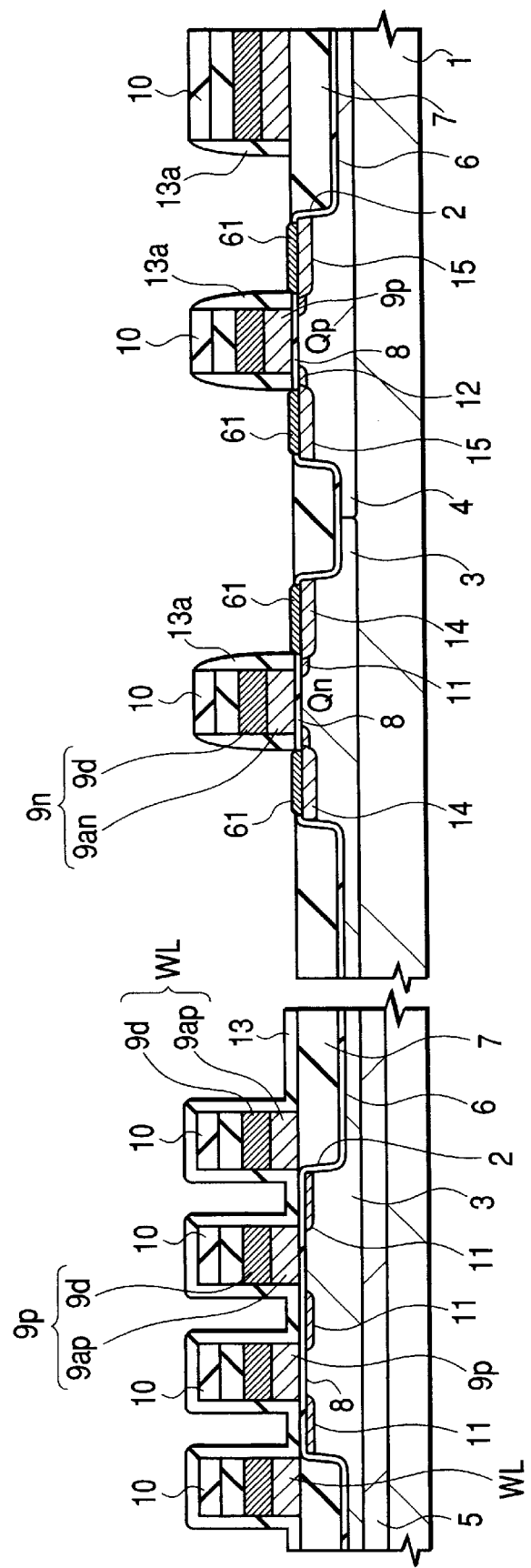
FIG. 63 is a cross-sectional view illustrating a manufacturing method of a DRAM according to a still further embodiment.

As illustrated in FIG. 62, it is also possible to form gate electrodes 9n, 9p (having a cap insulating film 10 thereon) each made of a silicide film 9d and polycrystalline silicon films 9an, 9ap, deposit a metal film and carry out heat treatment in a similar manner to the above, selectively etch the unreacted portion of the metal film, and thereby form asilicide film 61 on the source drain (n$^+$ type semiconductor region 14 and p$^+$ type semiconductor region 15) of MISFET of the peripheral circuit (FIG. 63). In this case, the silicide film 9d is formed on the gate electrode 9p also in the region of the memory cell array so that its resistance can be reduced and the performance of the DRAM can be improved.

In the above-described Embodiments, a description was made of application of the invention process to the DRAM. It can however be applied widely to an insulating film forming process of an LSI of 0.25 μm or less manufactured in a design room.

The effects available from the typical aspects, among the features disclosed by the present application will next be described.

(1) Depletion of the capacitor lower electrode can be controlled under limited heat treatment conditions.

(2) A low depletion ratio can be actualized in the lower electrode having granular silicon.

(3) A technique suited for controlling the crystal growth of granular silicon can be provided.

(4) A technique for a capacitor having reduced leakage current can be provided, whereby the reliability of a DRAM can be improved.

(5) The performance and reliability of a miniaturized semiconductor device can be maintained high.

What is claimed is:

1. A method of manufacturing a semiconductor integrated circuit device, which comprises:

(a) depositing an amorphous silicon film and roughening surface of the amorphous silicon film;

(b) after the step (a), heat treating the amorphous silicon film in a gas atmosphere containing an impurity element, thereby introducing the impurity element into the amorphous silicon film; and (c) after the step (b), crystallizing the silicon film thus roughened.

2. A method according to claim 1, wherein the surface of the amorphous silicon film is roughened by forming polycrystalline silicon on the surface of the amorphous silicon film.

3. A method according to claim 2, wherein the polycrystalline silicon formed on the surface of the amorphous silicon film is granular polycrystalline silicon.

4. A method according to claim 1, wherein the amorphous silicon film as deposited has an impurity concentration of at most $2.5 \times 20^{20}$ atoms/cm$^3$.

5. A method according to claim 1, wherein, in said step (b), the impurity is introduced into the amorphous silicon film by doping in a vapor phase.

6. A method of manufacturing a semiconductor integrated circuit device, which comprises:

(a) depositing an amorphous silicon film and roughening the surface of the amorphous silicon film; and (b) after the step (a), heat treating the silicon film in an impurity-element-containing gas atmosphere, thereby introducing the impurity element into the amorphous silicon film.

7. A method according to claim 1, wherein the surface of the silicon film is cleaned prior to the introduction of the impurity.

8. A method according to claim 6, wherein after said step (b), a dielectric film is formed on the silicon film without exposing to the air.

9. A method according to claim 1, wherein the impurity element is phosphorus (P) and heat treatment for introducing the impurity element is conducted within a temperature range of 500 to 850° C. in a gas atmosphere containing phosphine (PH$_3$).

10. A method according to claim 9, wherein the heat treatment for introducing the impurity element is conducted within a temperature range of 500 to 850° C. for 10 minutes or less in a reduced-pressure gas atmosphere containing phosphine (PH$_3$) and hydrogen (H$_2$).

11. A method according to claim 6, wherein the amorphous silicon film as deposited contains an impurity at a concentration not greater than $2.5 \times 10^{20}$ atoms/cm$^3$.

12. A method according to claim 6, wherein a silicide film is formed on the surface of the semiconductor substrate, prior to the step (a).

13. A method according to claim 6, which further comprises:

forming a first silicon nitride film on the silicon film, wherein the first silicon nitride film is formed by nitriding the surface of the silicon film or depositing a silicon nitride film on the silicon film.

14. A method according to claim 13, which further comprises:

forming a second silicon nitride film on the first silicon nitride film by CVD.

15. A method according to claim 13, which further comprises:

forming a polycrystalline tantalum oxide film on the first silicon nitride film.

16. A method according to claim 15, which further comprises steps of:

forming a first polycrystalline tantalum oxide film; and forming a second polycrystalline tantalum oxide film thicker than the first polycrystalline tantalum oxide film.

17. A method according to claim 15, which further comprises steps of:

depositing an amorphous tantalum oxide film by CVD; and crystallizing the amorphous tantalum oxide film by heat treatment in an oxidizing atmosphere.

18. A method according to claim 16, further comprising:

forming a titanium nitride film on the polycrystalline tantalum oxide film by CVD.

19. A method of manufacturing a semiconductor integrated circuit device comprising an MISFET formed on a semiconductor substrate and a capacitor electrically connected with a source drain region of the MISFET, which comprises:

(a) forming an insulating film on the main surface of the semiconductor substrate;

(b) forming an opening portion in the insulating film;

(c) forming an amorphous silicon film on the insulating film including the inner wall surface of the opening portion;

(d) roughening the surface of the amorphous silicon film;

(e) after the step (d), introducing an impurity into the amorphous silicon film having a roughened surface by a vapor phase method;

(f) removing a portion of the amorphous silicon film having the impurity introduced therein and forming a first electrode of the capacitor inside of the opening portion;

(g) forming a dielectric film over the first electrode of the capacitor at a heat treating temperature; and (h) forming a second electrode of the capacitor over the dielectric film.

20. A method according to claim 19, wherein a heat treating temperature in the impurity-introducing step is equal to or lower than that in the dielectric film forming step.

* * * * *